(12) United States Patent
Oike et al.

(10) Patent No.: US 8,952,432 B2
(45) Date of Patent: *Feb. 10, 2015

(54) SOLID-STATE IMAGING DEVICE, METHOD OF MANUFACTURING SOLID-STATE IMAGING DEVICE, AND ELECTRONIC APPARATUS

(75) Inventors: Yusuke Oike, Kanagawa (JP); Takahiro Kawamura, Kanagawa (JP); Shinya Yamakawa, Kanagawa (JP); Ikuhiro Yamamura, Kanagawa (JP); Takashi Machida, Kanagawa (JP); Yasunori Sogoh, Kanagawa (JP); Naoki Saka, Kanagawa (JP)

(73) Assignee: Sony Corporation, Tokyo (JP)

( * ) Notice: Subject to any disclaimer, the term of this patent is extended or adjusted under 35 U.S.C. 154(b) by 31 days.

This patent is subject to a terminal disclaimer.

(21) Appl. No.: 13/050,156

(22) Filed: Mar. 17, 2011

(65) Prior Publication Data

US 2011/0241079 A1  Oct. 6, 2011

(30) Foreign Application Priority Data

Mar. 31, 2010 (JP) ................................ 2010-083597

(51) Int. Cl.
| | | |
|---|---|---|
| H01L 31/113 | (2006.01) | |
| H01L 27/146 | (2006.01) | |
| H04N 5/353 | (2011.01) | |
| H04N 5/3745 | (2011.01) | |
| H04N 5/363 | (2011.01) | |

(52) U.S. Cl.
CPC .... *H01L 27/14656* (2013.01); *H01L 27/14616* (2013.01); *H01L 27/14689* (2013.01); *H04N 5/353* (2013.01); *H04N 5/37452* (2013.01); H01L 27/14643 (2013.01); H04N 5/363 (2013.01)
USPC ........... 257/291; 257/292; 257/390; 257/443; 257/E27.083; 257/E27.15; 257/E29.058; 257/E29.065; 438/63

(58) Field of Classification Search
USPC .................. 257/291, 292, 390, 443, E27.083, 257/E27.15, E29.058, E29.065; 438/60–63
See application file for complete search history.

(56) References Cited

U.S. PATENT DOCUMENTS

| | | | | |
|---|---|---|---|---|
| 8,218,042 B2 * | 7/2012 | Miyatake et al. | ............. | 348/294 |
| 2005/0280054 A1 * | 12/2005 | Park et al. | ..................... | 257/290 |

(Continued)

FOREIGN PATENT DOCUMENTS

JP    2009-268083    11/2009

*Primary Examiner* — Su Kim
(74) *Attorney, Agent, or Firm* — Dentons US LLP

(57) ABSTRACT

Disclosed herein is a solid-state imaging device including a photoelectric conversion element operable to generate electric charge according to the amount of incident light and to accumulate the electric charge in the inside thereof, an electric-charge holding region in which the electric charge generated through photoelectric conversion by the photoelectric conversion element is held until read out, and a transfer gate having a complete transfer path through which the electric charge accumulated in the photoelectric conversion element is completely transferred into the electric-charge holding region, and an intermediate transfer path through which the electric charge generated by the photoelectric conversion element during an exposure period and being in excess of a predetermined charge amount is transferred into the electric-charge holding region. The complete transfer path and the intermediate transfer path are formed in different regions.

3 Claims, 38 Drawing Sheets

(56) References Cited

U.S. PATENT DOCUMENTS

| | | | |
|---|---|---|---|
| 2006/0065915 A1* | 3/2006 | Kuwazawa | 257/292 |
| 2007/0045665 A1* | 3/2007 | Park | 257/204 |
| 2008/0179642 A1* | 7/2008 | Lee et al. | 257/292 |
| 2009/0251582 A1* | 10/2009 | Oike | 348/308 |

* cited by examiner

Y ⋅—⋅—⋅—⋅—→ Y'          X ⋅—⋅—⋅—⋅—→ X'

Y ·—·—·—·—·—·→ Y'    X ·—·—·—·—·—·→ X'

SOLID-STATE IMAGING DEVICE, METHOD OF MANUFACTURING SOLID-STATE IMAGING DEVICE, AND ELECTRONIC APPARATUS

BACKGROUND OF THE INVENTION

1. Field of the Invention

The present invention relates to a solid-state imaging device, a method of manufacturing a solid-state imaging device, and an electronic apparatus. In particular, the invention relates to a solid-state imaging device, a method of manufacturing the solid-state imaging device, and an electronic apparatus using the solid-state imaging device by which images with high quality can be obtained.

2. Description of the Related Art

Solid-state imaging devices have been incorporated in various electronic apparatuses, for example, imaging apparatuses such as digital still cameras, video cameras, etc. and mobile terminal apparatuses having an imaging function, for a variety of uses. The solid-state imaging devices include APS (active pixel sensor) having amplifying elements on a pixel basis, and CMOS (complementary MOS) image sensors in which signal charges accumulated in photodiodes provided as photoelectric conversion elements are read out through MOS (metal oxide semiconductor) transistors are in wide use.

In a CMOS image sensor, in general, a readout operation of reading out the signal charge accumulated in each photodiode is carried out on the basis of each row in a pixel array, and the pixels for which the readout operation is finished restart accumulation of electric charge at the moment the readout operation is finished. Since the readout operation is thus performed on the basis of each line in the pixel array, in the CMOS image sensor, the signal charge accumulation periods cannot be made coincident for all the pixels. In the case where the subject to be imaged is moving or in other similar situations, therefore, the image obtained would be distorted. For instance, when a subject which is straight shaped in the vertical direction and which is moving horizontally is shot, the subject is imaged as if it were inclined.

In order to obviate the generation of such a distortion of image, there has been developed an all-pixel-simultaneous electronic shutter for CMOS image sensor such as to realize the same exposure period for all the pixels. The all-pixel-simultaneous electronic shutter is a shutter ensuring that exposure is started simultaneously and finished simultaneously for all the pixels effective for imaging, and such a system is also called global shutter (global exposure). Systems for realizing the global exposure include mechanical systems and electrical systems.

For example, in a mechanical system for global exposure, a mechanical shutter (light blocking section) capable of opening and closing for blocking light on the front side of the CMOS image sensor is utilized. Specifically, the mechanical shutter is opened, to start exposure simultaneously for all the pixels. At the end of the exposure period, the mechanical shutter is closed to shield all the pixels from light simultaneously. Consequently, the period of generation of light electric charge in the photodiode is coincident for all the pixels.

On the other hand, in an electrical system for global exposure, an electric-charge discharging operation for emptying the accumulated charge out of the photodiode is carried out simultaneously for all the pixels, and exposure is started. At the end of the exposure period, driving of a transfer gate is conducted simultaneously for all the pixels so that the accumulated light electric charges are wholly transferred into floating diffusion layers (capacitances), and the transfer gates are closed. As a result, the period of generation of light electric charge in the photodiode is coincident for all the pixels.

In the electrical system, however, the transfer of the electric charge into the floating diffusion layer which is carried out simultaneously for all the pixels is attended by difficulty in removing noises, which may lead to deterioration of image quality. In order to restrain such deterioration of image quality, a pixel structure having a memory part has been proposed.

In the pixel structure having a memory part, an electric-charge discharging operation for emptying the accumulated charge from the photodiode is carried out simultaneously for all the pixels, and exposure is started. At the end of the exposure period, driving of the transfer gate is conducted simultaneously for all the pixels so that the accumulated light electric charges are wholly transferred into the memory parts, to be held there. Then, after the floating diffusion layers are reset, the electric charges held in the memory parts are transferred into the floating diffusion layers, and readout of signal levels is conducted.

By the pixel structure in which the memory part for temporarily holding the electric charge accumulated in the photodiode is thus provided separately from the floating diffusion layer, it is possible to reduce noise. However, the addition of the memory part to the inside of the pixel leads necessarily to a reduction in the area of the photodiode, resulting in a decrease in the maximum amount of electric charge (maximum charge amount) that can be accumulated in the photodiode.

In view of the foregoing, the present applicant has proposed a pixel structure in which a photodiode and a memory part are integrally united together through an overflow path, in order to obviate a reduction in the maximum charge amount of a photodiode (see, for example, Japanese Patent Laid-open No. 2009-268083, referred to as Patent Document 1 hereinafter).

Meanwhile, in the solid-state imaging device proposed in Patent Document 1, a structure is adopted in which a depletion state is obtained while forming a potential barrier in a charge transfer path between a photodiode and a memory part. Specifically, the structure has an impurity diffusion layer forming a potential barrier such that overflow of the light electric charge generated in the photodiode to the memory part occurs when an electric charge in excess of a predetermined charge amount is accumulated in the photodiode, even in the condition where a voltage sufficient for turning-OFF of a first transfer gate present between the photodiode and the memory part is impressed.

Such a structure makes it possible to suppress the deterioration of image quality due to noise, and to obviate a reduction in the maximum charge amount in a photodiode.

SUMMARY OF THE INVENTION

However, in the pixel structure in which the photodiode and the memory part are integrally united together through an overflow path as above-mentioned, if scattering of potential barrier exists among the overflow paths of the pixels provided in the solid-state imaging device, the quality of the images obtained by the imaging device would be lowered. Therefore, it is requested to suppress the scattering of potential barrier among overflow paths in the pixels possessed by a solid-state imaging device, and thereby to enhance the quality of images obtained.

Thus, there is a desire to obtain images with enhanced image quality.

According to one embodiment of the present invention, there is provided a solid-state imaging device including: a photoelectric conversion element operable to generate electric charge according to the amount of incident light and to accumulate the electric charge in the inside thereof; an electric-charge holding region in which the electric charge generated through photoelectric conversion by the photoelectric conversion element is held until read out; and a transfer gate having a complete transfer path through which the electric charge accumulated in the photoelectric conversion element is completely transferred into the electric-charge holding region, and an intermediate transfer path through which the electric charge generated by the photoelectric conversion element during an exposure period and being in. The complete transfer path and the intermediate transfer path are formed in different regions.

According to another embodiment of the present invention, there is provided a method of manufacturing a solid-state imaging device, including the steps of: forming a photoelectric conversion element operable to generate an electric charge according to the amount of incident light and to accumulate the electric charge in the inside thereof; forming an electric-charge holding region in which the electric charge generated through photoelectric conversion by the photoelectric conversion element is held until read out; and forming a transfer gate having a complete transfer path through which the electric charge accumulated in the photoelectric conversion element is completely transferred into the electric-charge holding region, and an intermediate transfer path through which the electric charge generated by the photoelectric conversion element during an exposure period and being in excess of a predetermined charge amount is transferred into the electric-charge holding region. The complete transfer path and the intermediate transfer path are formed in different regions.

According to a further embodiment of the present invention, there is provided an electronic apparatus including a solid-state imaging device, the solid-state imaging device having: a photoelectric conversion element operable to generate electric charge according to the amount of incident light and to accumulate the electric charge in the inside thereof; an electric-charge holding region in which the electric charge generated through photoelectric conversion by the photoelectric conversion element is held until read out; and a transfer gate having a complete transfer path through which the electric charge accumulated in the photoelectric conversion element is completely transferred into the electric-charge holding region, and an intermediate transfer path through which the electric charge generated by the photoelectric conversion element during an exposure period and being in excess of a predetermined charge amount is transferred into the electric-charge holding region. The complete transfer path and the intermediate transfer path are formed in different regions. Of unit pixels arranged in a matrix pattern, the unit pixels in a plurality of rows perform the electric-discharge accumulation simultaneously, and the electric charges transferred by the transfer gate are read out sequentially.

Thus, in the one embodiment, another embodiment and the further embodiment of the present invention, the complete transfer path and the intermediate transfer path are formed in different regions.

According to a still further embodiment of the present invention, there is provided a solid-state imaging device including: a first electric-charge holding region operable to accumulate an electric charge generated through photoelectric conversion; a gate operable to transfer the electric charge from the first electric-charge accumulation part; and a second electric-charge holding region operable to hold an electric charge which is at least a part of the electric charge accumulated in the first electric-charge accumulation section and which is transferred through the gate. A first electric-charge transfer path operable to transfer an electric charge through at least a part of the gate is formed between the first electric-charge holding region and the second electric-charge holding region. A second electric-charge transfer path operable to transfer an electric charge generated through photoelectric conversion and being in excess of a charge amount holdable in the first electric-charge holding region is formed in a region different from the region of the first electric-charge transfer path.

According to the above-described embodiments of the present invention, images with high image quality can be obtained. Besides, a solid-state imaging device capable of producing images with high quality can be manufactured.

DETAILED DESCRIPTION OF THE PREFERRED EMBODIMENTS

Figure 1:
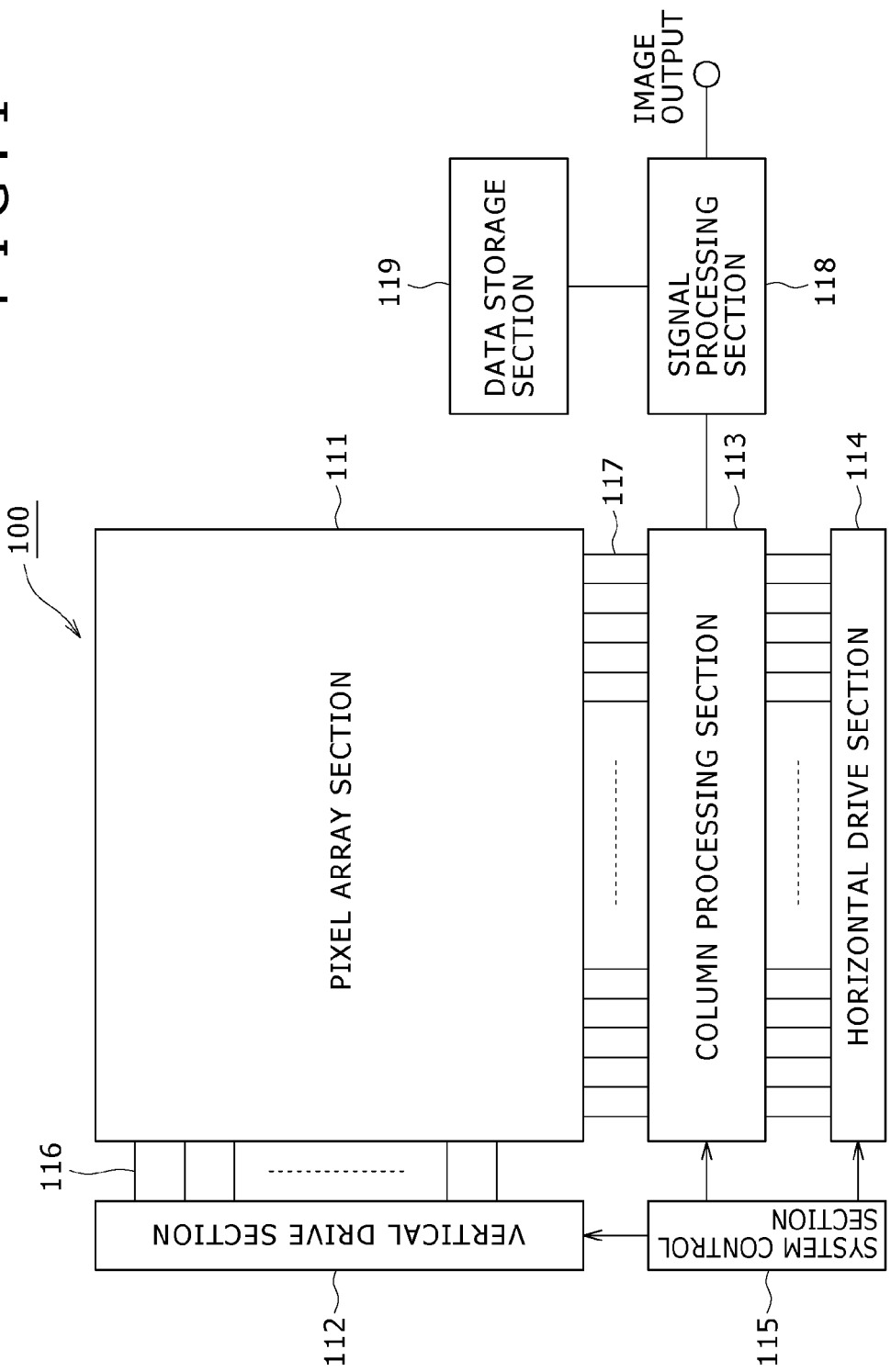
FIG. 1 is a block diagram showing a configuration example of an embodiment of the solid-state imaging device to which the present invention is applied.

Now, specific embodiments of the present invention will be described in detail below referring to the drawings.

FIG. 1 is a block diagram showing a configuration example of an embodiment of the solid-state imaging device to which the present invention is applied.

[Configuration Example of Solid-State Imaging Device]

FIG. 1 is a block diagram showing a configuration example of a CMOS image sensor as a solid-state imaging device to which the present invention is applied.

A CMOS image sensor 100 includes a pixel array section 111, a vertical drive section 112, a column processing section 113, a horizontal drive section 114, and a system control section 115. The pixel array section 111, the vertical drive section 122, the column processing section 113, the horizontal drive section 114, and the system control section 115 are formed on a semiconductor substrate (chip) which is not shown in the figure.

In the pixel array section 111, unit pixels (for example, unit pixels 120A in FIG. 2) each having a photoelectric conversion element operable to generate light electric charge in a charge amount corresponding to the amount of incident light and to accumulate the light electric charge therein are two-dimensionally arranged in a matrix form. Incidentally, in the following description, the light electric charge in a charge amount corresponding to the amount of incident light will sometimes be referred to simply as "electric charge," and the unit pixel as "pixel."

In the pixel array section 111, further, pixel drive lines 116 are formed along the left-right direction in the figure (the arrangement direction of pixels in the pixel row) for each row in the matrix-formed pixel arrangement, and vertical signal lines 117 are formed along the vertical direction in the figure (the arrangement direction of pixels in the pixel column) for each column in the matrix-formed pixel arrangement. While each pixel drive line 116 is composed of one line in FIG. 1, the number of the lines constituting each pixel drive line 116 is not limited to one. One end of each pixel drive line 116 is connected to an output terminal corresponding to each row, in the vertical drive section 112.

The CMOS image sensor 100, further, includes a signal processing section 118 and a data storage section 119. The signal processing section 118 and the data storage section 119 may execute processing by external signal processing sections, for example, digital signal processors (DSPs) or software provided on a substrate different from that of the CMOS image sensor 100, or may be mounted on the same substrate as that of the CMOS image sensor 100.

The vertical drive section 112 has a shift register or an address decoder or the like, and is a pixel drive section by which the pixels in the pixel array section 111 are driven all pixels simultaneously or one row at a time or in the like manner. The vertical drive section 112, of which the specific configuration is omitted in the figure, generally has two scanning systems, that is, a readout scanning system and a sweep scanning system.

The readout scanning system performs sequential selective scanning of the unit pixels in the pixel array section 111 one row at a time, for reading out signals from the unit pixels. The sweep scanning system performs sweep scanning of the readout row subjected to the readout scanning by the readout scanning system, the sweep scanning being precedent to the readout scanning by a period of time corresponding to shutter speed.

As a result of the sweep scanning by the sweep scanning system, unrequired electric charges are swept out of the photoelectric conversion elements in the unit pixels in the readout row (the photoelectric conversion elements are reset). Besides, as a result of the sweeping-out of the unrequired electric charges (resetting) by the sweep scanning system, a so-called electronic shutter operation is carried out. Here, the electronic shutter operation means an operation of discarding the light electric charges present in the photoelectric conversion elements and newly starting exposure to light (starting accumulation of light electric charge).

A signal read out by the readout operation by the readout scanning system corresponds to the amount of light having been incident after the immediately preceding readout operation or electronic shutter operation. Then, the period of time from the readout timing of the immediately preceding readout operation or the sweep-out timing of the immediately preceding electronic shutter operation to the readout timing of the current-time readout operation becomes an accumulation time (exposure time) for light electric charge in the unit pixel.

Pixel signals outputted from each of the unit pixels in the pixel row having undergone the selective scanning by the vertical drive section 112 are supplied to the column processing section 113 through each of the vertical signal lines 117. The column processing section 113 applies a predetermined signal processing to the pixel signals outputted from each of the unit pixels in the selected row through the vertical signal lines 117, on the basis of each pixel column in the pixel array sections 111, and temporarily holds the pixel signals obtained upon the signal processing.

Specifically, the column processing section 113 performs at least a noise removing processing, for example, a correlated double sampling (CDS) processing as the signal processing. As a result of the CDS processing by the column processing section 113, fixed pattern noises intrinsic to pixel such as reset noises, scattering of threshold of amplifying transistors, etc. are removed. The column processing section 113 may be provided not only with the function for the noise removing processing but also, for example, an AD (analog-to-digital) converting function, so as to output the signal level in the form of a digital signal.

The horizontal drive section 114 has a shift register or an address decoder or the like, and sequentially selects unit circuits corresponding to the pixel columns, in the column processing section 113. As a result of the selective scanning by the horizontal drive section 114, pixel signals having undergone the signal processing in the column processing section 113 are sequentially outputted to the signal processing section 118.

The system control section 115 has, for example, a timing generator operable to generate a variety of timing signals, and performs drive control on the vertical drive section 112, the column processing section 113 and the horizontal drive section 114, etc. based on the various timing signals generated by the timing generator.

The signal processing section 118 has at least a function for addition processing, and applies various signal processings such as addition processing to the pixel signals outputted from the column processing section 113. The data storage section 119 temporarily stores data required for the signal processings performed in the signal processing section 118.

[Structure of Unit Pixel]

Now, the specific structure of the unit pixels 120A arranged in a matrix pattern in the pixel array section 111 will be described below. The unit pixel 120A has, other than a floating diffusion region (capacitance), an electric charge holding region (hereinafter referred to as the "memory part") for holding a light electric charge transferred from the photoelectric conversion element.

Figure 2:
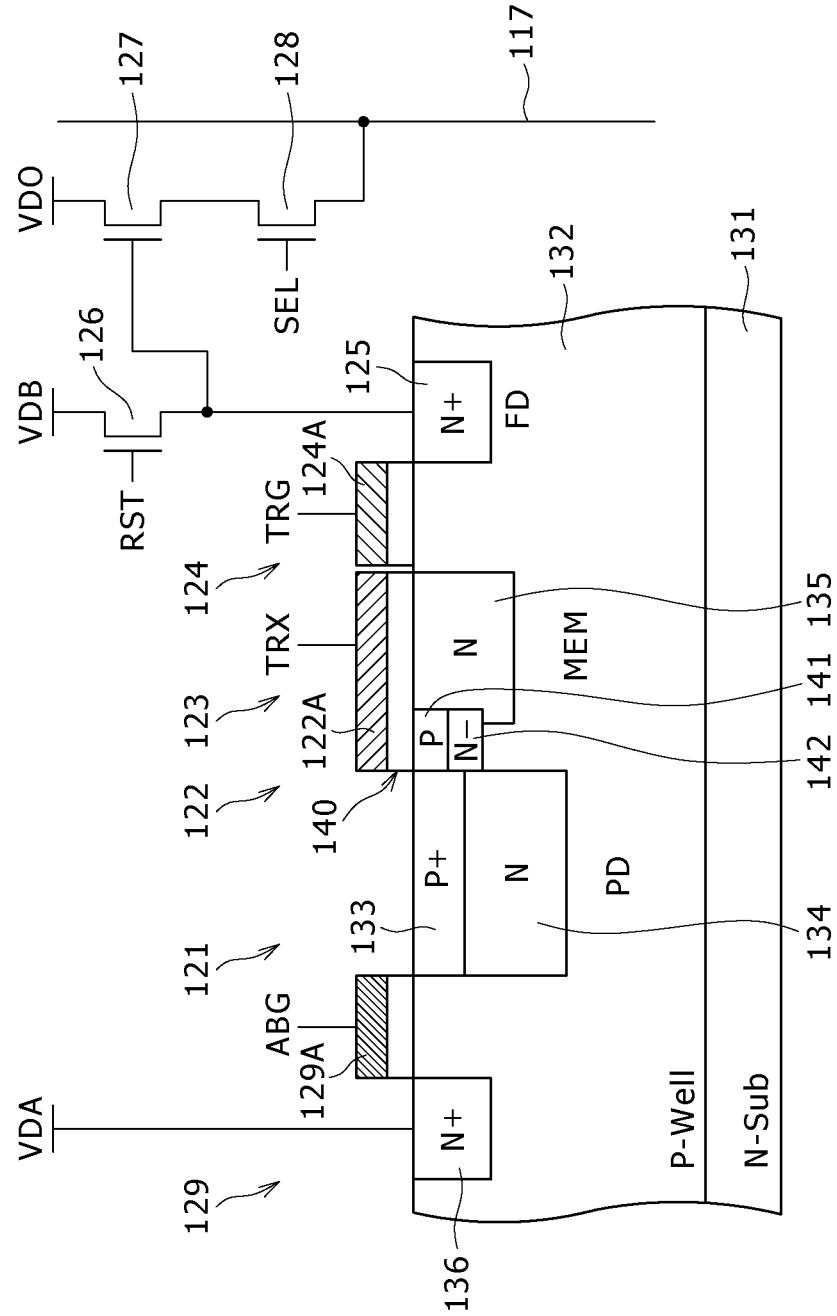
FIG. 2 illustrates the configuration of a unit pixel which is a first embodiment.

FIG. 2 illustrates the structure of the unit pixel 120A. Incidentally, as will be described later referring to FIGS. 3 to 5, the unit pixel 120A as shown in FIG. 2 is a section along line Y-Y' of the plan view in FIG. 3 (a section passing through the intermediate transfer path).

The unit pixel 120A has, for example, a photodiode (PD) 121 as the photoelectric conversion element. The photodiode 121 is, for example, a buried-type photodiode formed by a method in which, in a P-type well layer 132 formed in an N-type substrate 131, a P-type layer 133 ($P^+$) is formed on the substrate surface side so as to bury an N-type buried layer 134 (N). In this embodiment, the N type is taken as a first conductivity type, and the P type as a second conductivity type.

The unit pixel 120A has a first transfer gate 122, a memory part (MEM) 123, a second transfer gate 124 and a floating diffusion region (FD) 125, in addition to the photodiode 121. Incidentally, the unit pixel 120A is shielded from light by a light-blocking film (not shown) by which other portions than an opening portion for guiding light to the photodiode 121, contact portions of each transistor, etc. are shielded from light.

The first transfer gate 122, upon application of a transfer pulse TRX to a gate electrode 122A, transfers the electric charge generated through photoelectric conversion in the photodiode 121 and accumulated in the photodiode 121. Here, the first transfer gate 122 is divided into an intermediate transfer path 140 and a complete transfer path 150, as will be described later referring to FIG. 3. FIG. 2 shows the section passing through the intermediate transfer path 140. The intermediate transfer path 140 is formed by providing an impurity diffusion region 142, and an impurity diffusion region 141 (P) is formed on the substrate surface side of the impurity diffusion region 142. Incidentally, the impurity diffusion regions 141 and 142 will be described later referring to FIG. 5.

The memory part 123 has an N-type buried channel 135 (N) formed under the gate electrode 122A, and holds the electric charge transferred from the photodiode 121 by the first transfer gate 122. With the memory part 123 having the buried channel 135, generation of dark current at the substrate interface can be restrained, which contributes to enhancement of image quality.

In the memory part 123, the gate electrode 122A is disposed at an upper portion thereof, and it is possible to apply modulation to the memory part 123 by impressing a transfer pulse TRX on the gate electrode 122A. Specifically, with the transfer pulse TRX applied to the gate electrode 122A, the potential of the memory part 123 is made to be deeper. As a result, the amount of saturation charge in the memory part 123 can be increased, as compared with that in the absence of the modulation.

The second transfer gate 124, upon application of a transfer pulse TRG to a gate electrode 124A, transfers the electric charge held in the memory part 123. The floating diffusion region 125 is a charge-to-voltage conversion part having an N-type layer ($N^+$), and converts the electric charge transferred from the memory part 123 by the second transfer gate 124 into a voltage.

The unit pixel 120A further has a reset transistor 126, an amplifying transistor 127 and a selecting transistor 128. In the example shown in FIG. 2, N-channel MOS transistors are used as the reset transistor 126, the amplifying transistor 127 and the selecting transistor 128. However, the combination of conductivity types of the reset transistor 126, the amplifying transistor 127 and the selecting transistor 128 shown in FIG. 2 is merely an example, and the combination is not limitative.

The reset transistor 126 is connected between a power supply VDB and the floating diffusion region 125, and resets the floating diffusion region 125 when a reset pulse RST is applied to its gate electrode. The amplifying transistor 127 has a drain electrode connected to a power supply VDO, has a gate electrode connected to the floating diffusion region 125, and reads out a voltage of the floating diffusion region 125.

The selecting transistor 128, for example, has a drain electrode connected to a source electrode of the amplifying transistor 127, and has a source electrode connected to the vertical signal line 117. When a selecting pulse SEL is applied to its gate electrode, the selecting transistor 128 selects a unit pixel 120A from which a pixel signal is to be read out. Incidentally, a configuration may be adopted in which the selecting transistor 128 is connected between the power supply VDO and the drain electrode of the amplifying transistor 127.

Of the reset transistor 126, the amplifying transistor 127 and the selecting transistor 128, one or more may be omitted depending on a pixel signal reading method, or may be shared by a plurality of pixels.

The unit pixel 120A, furthermore, has an electric-charge discharging part 129 for discharging the electric charge accumulated in the photodiode 121. When a control pulse ABG is applied to a gate electrode 129A at the time of start of exposure, the electric-charge discharging part 129 discharges the electric charge in the photodiode 121 to a drain part 136 ($N^+$) having an N-type layer. Further, the electric-charge discharging part 129 functions to prevent overflow of electric charge from occurring due to saturation of the photodiode 121 during a readout period after completion of exposure. A predetermined voltage is applied to the drain part 136.

[Potential of Gate Electrode of Memory Part 123]

Here, the potential of the gate electrode at the memory part 123 serving as the electric-charge holding region, namely, the gate electrode 122A of the first transfer gate 122, will be described.

In this embodiment, the potential of the gate electrode at the memory part 123 serving as the electric-charge holding region is set at a potential such as to secure a pinning state during when at least either one of the first transfer gate 122 and the second transfer gate 124, for example, the first transfer gate 122 is put in a non-conduction state.

More specifically, the voltage impressed on the gate electrodes 122A, 124A at the time of putting either one or both of the first transfer gate 122 and the second transfer gate 124 into the non-conduction state is so set as to secure a pinning state in which carriers can be accumulated at the Si surface beneath the gate electrode.

In the case where the transistor constituting the transfer gate is of the N type as in this embodiment, the voltage impressed on the gate electrode 122A at the time of putting the first transfer gate 122 into the non-conduction state is set at a voltage which is more negative in potential than the ground GND, relative to the P-type well layer 132. Incidentally, though not shown, in the case where the transistor constituting the transfer gate is of the P type, the P-type well layer in the above description is replaced by an N-type well layer, and the voltage in consideration is set at a higher voltage than the power supply voltage VDD relative to the N-type well layer.

The voltage impressed on the gate electrode 122A at the time of putting the first transfer gate 122 into the non-conduction state is thus set at a voltage such as to secure a pinning state in which carriers can be accumulated at the Si surface beneath the gate electrode, for the following reason.

When the potential of the gate electrode 122A of the first transfer gate 122 is set at the same potential (for example, 0 V) as the P-type well layer 132, carriers generated from crystal defects at the Si surface are accumulated in the memory part 123, and may become a dark current, leading to a lower image quality. In view of this, in the present embodiment, the OFF potential of the gate electrode 122A formed over the memory part 123 is set at a negative potential, e.g. −2.0 V, relative to the P-type well layer 132. This ensures that, in the present embodiment, holes can be generated at the Si surface of the memory part 123 during the electric-charge holding period, and electrons generated at the Si surface can be put into recombination. As a result, the dark current can be reduced.

Incidentally, in the configuration shown in FIG. 2, the gate electrode 124A of the second transfer gate 124 is present at an end portion of the memory part 123. Therefore, by setting the gate electrode 124A also at a negative potential, a dark current generated at the end portion of the memory part 123 can similarly be suppressed. In addition, while a configuration example in which an N-type substrate is used will be described in each of the embodiments below, a P-type substrate may also be used. In that case, for example, the N-type substrate 131 and the P-type well layer 132 in the configuration example shown in FIG. 2 are each composed of a P-type semiconductor region.

In the CMOS image sensor 100, exposure is started simultaneously for all the pixels, the exposure is finished simultaneously for all the pixels, and the electric charge accumulated in the photodiode 121 is sequentially transferred to the memory part 123 (shielded from light) and the floating diffusion region 125, whereby global exposure is realized. The global exposure ensures that the exposure period is the same for all the pixels, whereby distortionless imaging can be realized.

Incidentally, "all the pixels" in this embodiment means all of the pixels in the portions appearing in the image, exclusive of dummy pixels and the like. Besides, if the time differences and image distortions are so small as not to produce any problem, an operation conducted simultaneously for all the pixels may be replaced by an operation based on high-speed scanning of a plurality of rows (e.g., several tens of rows) at a time. In addition, the present invention is applicable also to the case where global exposure is conducted for pixels in plural rows in a predetermined region, instead of all the pixels in the portions appearing in the image.

[First Embodiment]

Figure 3:
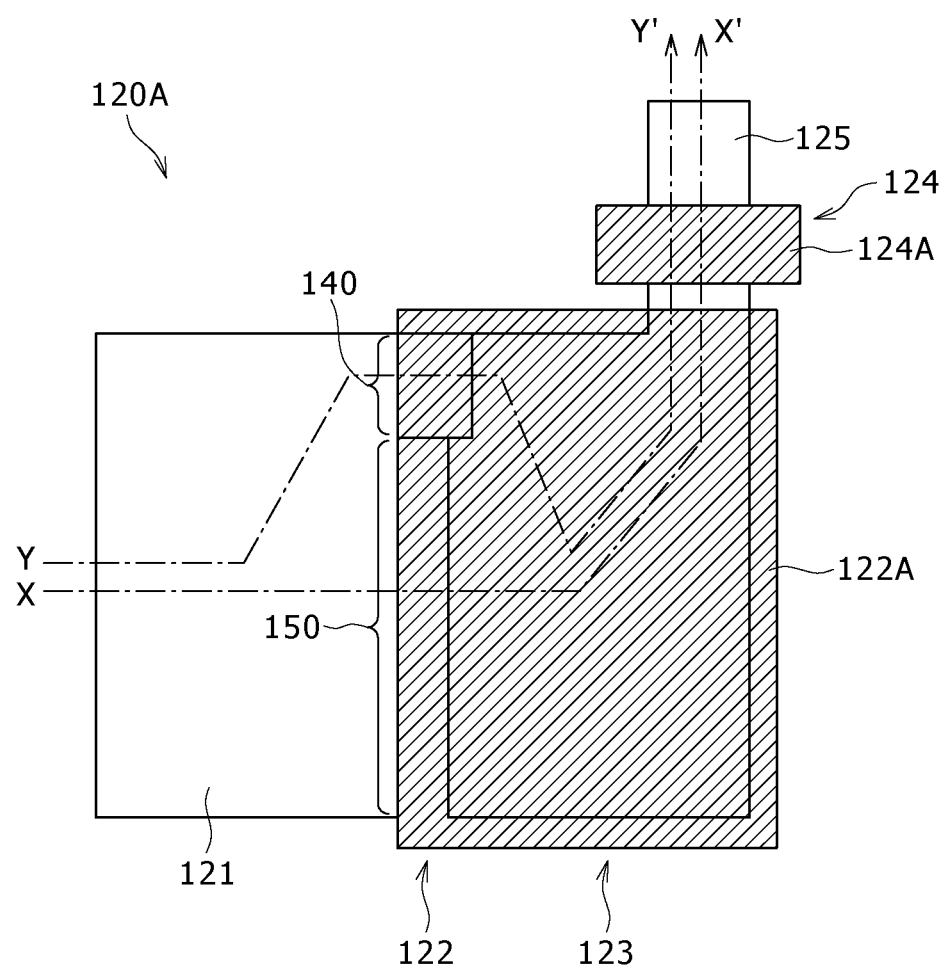
FIG. 3 is a plan view showing the configuration of the unit pixel according to the first embodiment.
Figure 4:
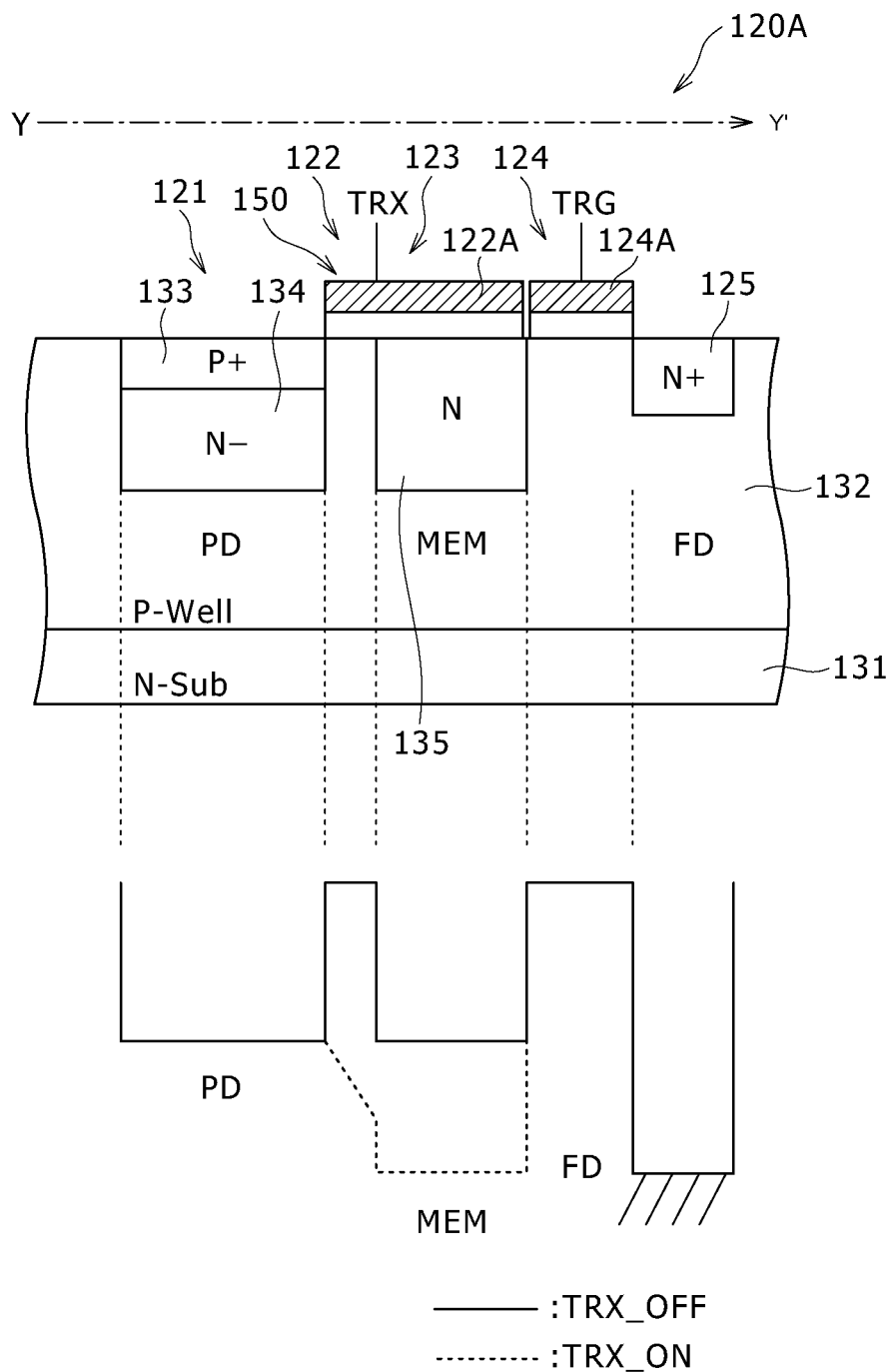
FIG. 4 illustrates a section passing through a complete transfer path and the potential state thereof.
Figure 5:
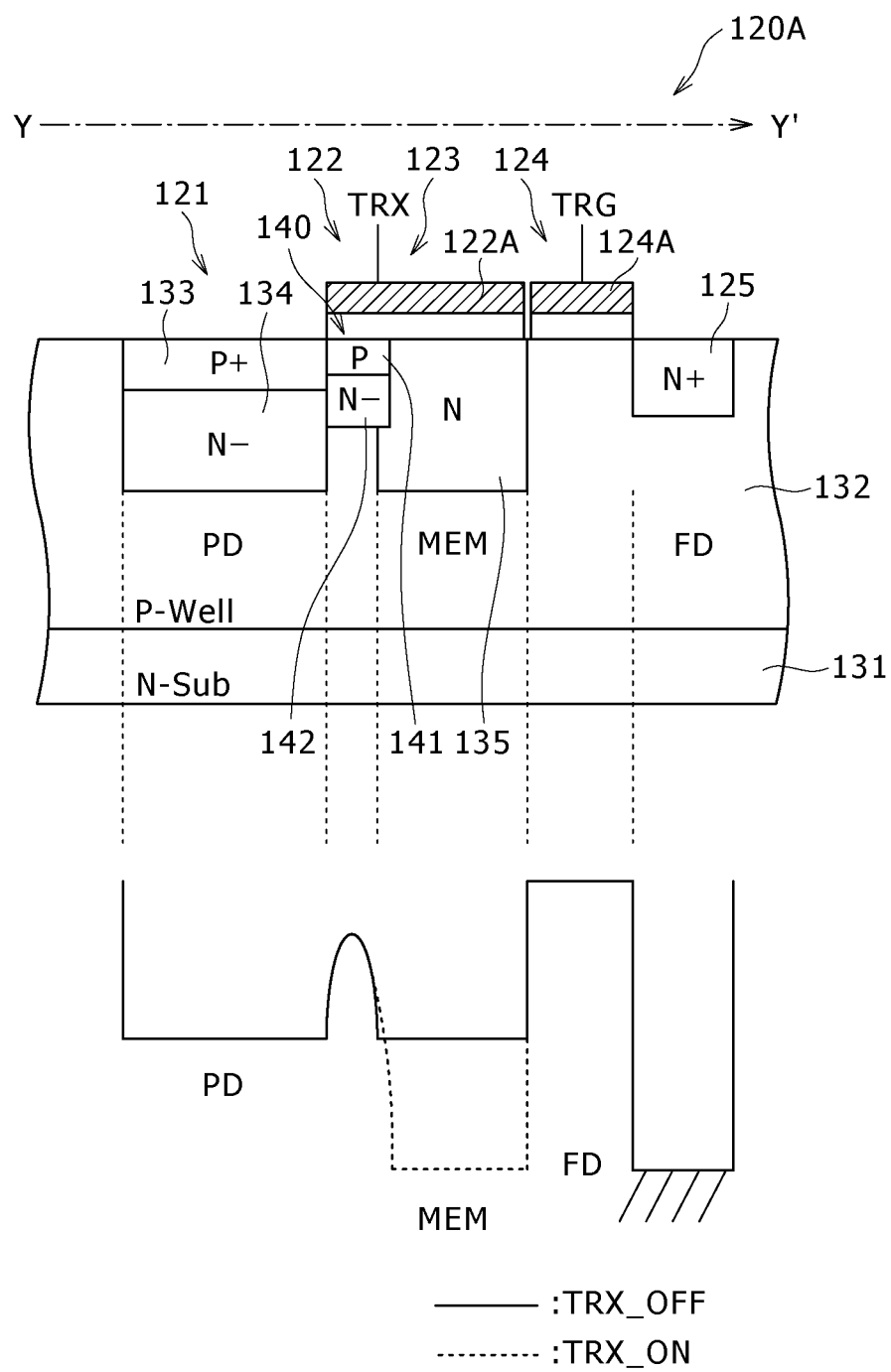
FIG. 5 illustrates a section passing through an intermediate transfer path and the potential state thereof.

Now, the configuration of unit pixels 120A in a first embodiment will be described below referring to FIGS. 3 to 5. In FIGS. 3 to 5 and in the following drawings, the same components as those in the unit pixel of FIG. 2 will be denoted by the same reference symbols as used in FIG. 2, and detailed descriptions of them will be omitted.

FIG. 3 is a plan view showing the configuration of a unit pixel 120A.

As shown in FIG. 3, a photodiode 121, a memory part 123, and a floating diffusion region 125 are disposed in the unit pixel 120A. The photodiode 121 and the memory part 123 are formed to have such an impurity concentration that a depletion state is obtained upon discharging of electric charge. The floating diffusion region 125 is formed to have an impurity concentration such as to permit electrical connection therewith of a wiring contact for taking out a voltage.

Besides, in the unit pixel 120A, a first transfer gate 122 is provided between the photodiode 121 and the memory part 123, and a second transfer gate 124 is provided between the memory part 123 and the floating diffusion region 125. In addition, a gate electrode 122A is so provided as to cover the first transfer gate 122 and the memory part 123, and a gate electrode 124A is so provided as to cover the second transfer gate 124.

In the unit pixel 120A, further, the first transfer gate 122 formed at the boundary between the photodiode 121 and the memory part 123 is divided into an intermediate transfer path 140 and a complete transfer path 150. Specifically, the intermediate transfer path 140 is formed in a part of the first transfer gate 122, and the part where the intermediate transfer path 140 is not formed functions as the complete transfer path 150.

FIG. 4 shows a section of the unit pixel 120A along line X-X' of FIG. 3 which passes through the complete transfer path 150 and the potential state along the section, whereas FIG. 5 shows a section of the unit pixel 120A along line Y-Y' of FIG. 3 which passes through the intermediate transfer path 140 and the potential state along the section.

As shown in FIG. 4, the boundary region between the photodiode 121 and the memory part 123 is a part of the P-type well layer 132. This region functions as the complete transfer path 150 (of the first transfer gate 122) through which the electric charge accumulated in the photodiode 121 is completely transferred to the memory part 123.

Specifically, in the condition where a transfer pulse TRX is not impressed on the gate electrode 122A (OFF condition), the potential of the complete transfer path 150 is high, as indicated by solid line in the potential state shown in FIG. 4. In the condition where the transfer pulse TRX is impressed on the gate electrode 122A (ON condition), the potential of the memory part 123 becomes deeper, as indicated by broken line in the potential diagram; besides, the potential of the complete transfer path 150 has a gradient such that the potential becomes deeper along the direction from the photodiode 121 toward the memory part 123.

In addition, as shown in FIG. 5, the impurity diffusion region 142 provided at the boundary between the photodiode 121 and the memory part 123 functions as the intermediate transfer path 140 (of the first transfer gate 122) through which the electric charge in excess of a predetermined charge amount accumulated in the photodiode 121 is transferred to the memory part 123.

Specifically, as shown in the potential state in FIG. 5, the potential of the intermediate transfer path 140 is lower than the potential of the complete transfer path 150 (FIG. 4). As a result, the electric charge in excess of the predetermined charge amount determined by the potential of the intermediate transfer path 140 flows as a signal charge through the intermediate transfer path 140 to the memory part 123 (namely, overflow of the electric charge occurs).

In addition, an impurity diffusion region 141 of a conductor other than those in the photodiode 121 and the memory part 123 is provided on the surface side of the impurity diffusion region 142. This impurity diffusion region 141 ensures that the potential of the intermediate transfer path 140 would not be varied even when the transfer pulse TRX is impressed on the gate electrode 122A. Specifically, the potential of the intermediate transfer path 140 is kept constant, both in the condition where the transfer pulse TRX is not impressed on the gate electrode 122A (OFF condition) and in the condition where the transfer pulse TRX is impressed on the gate electrode 122A (ON condition).

In order to form the intermediate transfer path 140, the potential of the impurity diffusion region 142 should be set low. The N⁻ impurity diffusion region 142 can be formed by a method wherein an N impurity is lightly added (doping) to the region for forming the impurity diffusion region 142 so as to lower the P impurity concentration there. Or, in the case where a P impurity is added to the region for forming the impurity diffusion region 142 at the time of forming a potential barrier, it is possible by lowering the concentration of the P impurity to form the N⁻ impurity diffusion region 142.

Thus, the N⁻ impurity diffusion region 142 is provided at the boundary portion between the photodiode 121 and the memory part 123, whereby the potential in the boundary portion is lowered, and the portion thus lowered in potential has the function as the intermediate transfer path 140. Therefore, the electric charge generated in the photodiode 121 and exceeding the potential of the intermediate transfer path 140 automatically leaks to the memory part 123, to be accumulated. In other words, the electric charge which is generated in the photodiode 121 and which is not in excess of the potential of the intermediate transfer path 140 is accumulated in the photodiode 121.

Specifically, in the exposure period in which all the plurality of unit pixels perform an imaging action, the electric charge which is generated by photoelectric conversion in the photodiode 121 and which is in excess of the predetermined charge amount determined by the potential of the intermediate transfer path 140 is transferred to the memory part 123 as a signal charge. Thus, in the unit pixel 120A, the intermediate transfer path 140 formed in the boundary portion between the photodiode 121 and the memory part 123 is used as a section for preferentially accumulating in the photodiode 121 the electric charge generated at a low illuminance.

Incidentally, in FIG. 5, a structure in which the intermediate transfer path 140 is formed by providing the N⁻ impurity diffusion region 137 is adopted. However, a structure may be adopted in which the intermediate transfer path 140 is formed by providing a P⁻ impurity diffusion region 137, instead of providing the N⁻ impurity diffusion region 137.

Since the unit pixel 120A is configured as above-mentioned and the intermediate transfer path 140 and the complete transfer path 150 are separately formed as above-mentioned, it is possible to reduce variations in the potential barrier which arise from the diffusion of an impurity from a high-concentration impurity diffusion region, the position and potential of the gate electrode 122A at the first transfer gate 122, and the amount of electric charge accumulated in the photodiode 121.

In addition, a stable potential barrier can be formed based on the concentration of the impurity in the impurity diffusion region 142 for forming the intermediate transfer path 140. Accordingly, enhancement of sensitivity by maximization of the area of the photodiode 121 and enhancement of image quality of the output image by maximization of the low noise signal range are both attainable, without spoiling transfer efficiency in the complete transfer.

Here, the unit pixel so configured that the intermediate transfer path and the complete transfer path are combinedly formed in the first transfer gate will be described referring to FIGS. 6A to 7C.

FIGS. 6A to 7C each show a unit pixel 20 in which a potential barrier φm is formed in a first transfer gate 22 present between a photodiode 21 and a memory part 23, as disclosed in the above-mentioned Patent Document 1. In the case where the potential barrier φm is thus formed and where the function as the intermediate transfer path and the function as the complete transfer path are both realized by the first transfer gate 22, a reduction of scattering of the potential barrier φm is limited for the following two reasons.

Figure 6A:
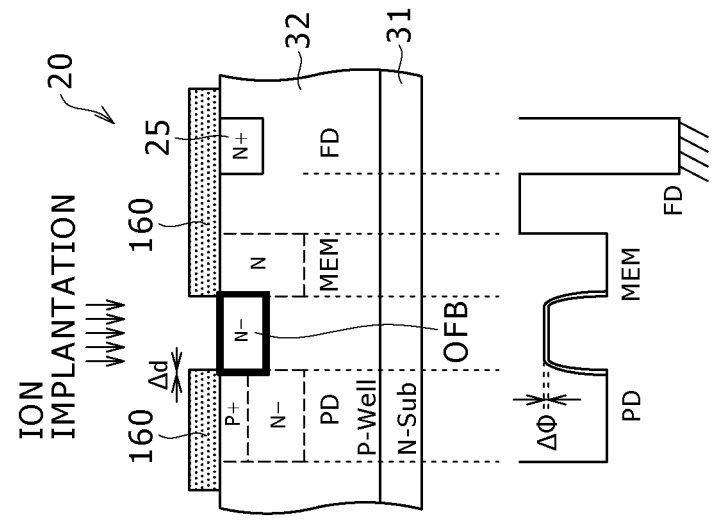
FIGS. 6A to 6C illustrate a configuration in which an intermediate transfer path and a complete transfer path are realized by a common structure.
Figure 6B:
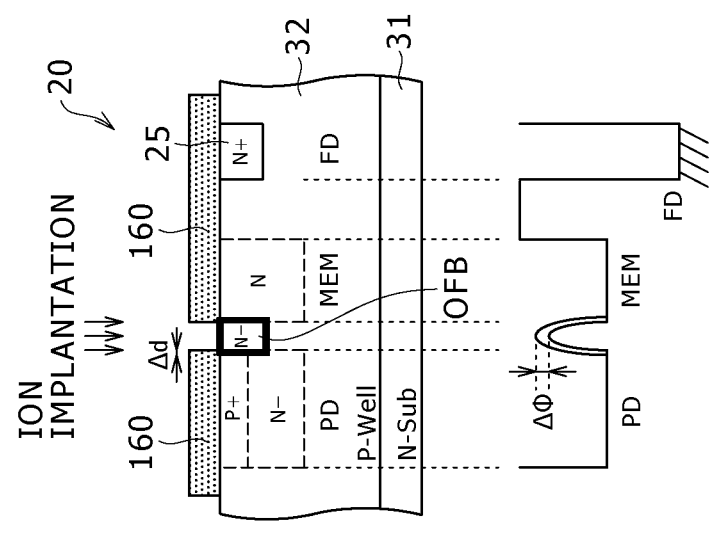

The first reason resides in that the spacing L (hereafter referred to as "L length" when appropriate) of an impurity diffusion region OFB for forming the potential barrier φm is preferably designed to be as small as possible, for maximizing the accumulated charge Qm in the photodiode 21 and the maximum charge amount Qc in the memory part 23. However, as shown in FIG. 6B, when the L length of the impurity diffusion region OFB is designed to be small, the scattering Δd of the resist width in a resist mask 160 provided at the time of ion implantation influences greatly the scattering Δφ of the potential barrier φm. Specifically, when the L length of the impurity diffusion region OFB is designed to be small for the purpose of securing the areas of the photodiode 21 and the memory part 23, variations in the scattering Δd of the resist width causes large variations in the impurity concentration in the impurity diffusion region OFB and large variations in the scattering Δφ of the potential barrier φm.

Figure 6C:
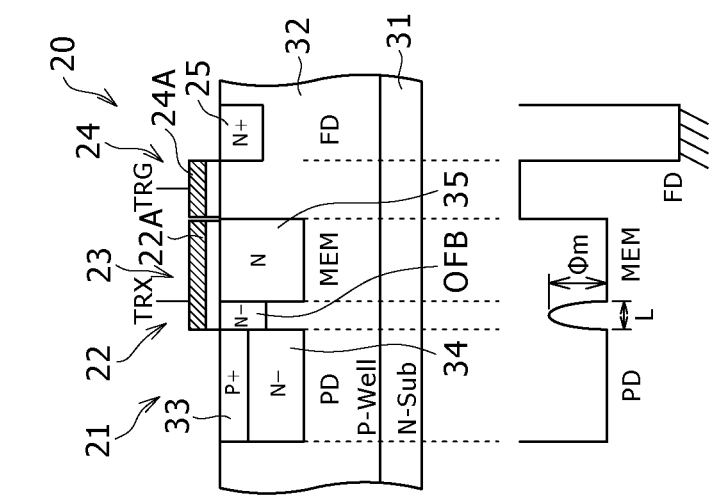

On the other hand, when the L length of the impurity diffusion region OFB is designed to be large as shown in FIG. 6C, the scattering Δφ of the potential barrier φm can be suppressed, but the areas of the photodiode 21 and the memory part 23 are much reduced. Therefore, from the viewpoint of maximization of the accumulated charge Qm in the photodiode 21 and the maximum charge amount Qc in the memory part 23, it is difficult to enlarge the transfer path length (L length) in the structure in which the function of the intermediate transfer path and the function of the complete transfer path are both realized combinedly by the first transfer gate 22.

Figures 7A, 7B, 7C:
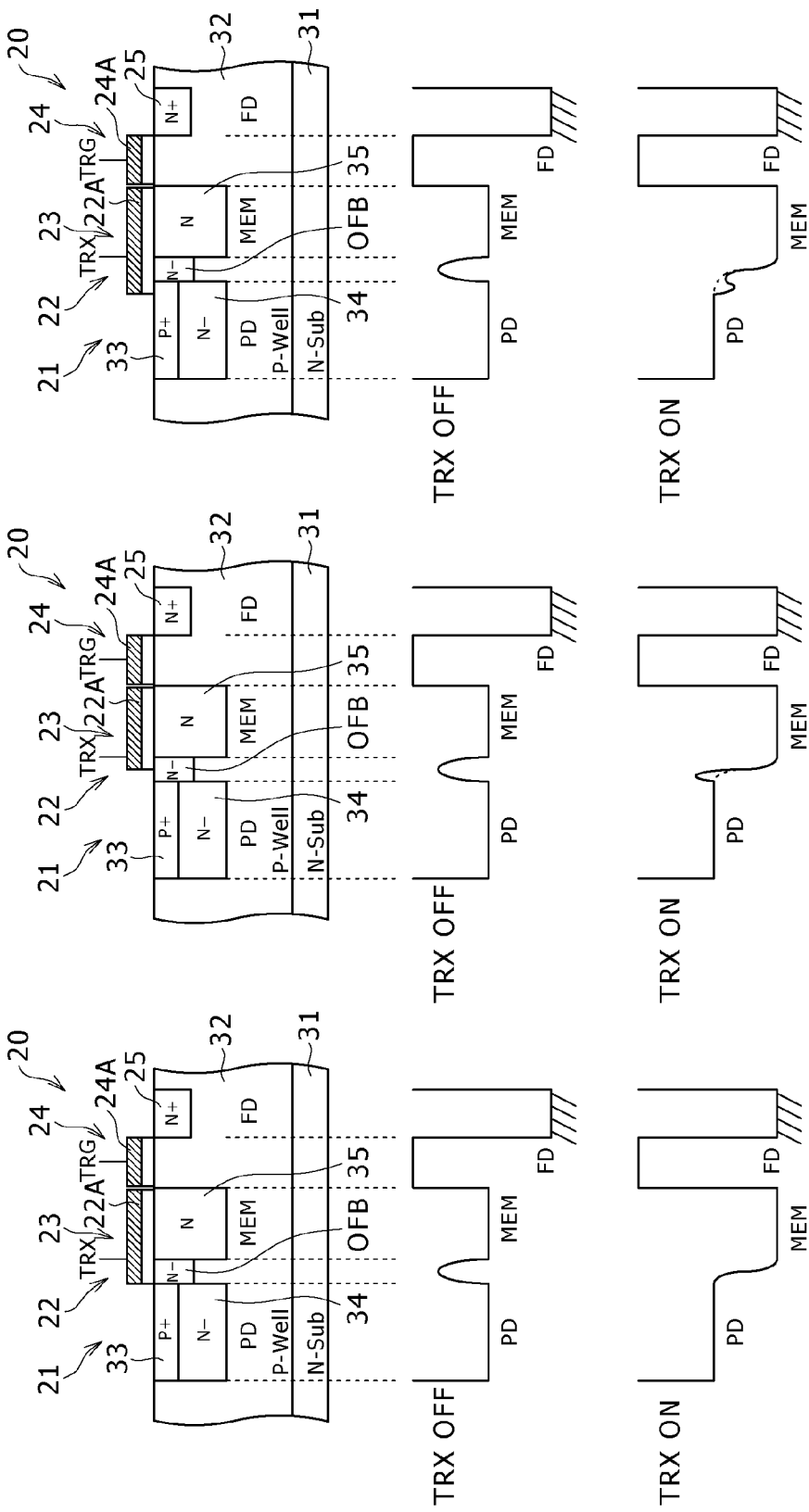
FIGS. 7A to 7C illustrate a configuration in which an intermediate transfer path and a complete transfer path are realized by a common structure.

The second reason resides in that the susceptibility to influence of misalignment of a mask is increased. Specifically, the impurity diffusion region OFB for forming the potential barrier φm in the first transfer gate 22 is covered by the gate electrode 22A of the first transfer gate 22, and, therefore, ion implantation is carried out before formation of the gate electrode 22A. In the treatment for forming the gate electrode 22A which is carried out subsequently to the ion implantation, the gate electrode 22A is preferably so formed as to coincide with an end portion of the impurity diffusion region OFB, as shown in FIG. 7A.

However, since the gate electrode 22A and the impurity diffusion region OFB are formed through resist formation in different mask patterns, there would arise misalignment, resulting in scattering of the potential barrier $\phi m$.

Specifically, the gate electrode 22A has the function as the complete transfer path through which the electric charge accumulated in the photodiode 21 is entirely transferred to the memory part 23 when the transfer pulse TRX is impressed. In the case where an end portion of the gate electrode 22A is deviated toward the side of the memory part 23, a part of the impurity diffusion region OFB is not covered by the gate electrode 22A, as shown in FIG. 7B; in this case, modulation of the potential by the gate electrode 22A is partly disabled, so that a potential barrier is left upon complete transfer. On the other hand, in the case where an end portion of the gate electrode 22A is deviated toward the side of the photodiode 21, a transfer barrier is generated upon application of the transfer pulse TRX, so that an output signal cannot be read out accurately.

Accordingly, for stabilizing the transfer characteristics in complete transfer, for example, a self-alignment is effective in which ion implantation for the photodiode 21 is carried out after formation of the gate electrode 22A. In that case, however, ion implantation for the photodiode 21 is conducted after formation of the impurity diffusion region OFB; therefore, misalignment between the mask for the gate electrode 22A and the mask for the impurity diffusion region OFB would be generated, causing variations in the impurity concentration in the impurity diffusion region OFB.

Thus, there is the problem that the reduction of scattering of the potential barrier $\phi m$ is limited for the above-mentioned first and second reasons. This problem arises from the fact that the function of the intermediate transfer path and the function of the complete transfer path are both realized combinedly by the first transfer gate 22, in order to permit modulation of the potential barrier $\phi m$ by the gate electrode 22A to be realized for completely transferring the electric charge of the photodiode 21. Specifically, the potential barrier $\phi m$ determining the overflow by the intermediate transfer path is the lowest barrier in the complete transfer path, even in the case where a voltage is impressed on the first transfer gate 22. Consequently, in relation to the mask misalignment, it is difficult to realized both the intermediate transfer path and the complete transfer path in the first transfer gate 22.

In view of the foregoing, in this embodiment, the intermediate transfer path 140 and the complete transfer path 150 are separately formed in the unit pixel 120A, as above-mentioned, whereby scattering of the potential barrier can be reduced. The reduction of the scattering of the potential barrier ensures that, in the unit pixel 120A, a signal with lower noise and higher image quality can be obtained.

Here, the obtainment of a signal with lower noise and higher image quality in the unit pixel 120A will be described.

Let the signal charge accumulated according to the intensity of incident light be Qsig, let the electric charge transferred through the intermediate transfer path 140 to the memory part 123 be Qh, and let the electric charge transferred through the complete transfer path 150 to the memory part 123 be Ql, then (the signal charge Qsig)=(the electric charge Qh)+(the electric charge Ql). Here, in the case where incident light is dark and the accumulated electric charge does not exceed the potential barrier $\phi m$ between the photodiode 121 and the memory part 123, Qh=0.

Further, let the maximum value of the electric charge Ql determined by the potential barrier $\phi m$ be Qm, and in the case where the incident light is bright and where an accumulated charge such that (the signal charge Qsig)>(the maximum value Qm) is obtained, then the electric charge Qh obtained by (the electric charge Qh)=(the signal charge Qsig)−(the maximum value Qm) is transferred through the intermediate transfer path 140 into the memory part 123, to be held there. In this instance, it is assumed that the potential barrier $\phi m$ is scattered and that a pixel with $\phi m + \Delta \phi m$ is present. Let the variation in the electric charge Qm due to the difference $\Delta \phi m$ of the potential barrier be $\Delta Qm$, then the accumulation in the memory part 123 begins in the case where the accumulated charge Qsig exceeds (the electric charge Qm)+(the variation $\Delta Qm$), and the electric charge Qh satisfying the relation of (the electric charge Qh)>0 is held in the memory part 123.

Specifically, in the case where (the signal charge Qsig)≤ (the electric charge Qm)+(the variation $\Delta Qm$), (the electric charge Ql)=(the signal charge Qsig) and (the electric charge Qh)=0, so that addition of both the outputs gives the relationship of (the electric charge Qh)+(the electric charge Ql)=(the signal charge Qsig), thereby obtaining an accurate signal. On the other hand, in the case where (the signal charge Qsig)> (the electric charge Qm)+(the variation $\Delta Qm$), also, the electric charge Qh and the electric charge Ql are read out as (the electric charge Qh)=(the signal charge Qsig)−{(the electric charge Qm)+(the variation $\Delta Qm$)} and (the electric charge Ql)=(the electric charge Qm)+(the variation $\Delta Qm$), so that addition of both the outputs gives the relationship of (the electric charge Qh)+(the electric charge Ql)=(the signal charge Qsig), thereby obtaining an accurate signal in the same manner as above. Especially, where the output of the electric charge Ql is sufficiently smaller than the electric charge Qm, the electric charge Qh is not added, whereby superposition of noises can be obviated.

Thus, if the electric charge Ql (≤Qm) accumulated in the photodiode 121 after transfer of the electric charge Qh through the intermediate transfer path 140 is an electric charge amount which can be held by the memory part 123 after transferred through the complete transfer path 150 into the memory part 123, the scattering of the potential barrier $\phi m$ would not cause collapse of the output image.

In order to obtain an output image free of collapse, a condition of (the maximum charge Qc)≥(the electric charge Qm) should be satisfied, where Qc is the maximum charge which can be held in the memory part 123. The relation of (the maximum charge Qc)≥(the electric charge Qm) for a given potential barrier $\phi m$ can be established easily by enlarging the area of the memory part 123 and reducing the area of the photodiode 121. In practice, however, enlargement of the area of the photodiode 121 increases the aperture area, which is advantageous on a sensitivity basis. In addition, an increase in the electric charge Qm makes it possible to broaden the low-noise signal range in which kTC noises would not be superposed. Accordingly, for obtaining a higher image quality, it is important to maximize the electric charge Qm while maintaining the relationship of (the maximum charge Qc)≥(the electric charge Qm).

Particularly, in the case where (the signal charge Qsig)≤ (the electric charge Qm), an output is preferably obtained without adding the electric charge Qh to the electric charge Ql, thereby preventing superposition of noises. In the case where the electric charge Qh is not zero (Qh≠0), the addition is needed. Thus, it should be judged whether or not the addition is to be conducted, using the minimum value of the electric charge Qm as a threshold. Specifically, in the case where a pixel with (the electric charge Qm)=(the variation ΔQm) is present as a minimum value because of large scattering of the potential barrier φm, the low-noise signal range free of superposition of noises of the electric charge Qh would be narrowed. Besides, since the relationship of (the maximum charge Qc)≥(the electric charge Qm) should be satisfied, in the case where a pixel with (the electric charge Qm)+(the variation ΔQm) is present as a maximum value, the maximum charge Qc should be enlarged, which would be accompanied by enlargement of the memory part 123 and reduction of the photodiode 121, whereby the electric charge Qm would be reduced.

Thus, by reducing the scattering of the potential barrier φm, it is possible to contrive enhancement of sensitivity through maximization of the area of the photodiode 121 and enhancement of image quality of the output image through maximization of the low-noise signal range. Besides, since the intermediate transfer path 140 and the complete transfer path 150 are separately formed in the unit pixel 120A, as above-mentioned, the scattering of the potential barrier can be reduced, and a signal with lower noise and higher image quality can be obtained.

Now, the impurity concentration in the impurity diffusion region in the unit pixel 120A will be described.

For example, it is assumed that the unit pixel 120A has a structure in which the P-type well layer 132 is formed on the N-type substrate 131, and an N-type impurity is diffused into the P-type well layer 132 to form the photodiode 121 and the memory part 123. In this instance, where the P-type impurity concentration in the P-type well layer 132 is $10^{15}$ cm$^{-3}$, the photodiode 121 and the memory part 123 are formed to have such an N-type impurity concentration that a depletion state is obtained upon discharging of electric charge, for example, $10^{16}$ to $10^{17}$ cm$^{-3}$.

Besides, the impurity diffusion region 142 which is the intermediate transfer path 140 is similarly formed to have such an impurity concentration as to be in a depletion state upon discharging of electric charge and to be able to form a potential barrier. By the magnitude of the potential barrier determined by the above-mentioned predetermined electric charge amount, the impurity concentration in the impurity diffusion region 142 is regulated to within the range from a P-type impurity concentration to an N-type impurity concentration which is lower than those in the photodiode 121 and the memory part 123. In addition, the impurity diffusion region 141 formed on the surface side of the intermediate transfer path 140 is formed to have a P-type impurity concentration higher than that of the impurity diffusion region 142, for example, $10^{18}$ to $10^{19}$ cm$^{-3}$.

On the other hand, the floating diffusion region 125 is formed to have such an N-type impurity concentration as to permit electrical connection therewith of wiring contacts, for example, $10^{19}$ to $10^{20}$ cm$^{-3}$. Incidentally, a structure may be adopted in which the P type and the N type are reversed as compared with the above-described structure; specifically, a structure may be adopted in which an N-type well layer is formed on a P-type substrate, and P-type impurity diffusion regions are formed.

As above-mentioned, in forming the intermediate transfer path 140, the difference between the impurity concentration in the memory part 123 serving as a destination of transferred electric charges and the impurity concentration in the impurity diffusion region 142 for forming the potential barrier is reduced, whereby it is possible to prevent spoiling of barrier controllability at the impurity diffusion region 142 due to diffusion of the impurity in the memory part 123.

[First Modification of First Embodiment]

Figure 8:
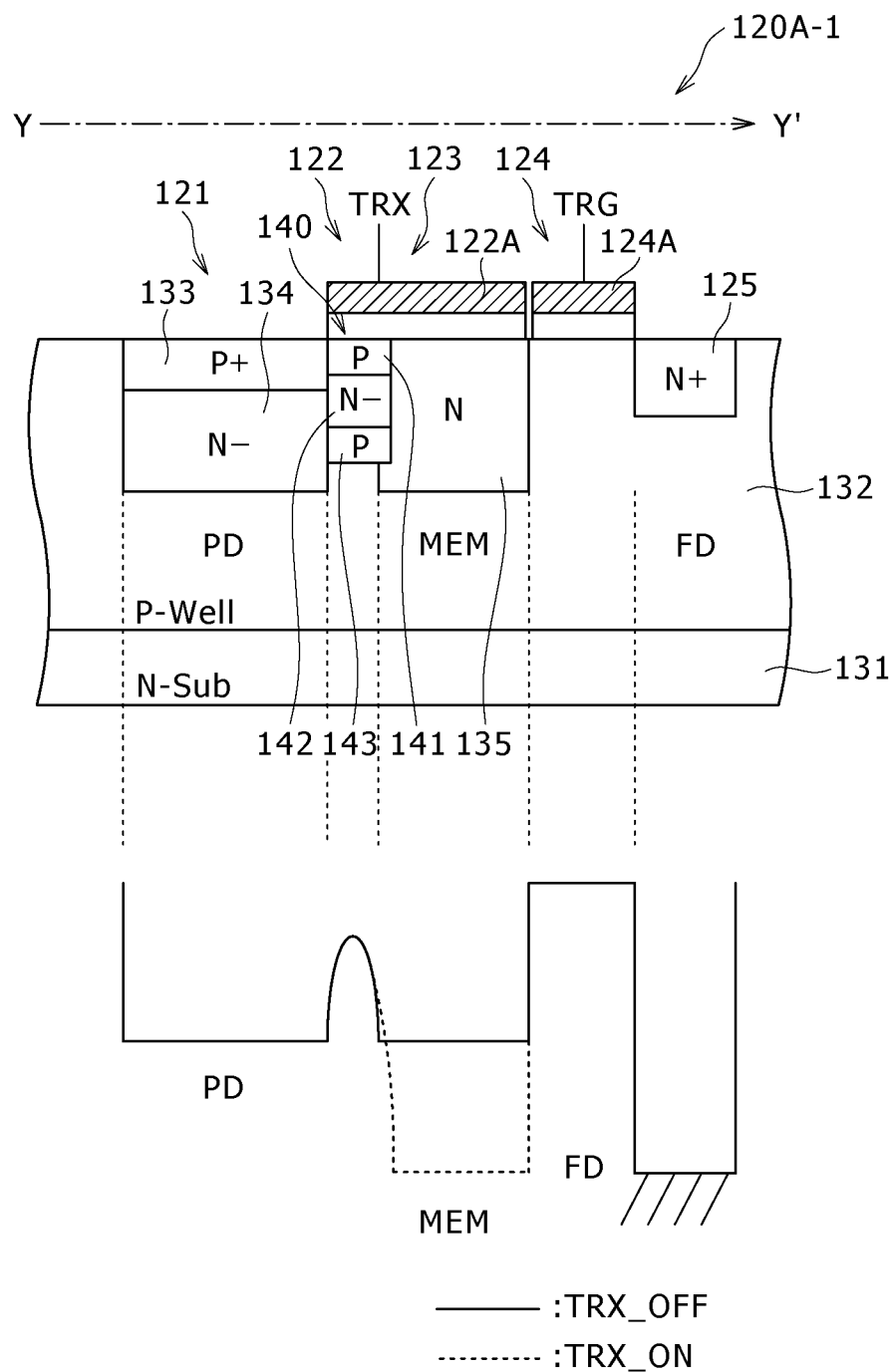
FIG. 8 illustrates the configuration of a first modification of the first embodiment.

Now, referring to FIG. 8, a unit pixel 120A-1 as a first modification of the unit pixel 120A according to the first embodiment will be described below. FIG. 8 shows a configuration example of a section of the unit pixel 120A-1 along line Y-Y' of FIG. 3.

In the unit pixel 120A-1 shown in FIG. 8, an impurity diffusion region 143 having a conductor (P) different from those in a photodiode 121 and a memory part 123 is formed on the lower side of an impurity diffusion region 142 forming an intermediate transfer path 140.

For instance, in the case where an impurity distribution is absent in a region deeper than the impurity diffusion region 142, the electric field gradient in the depth direction of the impurity diffusion region 142 is small, which causes overflow of electric charge into other region than the memory part 123. In view of this, in the unit pixel 120A-1, the impurity diffusion region 143 is formed on the lower side of the impurity diffusion region 142, thereby restraining the overflow of electric charge into other region than the memory part 123. Consequently, stable overflow of a light electric charge in excess of a predetermined charge amount in the photodiode 121 into the memory part 123 can be caused to occur.

[Method of Manufacturing Unit Pixel 120A-1]

Figure 9:
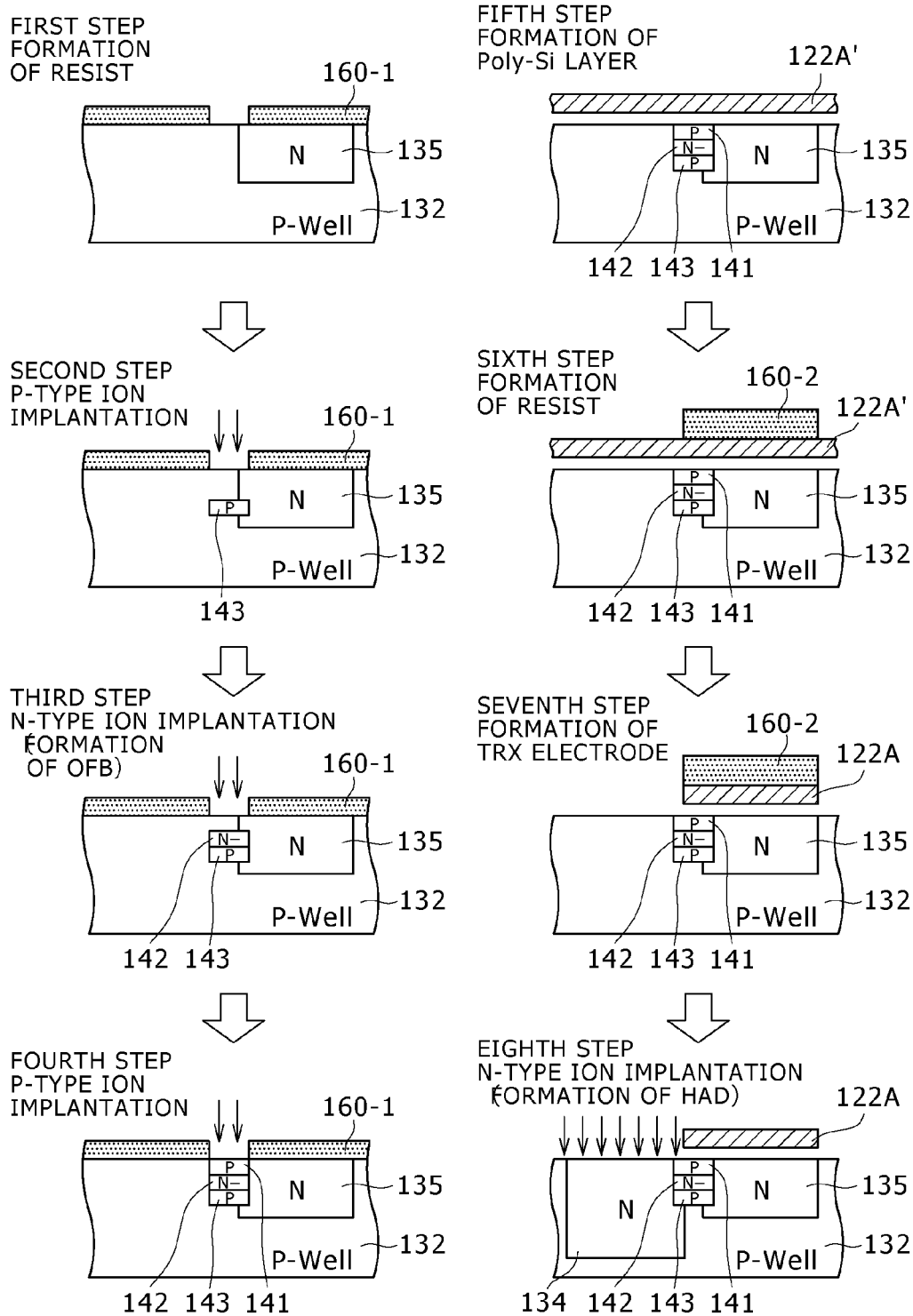
FIG. 9 illustrates a method of manufacturing the unit pixel.

Now, a method of manufacturing the unit pixel 120A-1 will be described below, referring to FIG. 9.

In a first step, a resist 160-1 is formed on the surface of a substrate provided with a buried channel 135 in a P-type well layer 132. The resist 160-1 is for forming an intermediate transfer path 140 in a portion of a first transfer gate 122, as shown in plan view in FIG. 3, and its region corresponding to the intermediate transfer path 140 is opened. Besides, the opening in the resist 160-1 is so formed as to slightly overlap with the buried channel 135.

In a second step, P-type ion implantation is conducted using the resist 160-1, to form an impurity diffusion region 143 at a position corresponding to a predetermined depth. In a third step, N-type ion implantation is carried out using the resist 160-1, to form an impurity diffusion region 142 in contact with the upper surface of the impurity diffusion region 143. In a fourth step, P-type ion implantation is conducted using the resist 160-1, to form an impurity diffusion region 141 so as to make contact with the upper surface of the impurity diffusion region 142 and to range to the surface of the substrate.

Thus, in the second to fourth step, ion implantation operations are carried out utilizing the same resist 160-1, and a potential barrier is determined by the concentration distribution in the depth direction. Therefore, no mask misalignment problem occurs in the impurity diffusion regions 141 to 143.

Next, after the resist 160-1 is removed, a fifth step is carried out in which a polysilicon layer 122A' to be a gate electrode 122A is formed on the substrate surface. In a sixth step, a resist 160-2 is formed on the surface of the polysilicon layer 122A' in an area corresponding to the gate electrode 122A to be formed. In a seventh step, etching for removing the unrequired polysilicon layer 122A' is conducted, to form the gate electrode 122A.

In an eighth step, N-type ion implantation is performed, to form an N-type buried layer 134, whereby a photodiode 121 is provided.

[Second Modification of First Embodiment]

Figure 10:
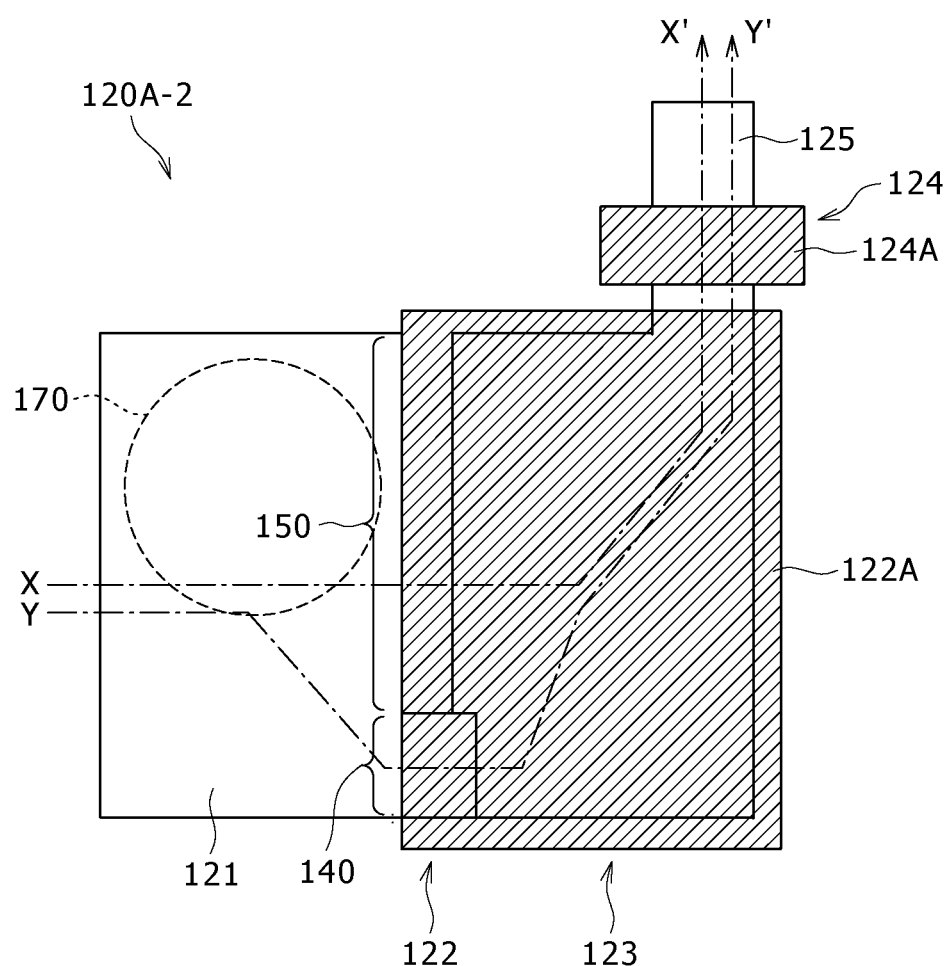
FIG. 10 illustrates the configuration of a second modification of the first embodiment.

Now, referring to FIG. 10, a unit pixel 120A-2 as a second modification of the unit pixel 120A according to the first embodiment will be described below. FIG. 10 is a plan view showing the configuration of the unit pixel 120A-2. Incidentally, the configurations of sections of the unit pixel 120A-2 along line X-X' and line Y-Y' of FIG. 10 are the same as the configurations of the unit pixel 120 shown in FIGS. 4 and 5.

In FIG. 10, a broken-line circle 170 indicates a region into which incident light being incident on a photodiode 121 is condensed. In the unit pixel 120A-2, an intermediate transfer path 140 is disposed at that boundary between the photodiode 121 and a memory part 123 which is the remotest from the optical center of the photodiode 121 (the center of the broken-line circle 170).

With the intermediate transfer path 140 thus formed in a region remote from the region into which the incident light is condensed, light electric charge generated by incidence of light on a depletion region of the intermediate transfer path 140 can be restrained from leaking into the memory part 123. This ensures that, in the unit pixel 120A-2, noise generated due to leakage of such light electric charge into the memory part 123 can be reduced.

[Third Modification of First Embodiment]

Figure 11:
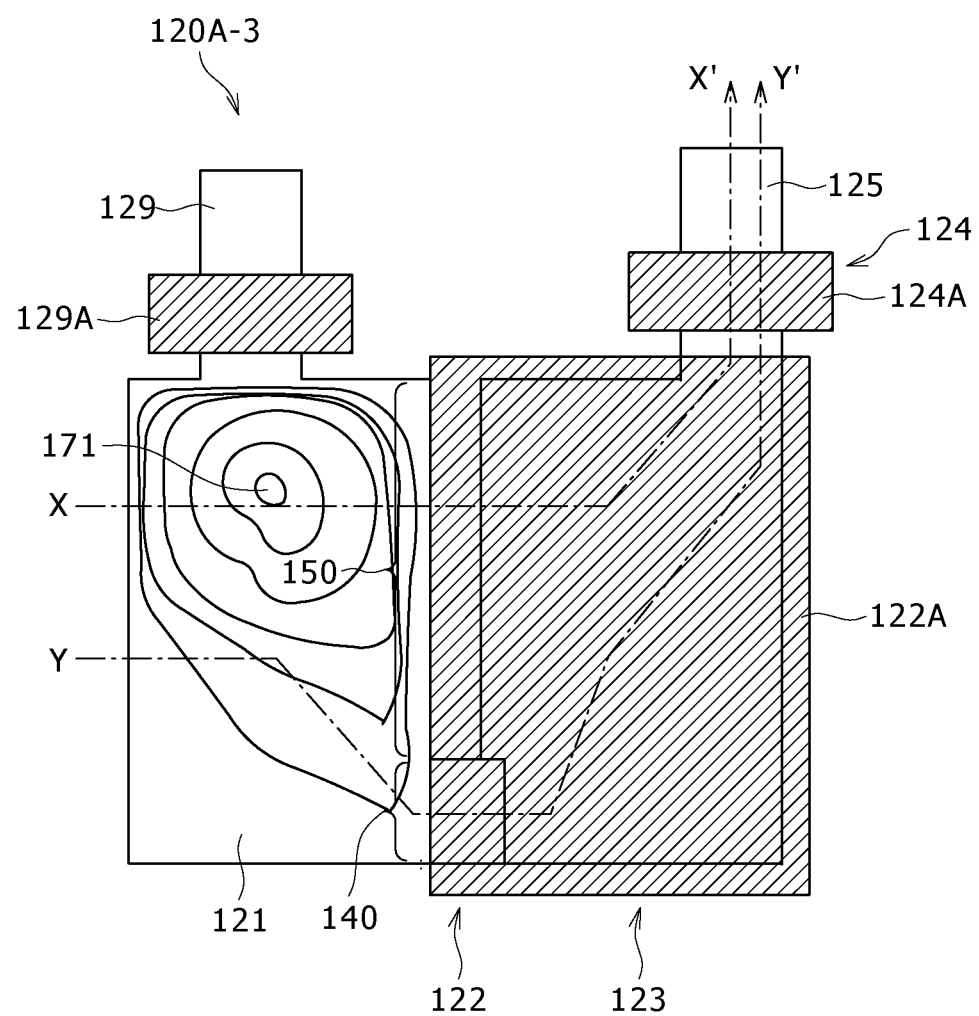
FIG. 11 illustrates the configuration of a third modification of the first embodiment.

Now, a unit pixel 120A-3 as a third modification of the unit pixel 120A according to the first embodiment will be described below, referring to FIG. 11. FIG. 11 is a plan view showing the configuration of the unit pixel 120A-3. Incidentally, the configurations of sections of the unit pixel 120A-3 along line X-X' and line Y-Y' of FIG. 11 are the same as the configurations of the unit pixel 120A shown in FIGS. 4 and 5.

In FIG. 11, contour lines expressing the depth of potential in plan view are indicated in the region of a photodiode 121, and a point 171 indicates the deepest potential portion where the potential is the deepest. In the unit pixel 120A-3, an intermediate transfer path 140 is disposed at that boundary between the photodiode 121 and a memory part 123 which is the remotest from the point 171 in the deepest potential portion.

The deepest potential portion of the photodiode 121 is so designed that transfer efficiency is enhanced, depending on the position of a complete transfer path 150 and the position of a gate electrode 129A of an electric-charge discharging part 129 for forcibly discharging an electric charge. In the unit pixel 120A-3, with the intermediate transfer path 140 disposed at a position remotest from the point 171 of the deepest potential portion, the influence of modulation of a potential barrier for the intermediate transfer path 140 by accumulation of electric charge can be reduced.

In addition, this configuration ensures that transfer efficiency can be enhanced because the deepest potential portion of the photodiode 121 and the complete transfer path 150 are located close to each other for realizing complete transfer of electric charge. Besides, with the intermediate transfer path 140 located remote from the deepest potential portion of the photodiode 121, the capacitance between the photodiode 121 and the potential barrier can be reduced, whereby modulation of the potential barrier by accumulation of electric charge can be reduced.

[Second Embodiment]

Figure 12A:
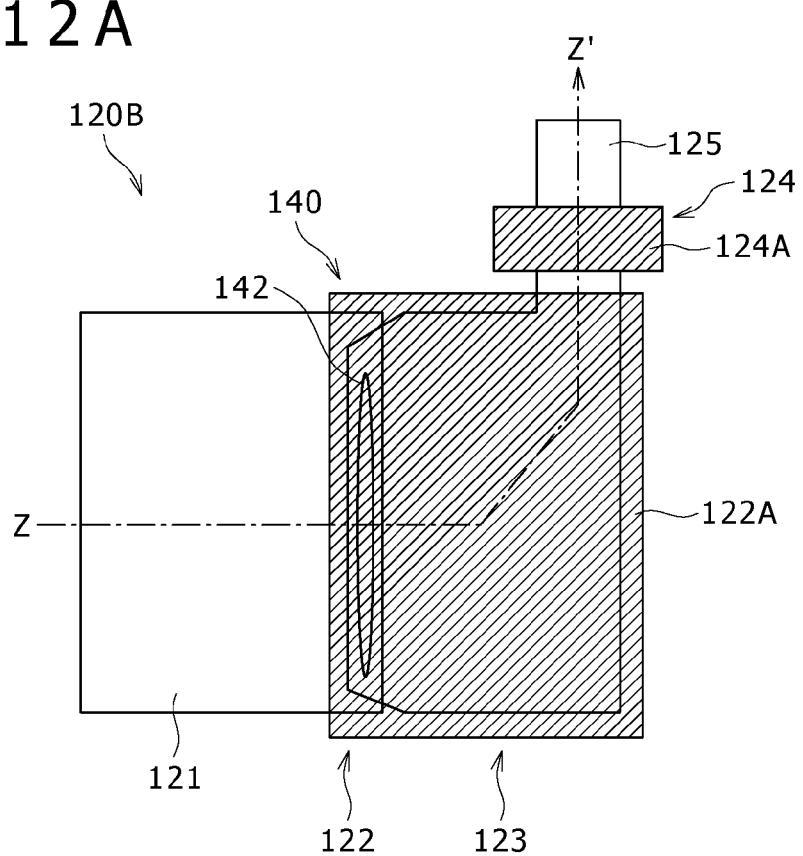
FIGS. 12A and 12B illustrate the configuration of a unit pixel which is a second embodiment.
Figure 12B:
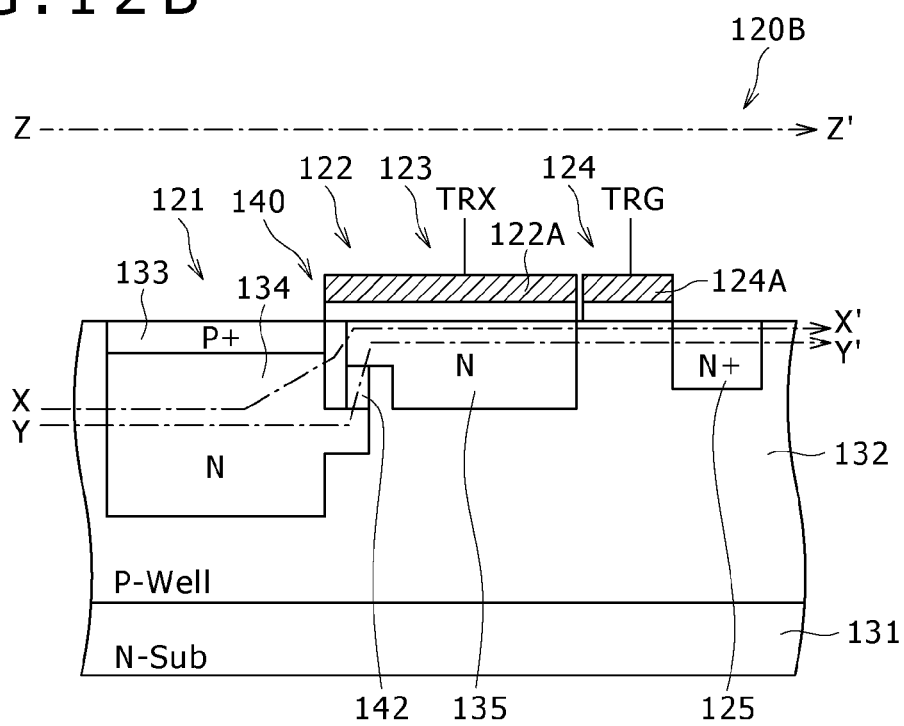
Figure 13A:
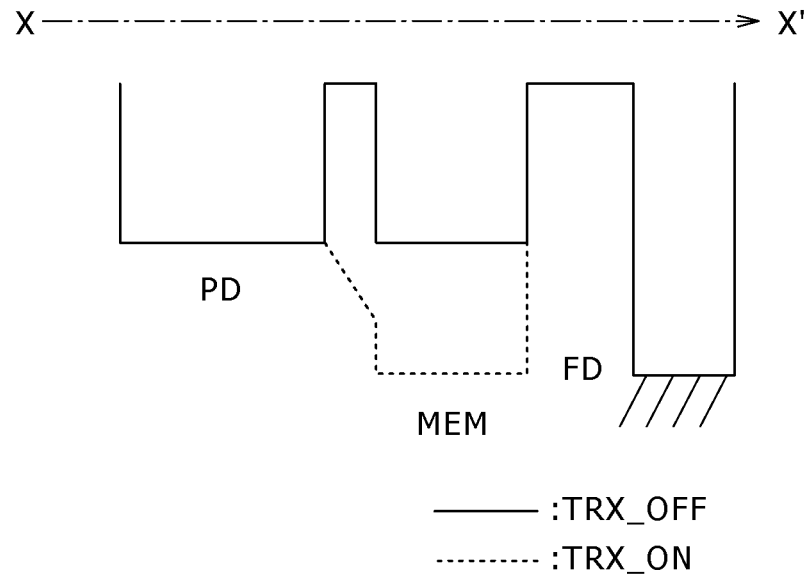
FIGS. 13A and 13B illustrate potential states of the unit pixel which is the second embodiment.
Figure 13B:
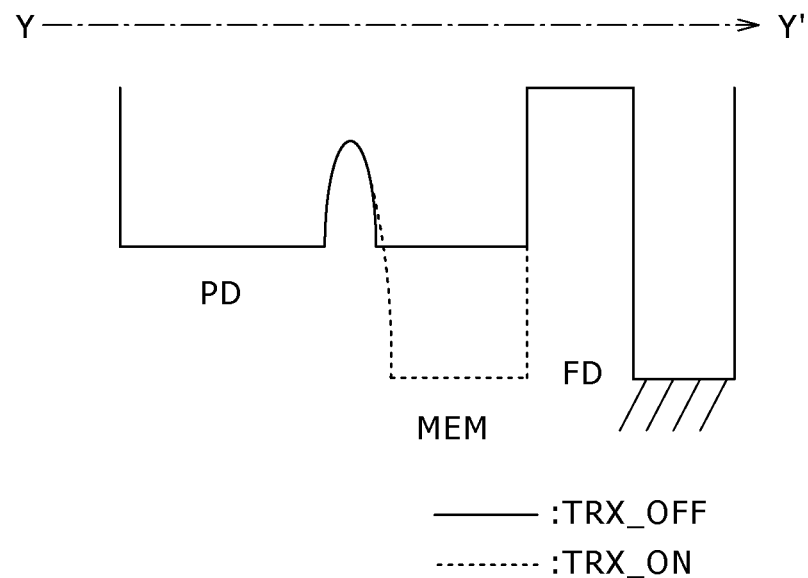

Now, a unit pixel 120B according to a second embodiment will be described below, referring to FIGS. 12A to 13B. FIG. 12A is a plan view showing the configuration of the unit pixel 120B, and FIG. 12B is a sectional view of the unit pixel 120B along line Z-Z' of FIG. 12A. Besides, FIG. 13A shows the potential state along line X-X' of FIG. 12A which passes through a complete transfer path 150, and FIG. 13B shows the potential state along line Y-Y' of FIG. 12 which passes through an intermediate transfer path 140.

In the unit pixel 120B, an N-type buried layer 134 of a photodiode 121 and a buried channel 135 of a memory part 123 are formed so that a part of the N-type buried layer 134 and a part of the buried channel 135 overlap, in plan view, with each other over the whole surface in the width direction (the vertical direction in FIG. 12A) at a boundary portion between the photodiode 121 and the memory part 123. Besides, in a separation region between them in the depth direction, an impurity diffusion region 142 is formed, whereby the intermediate transfer path 140 is provided. Specifically, an electric charge in excess of a predetermined charge amount flows over through the impurity diffusion region 142 as the intermediate transfer path 140 in the depth direction.

In addition, in the unit pixel 120B, a channel formed at the surface of the silicon substrate when a transfer pulse TRX is impressed on a gate electrode 122A of a first transfer gate 122 functions as the complete transfer path 150. Incidentally, while a part of the N-type buried layer 134 and a part of the buried channel 135 overlap with each other so that the part of the N-type buried layer 134 is located on the substrate surface side whereas the part of the buried channel 135 is located on the substrate bottom side in the unit pixel 120B shown in FIGS. 12A and 12B, the overlapping relation may be reversed so that the part of the N-type buried layer 134 is located on the substrate bottom side whereas the part of the buried channel 135 is located on the substrate surface side. Thus, in the unit pixel 120B, it is possible by disposing the memory part 123 at a deep position to reduce the amount of incident light entering the memory part 123.

[First Modification of Second Embodiment]

Figure 14A:
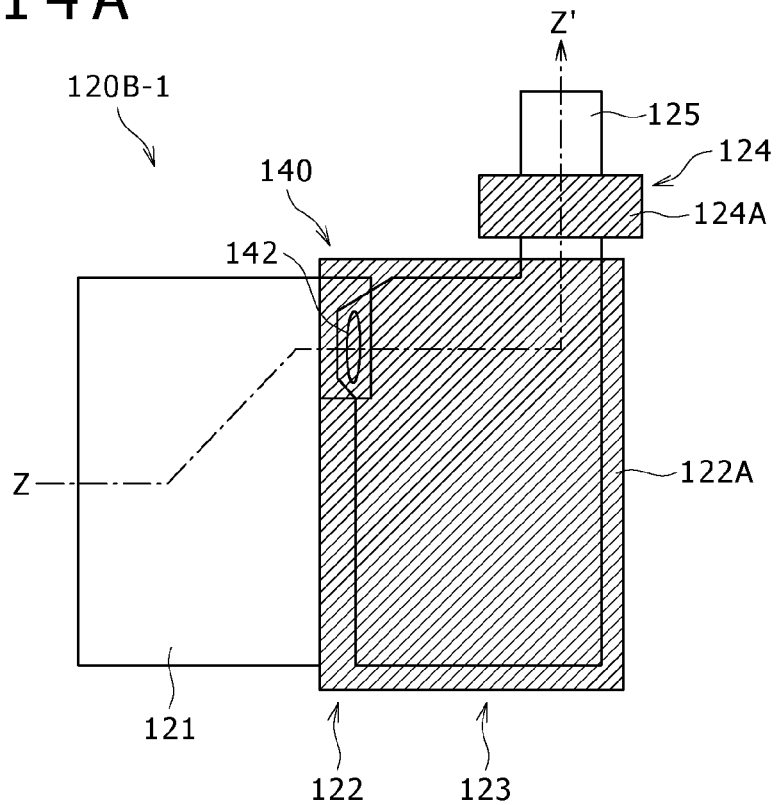
FIGS. 14A and 14B illustrate the configuration of a second modification of the second embodiment.
Figure 14B:
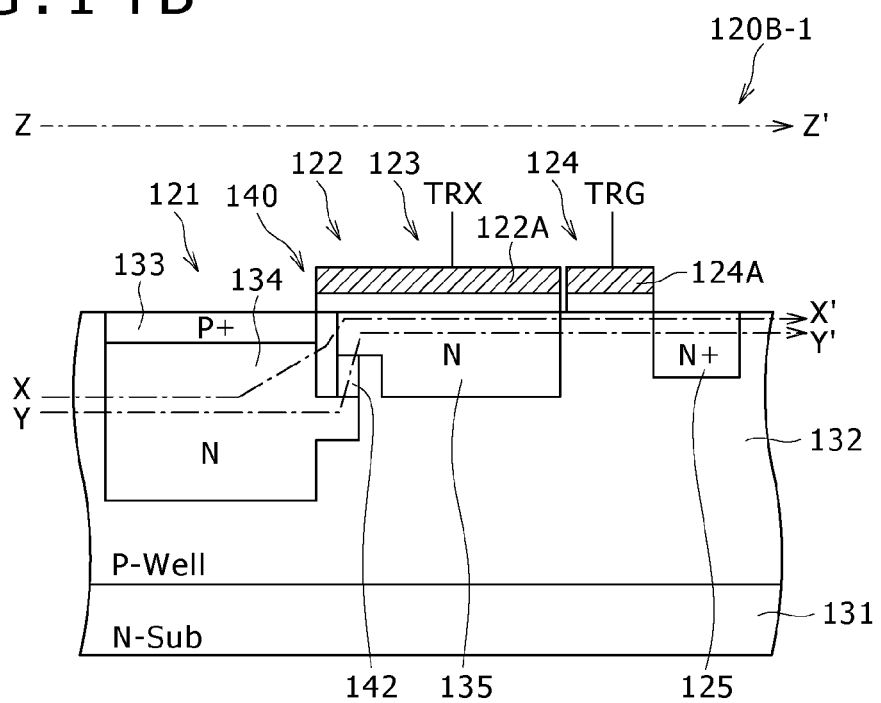

Now, a unit pixel 120B-1 which is a first modification of the unit pixel 120B according to the second embodiment will be described below, referring to FIGS. 14A and 14B. FIG. 14A is a plan view showing the configuration of the unit pixel 120B-1, and FIG. 14B is a sectional view of the unit pixel 120B-1 along line Z-Z of FIG. 14A. Incidentally, the potential states of the unit pixel 120B-1 along line X-X' and line Y-Y' of FIG. 14B are the same as the potential states of the unit pixel 120B shown in FIGS. 13A and 13B.

In the unit pixel 120B-1, an N-type buried layer 134 of a photodiode 121 and a buried channel 135 of a memory part 123 are so formed that a part of the N-type buried layer 134 and a part of the buried channel 135 overlap, in plan view, with each other in part in the width direction (the vertical direction of FIG. 12A) at a boundary portion between the photodiode 121 and the memory part 123.

Thus, in the unit pixel 120B-1, the overlapping region of the N-type buried layer 134 and the buried channel 135 is smaller than that in the unit pixel 120B shown in FIGS. 12A and 12B. With the overlapping region thus reduced in size, an impurity diffusion region 142 is formed to be small, whereby it is possible to restrain light electric charge from leaking into the memory part 123 due to a process in which incident light on the photodiode 121 enters the impurity diffusion region 142 of an intermediate transfer path 140.

[Third Embodiment]

Figure 15A:
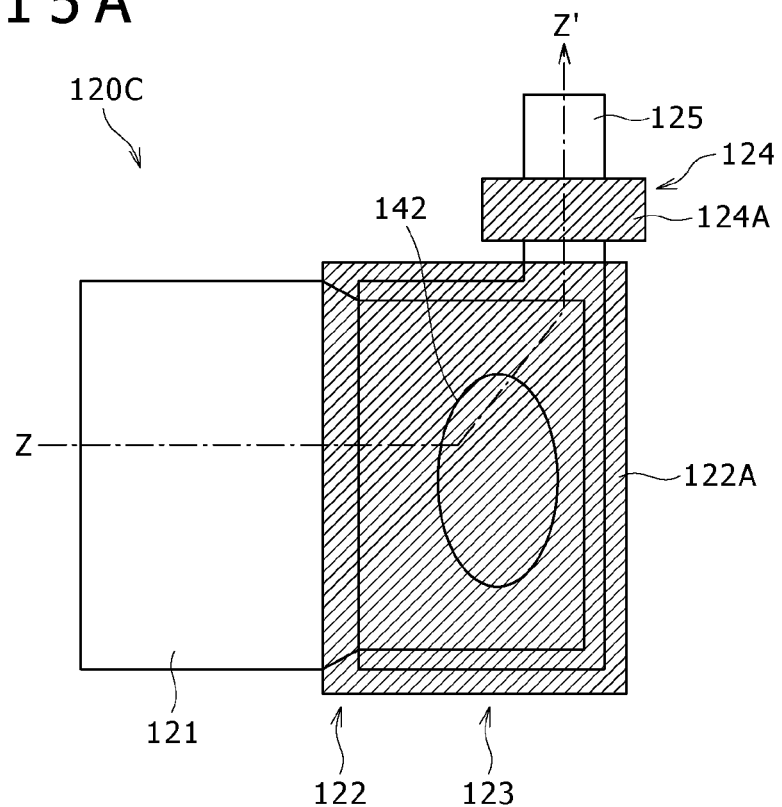
FIGS. 15A and 15B illustrate the configuration of a unit pixel which is a third embodiment.
Figure 15B:
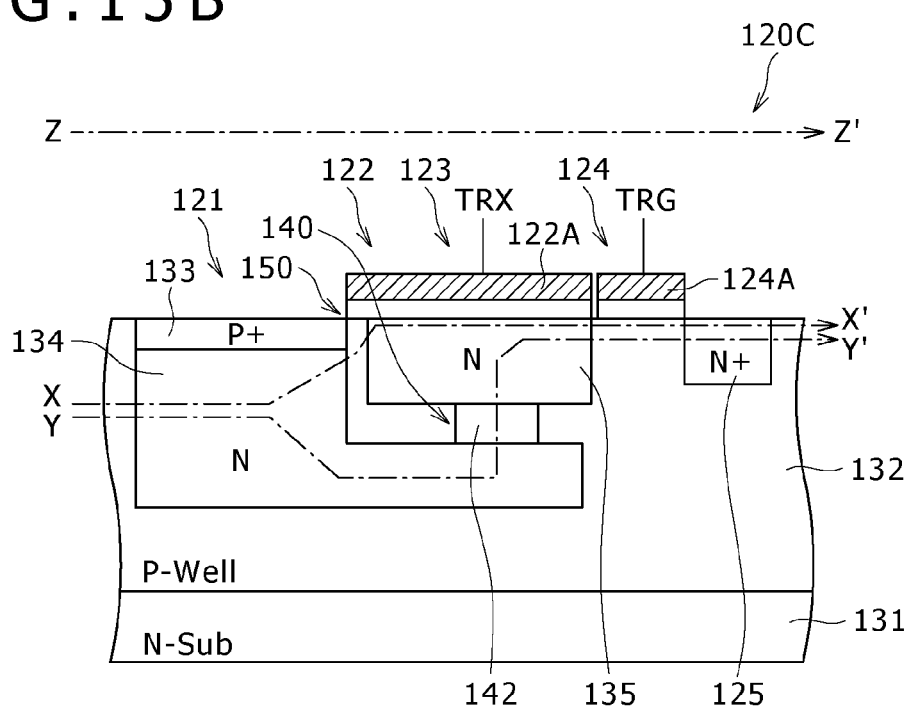

Now, a unit pixel 120C according to a third embodiment will be described below, referring to FIGS. 15A and 15B. FIG. 15A is a plan view showing the configuration of the unit pixel 120C, and FIG. 15B is a sectional view of the unit pixel 120C along line Z-Z' of FIG. 12A.

In the unit pixel 120C, an N-type buried layer 134 of a photodiode 121 is so formed as to extend to the lower side (the deep side in the substrate) of a part or the whole part of the memory part 123. Thus, the N-type buried layer 134 is formed to be L-shaped in the section shown in FIG. 15B. Besides, in the unit pixel 120C, an impurity diffusion region 142 is formed at a boundary portion between the lower surface of a buried channel 135 of the memory part 123 and the upper surface of the N-type buried layer 134 extending to the lower side of the memory part 123, whereby an intermediate transfer path 140 is provided.

With the impurity diffusion region 142 thus formed at the boundary portion between the lower surface of the buried channel 135 and the upper surface of the N-type buried layer 134, leakage of incident light into the impurity diffusion region 142 can be suppressed, as compared with the case where, for example, the impurity diffusion region 142 is formed at a boundary portion between a side surface of the buried channel 135 and a side surface of the N-type buried layer 134. In addition, the distance from the deepest potential portion of the photodiode 121 to the intermediate transfer path 140 is enlarged, so that modulation of the potential barrier depending on the amount of accumulated charge can be reduced.

Incidentally, the configuration in which the intermediate transfer path 140 is disposed near the center of the memory part 123 in plan view as shown in FIG. 15A is not limitative. Specifically, for example, the intermediate transfer path 140 may be disposed at a position remoter from the photodiode 121, or may be disposed to be remoter from the deepest potential portion of the photodiode 121, as compared with the disposition shown in the figure. With the intermediate transfer path 140 thus disposed at a position remote from the photodiode 121, leakage of incident light into the intermediate transfer path 140 can be further reduced.

[Method of Manufacturing Unit Pixel 120C]

Figure 16:
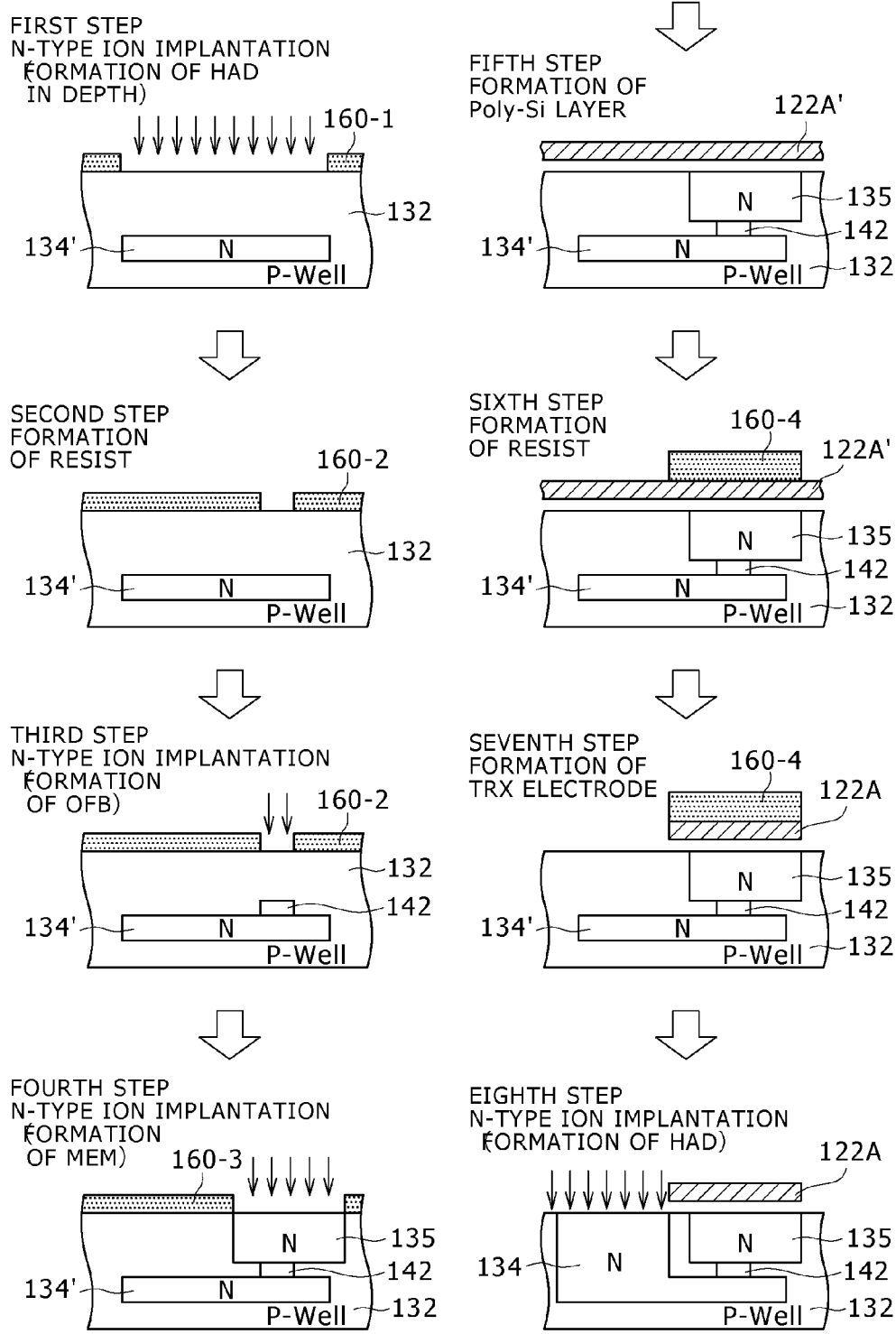
FIG. 16 illustrates a method of manufacturing the unit pixel.

Now, a method of manufacturing the unit pixel 120C will be described below referring to FIG. 16.

In a first step, N-type ion implantation is conducted using a resist 160-1 formed on a surface of a substrate, to form a part 134' of an N-type buried layer 134. The resist 160-1 is for forming the N-type buried layer 134 extended to the lower side of a buried channel 135, as shown in the sectional view of FIG. 15B, and its region corresponding to the part 134' of the N-type buried layer 134 is opened.

In a second step, a resist 160-2 is formed on the surface of the substrate. The resist 160-2 is for forming an impurity diffusion region 142, and its region corresponding to the impurity diffusion region 142 is opened.

In a third step, N-type ion implantation is conducted using the resist 160-2, to form the impurity diffusion region 142 in contact with the upper surface of the part 134' of the N-type buried layer 134.

In a fourth step, N-type ion implantation is carried out using a resist 160-3 formed on the surface of the substrate, to form a buried channel 135, whereby a memory part 123 is provided. The resist 160-3 is for forming the buried channel 135, and its region corresponding to the buried channel 135 is opened.

Next, after the resist 160-3 is removed, a fifth step is carried out in which a polysilicon layer 122A' to be a gate electrode 122A is formed on the substrate surface. In a sixth step, a resist 160-4 is formed on the surface of the polysilicon layer 122A' in an area corresponding to the gate electrode 122A. Then, in a seventh step, etching for removing the unrequired polysilicon layer 122A' is conducted, to form the gate electrode 122A.

In an eighth step, N-type ion implantation is performed, to form other part than the part 134' formed in the first step, whereby the N-type buried layer 134 is formed.

[First Modification of Third Embodiment]

Figure 17:
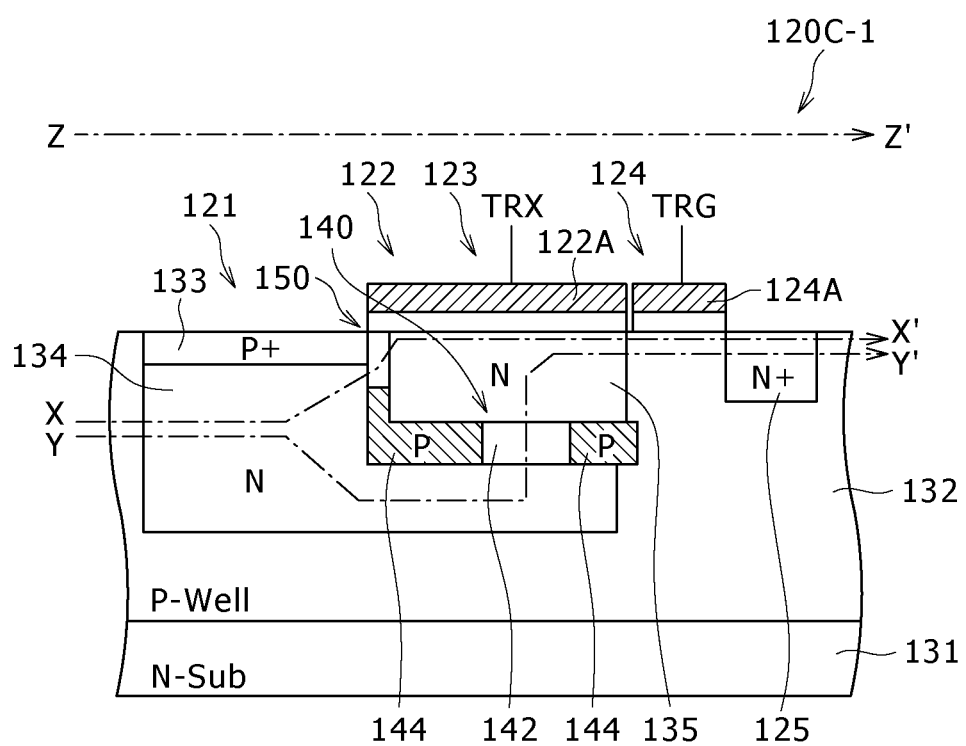
FIG. 17 illustrates the configuration of a first modification of the third embodiment.

Now, a unit pixel 120C-1 which is a first modification of the unit pixel 120C according to the third embodiment will be described below, referring to FIG. 17. FIG. 17 shows a configuration example of a section of the unit pixel 120C-1 corresponding to line Z-Z' of FIGS. 15A and 15B.

In the unit pixel 120C-1, an impurity diffusion region 144 higher in P-type impurity concentration than a P-type well layer 132 is formed at a boundary portion between a photodiode 121 and a memory part 123, other than the surface of the silicon substrate which is a complete transfer path 150 and an impurity diffusion region 142 which is an intermediate transfer path 140.

With such an impurity diffusion region 144 formed, it is possible to prevent diffusion of light electric charge. This makes it possible to restrain light electric charge in excess of a predetermined charge amount in the photodiode 121 from flowing to other part than the memory part, and to cause stable overflow of the light electric charge in excess of the predetermined charge amount. In addition, the light electric charge generated by light leakingly incident on the boundary portion between the photodiode 121 and the memory part 123, other than the intermediate transfer path 140 and the complete transfer path 150, can be restrained from diffusing into the surroundings.

[Second Modification of Third Embodiment]

Figure 18:
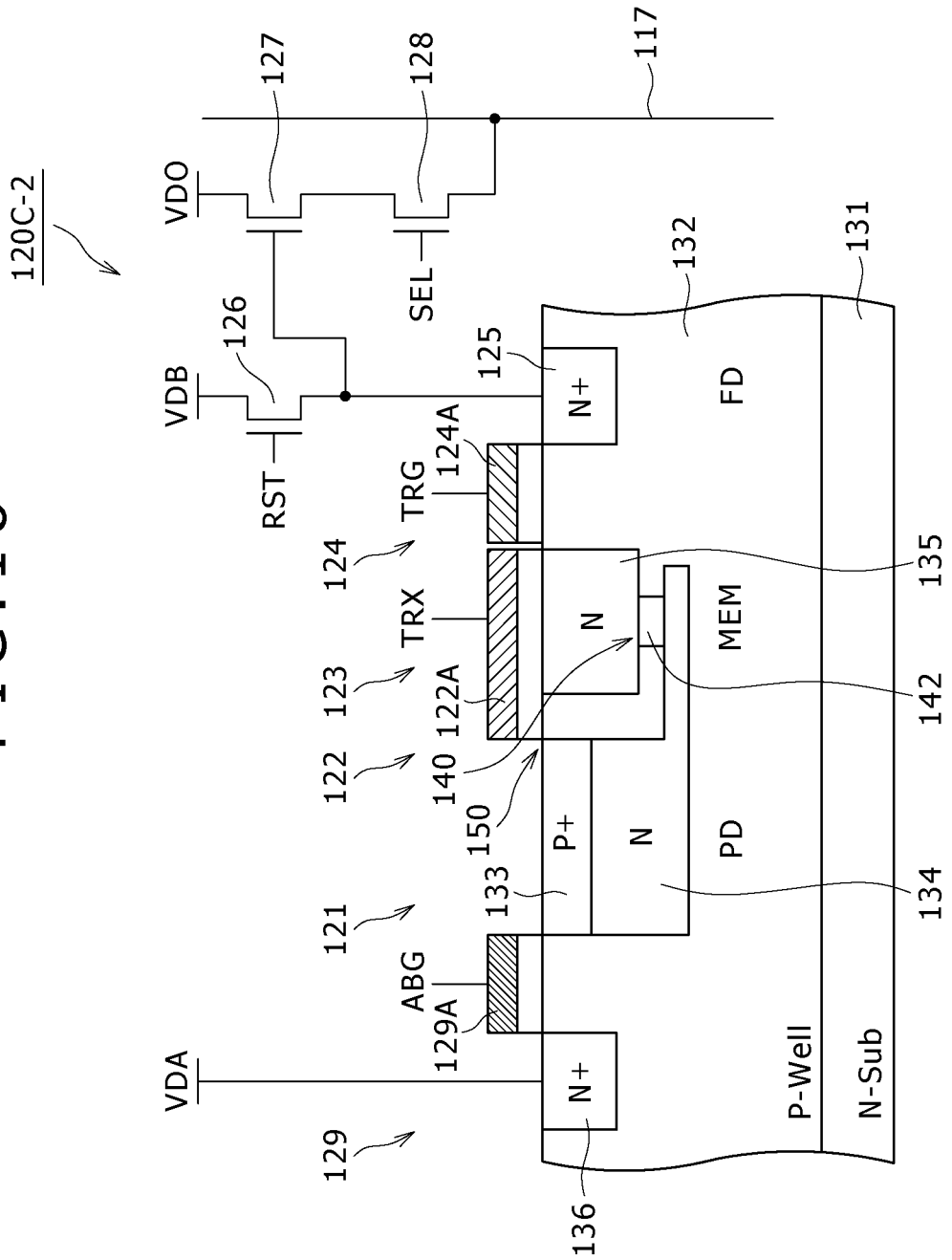
FIG. 18 illustrates the configuration of a second modification of the third embodiment.

Now, a sectional view of a unit pixel 120C-2 which is a second modification of the unit pixel 120C according to the third embodiment is shown in FIG. 18. As shown in FIG. 18, a reset transistor 126 for resetting an electric charge in a floating diffusion region 125 of the unit pixel 120C-2, an amplifying transistor 127 for reading out a signal charge, and a selecting transistor 128 for selecting the unit pixel 120C-2 are connected to the floating diffusion region 125. In addition, at a drain part 136 of the unit pixel 120C-2, there are provided an electric-charge discharging part 129 for discharging the electric charge in the photodiode 121 and a gate electrode 129A.

[Third Modification of Third Embodiment]

Figure 19:
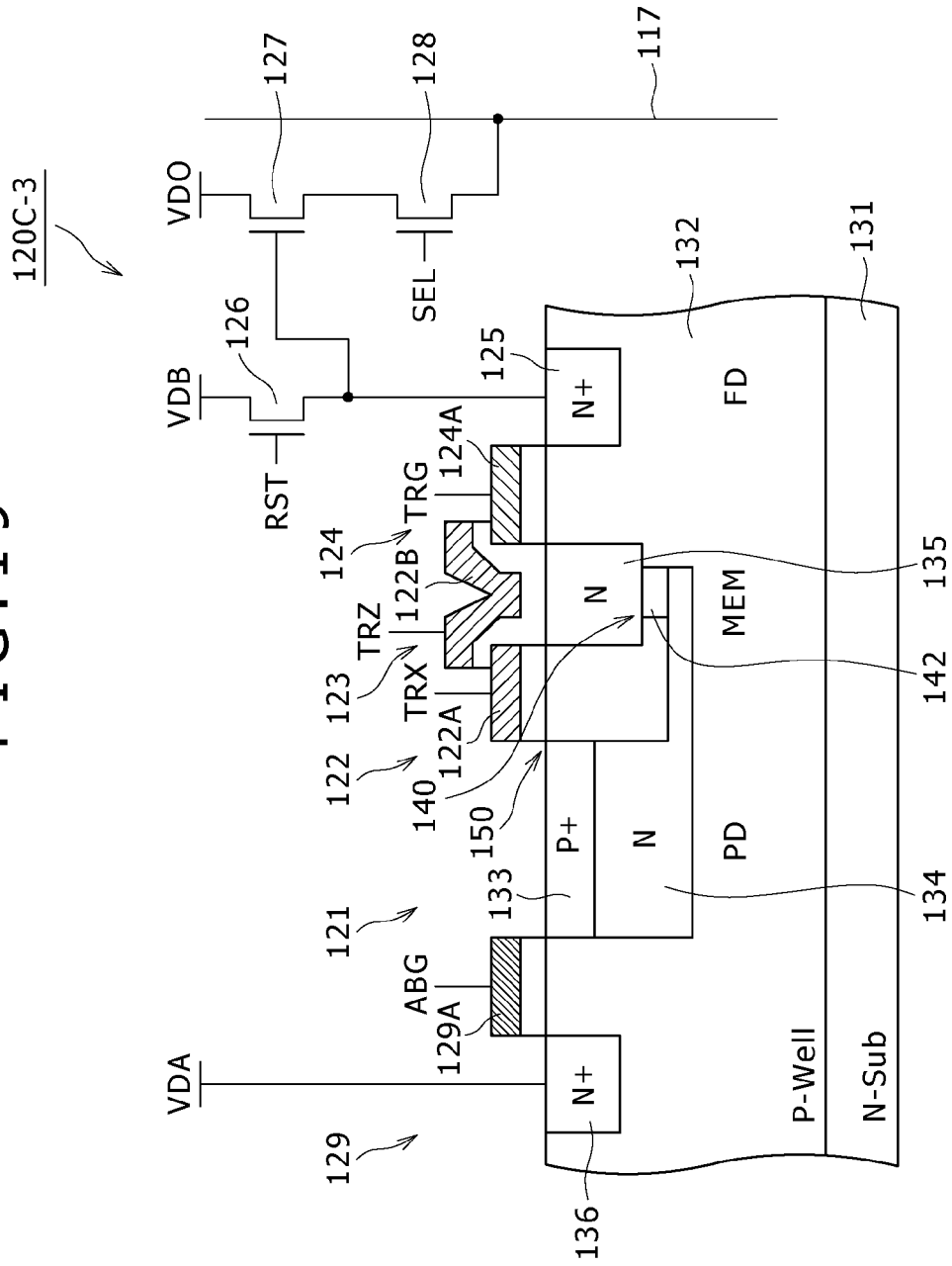
FIG. 19 illustrates the configuration of a third modification of the third embodiment.

Now, FIG. 19 shows a sectional view of a unit pixel 120C-3 which is a third modification of the unit pixel 120C according to the third embodiment. As shown in FIG. 19, the unit pixel 120C-3 is provided with a gate electrode 122B for modulating a memory part 123, separately from a gate electrode 122A of a first transfer gate 122. The unit pixel 120C-3 is so configured that the memory part 123 is modulated when a modulation pulse TRZ is impressed on the gate electrode 122B.

[Fourth Modification of Third Embodiment]

Figure 20:
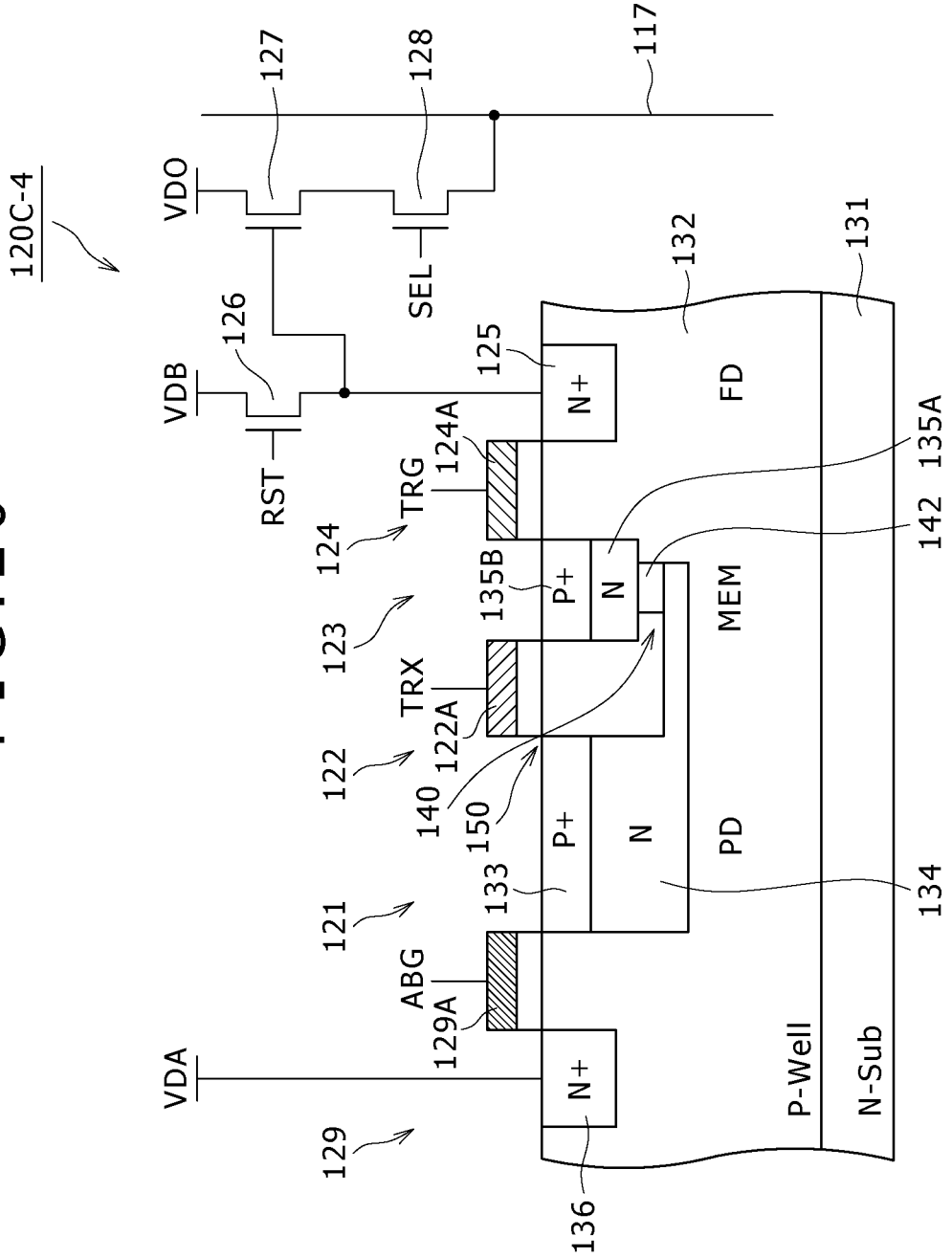
FIG. 20 illustrates the configuration of a fourth modification of the third embodiment.

Now, FIG. 20 shows a sectional view of a unit pixel 120C-4 which is a fourth modification of the unit pixel 120C according to the third embodiment. As shown in FIG. 20, in the unit pixel 120C-4, a memory part 123 has an N-type impurity diffusion region 135A formed in the inside of a silicon substrate, and an impurity diffusion layer 135B for inverting the substrate surface of the memory part 123 is formed on the surface of the impurity diffusion region 135A.

[Fifth Modification of Third Embodiment]

Figure 21:
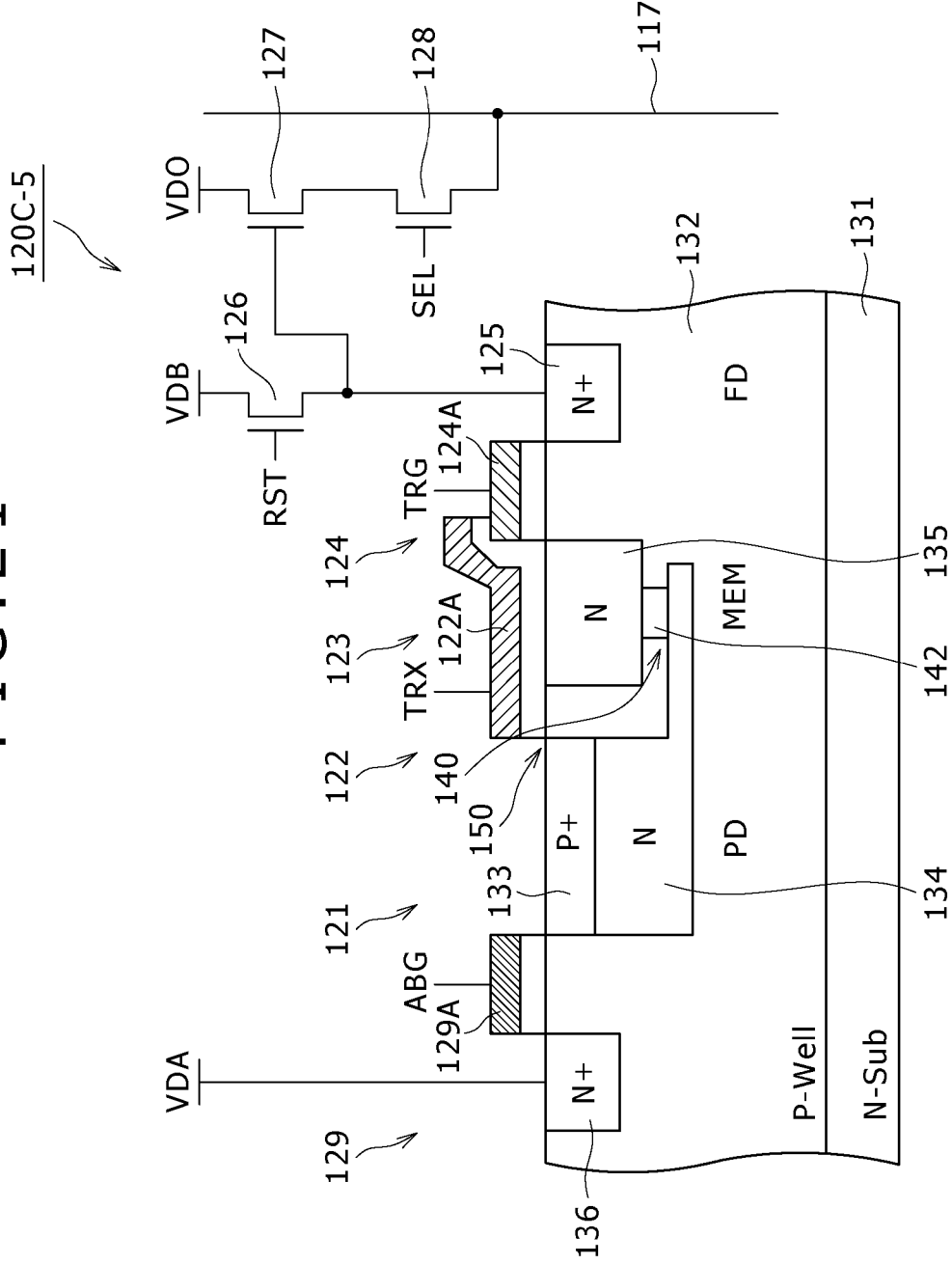
FIG. 21 illustrates the configuration of a fifth modification of the third embodiment.

Now, FIG. 21 shows a sectional view of a unit pixel 120C-5 which is a fifth modification of the unit pixel 120C according to the third embodiment. As shown in FIG. 21, in the unit pixel 120C-5, a gate electrode 122A of a first transfer gate 122 is composed of two polysilicon layers. Specifically, the gate electrode 122A of the first transfer gate 122 may be composed of the same electrode layer as a gate electrode 124A of a second transfer gate 124, namely, a single polysilicon layer, or may be composed of two polysilicon layers.

[Sixth Modification of Third Embodiment]

Figure 22:
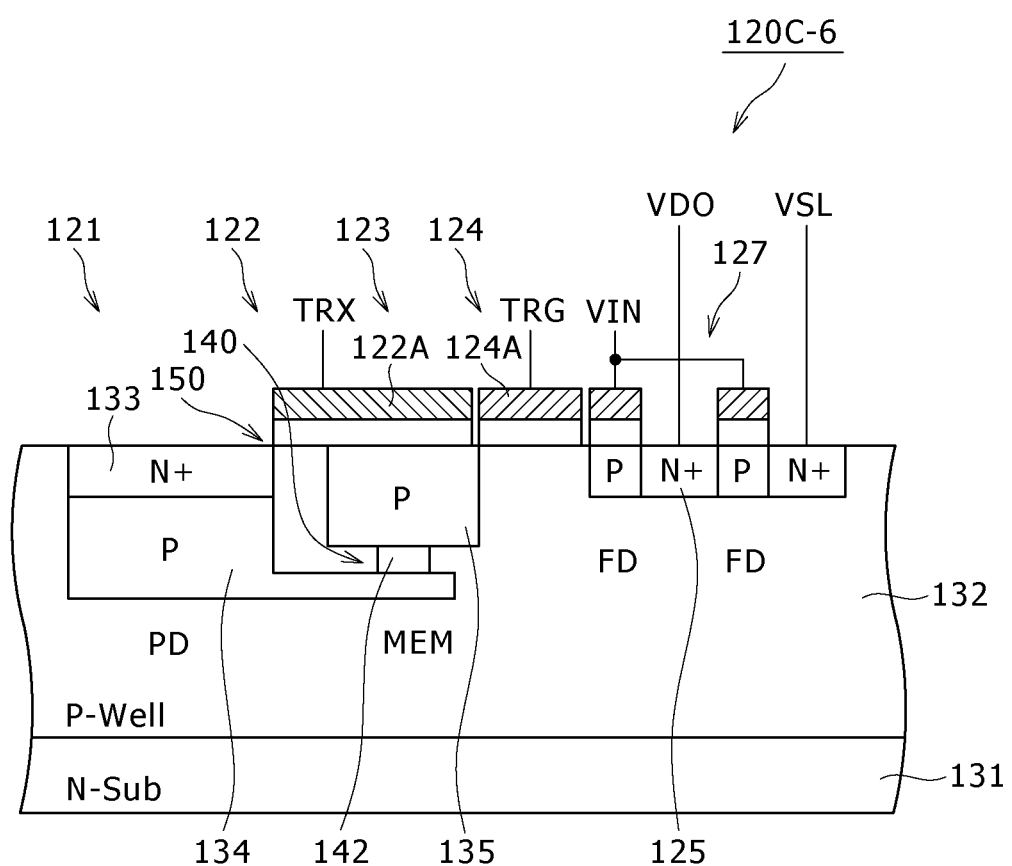
FIG. 22 illustrates the configuration of sixth modification of the third embodiment.

Now, FIG. 22 shows a sectional view of a unit pixel 120C-6 which is a sixth modification of the unit pixel 120C according to the third embodiment. As shown in FIG. 22, in the unit pixel 120C-6, a floating diffusion region 125 and an amplifying transistor 127 are configured by use of threshold modulation type elements.

[Fourth Embodiment]

Now, referring to FIG. 23 and FIGS. 24A and 24B, the configuration of a unit pixel 120D according to a fourth embodiment will be described below.

Figure 23:
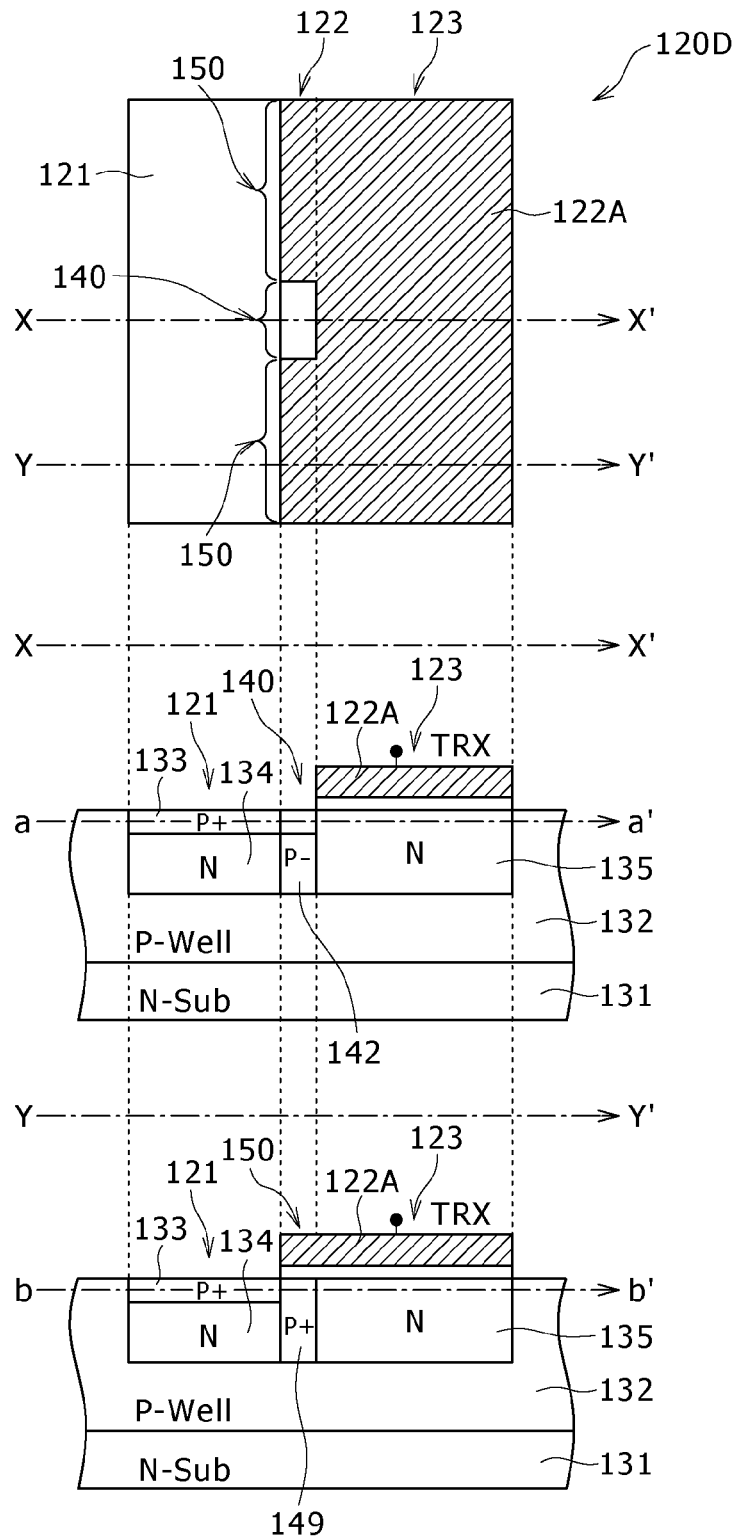
FIG. 23 illustrates the configuration of a unit pixel which is a fourth embodiment.
Figure 24A:
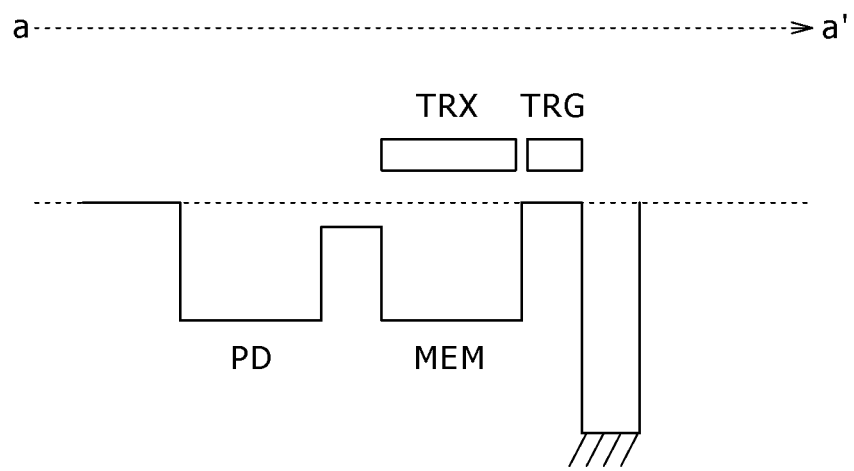
FIGS. 24A and 24B illustrate potential states of the unit pixel which is the fourth embodiment.
Figure 24B:
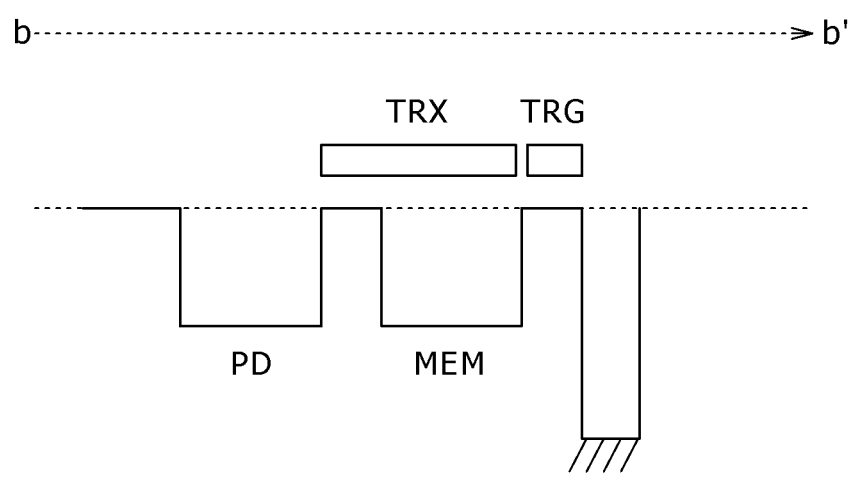

A plan view of the unit pixel 120D is shown on the upper side in FIG. 23, a sectional view of the unit pixel 120D along line X-X' of the plan view is shown on the lower side thereof, and a sectional view of the unit pixel 120D along line Y-Y' of the plan view is shown on the lower side thereof. Besides, FIG. 24A shows the potential state of the unit pixel 120D along line a-a' which passes through an intermediate transfer path 140, and FIG. 24B shows the potential state of the unit pixel 120D along line b-b' which passes through a complete transfer path 150.

In the unit pixel 120D, a side surface on the photodiode 121 side of a gate electrode 122A of a first transfer gate 122 is provided with a recess in a central portion thereof. Besides, in the unit pixel 120D, a part of the first transfer gate 122 corresponding to the recess functions as the intermediate transfer path 140, and the first transfer gate 122 corresponding to the other part than the recess functions as the complete transfer path 150. Thus, the unit pixel 120D has a structure in which the part where the intermediate transfer path 140 is formed and the part where the complete transfer path 150 is formed are different from each other.

In addition, as shown in the sectional view taken along line Y-Y', the first transfer gate 122 is provided with a $P^+$ impurity diffusion region 149 at its part other than the region corresponding to the recess in the gate electrode 122A. By thus providing the impurity diffusion region 149 which is high in P-type impurity concentration, it is possible to reduce scattering of potential barrier in the complete transfer path 150. With a transfer pulse TRX impressed on the gate electrode 122A, the potential of the complete transfer path 150 is changed, and the electric charge accumulated in the photodiode 121 is transferred into a memory part 123.

In addition, as shown in the sectional view taken along line X-X', the intermediate transfer path 140 is configured by forming a $P^-$ impurity diffusion region 142 in a region corresponding to the recess in the gate electrode 122A. This ensures that the electric charge in excess of a predetermined charge amount in the photodiode 121 is caused to flow over through the impurity diffusion region 142 as the intermediate transfer path 140. Besides, since the impurity diffusion region 142 is not covered with the gate electrode 122A, a potential barrier in the intermediate transfer path 140 remains unchanged even upon application of a transfer pulse TRX on the gate electrode 122A.

In addition, the impurity diffusion region 142 of the intermediate transfer path 140 can be formed, for example, by a method in which the gate electrode 122A of the first transfer gate 122 is formed with the recess, ions of As (arsenic) or P (phosphorus) are implanted into an exposed region at the recess to strike back B (boron) in the region, whereby the impurity concentration in the region is made to be partly $P^-$. Incidentally, the impurity concentration in the impurity diffusion region 142 may be $N^-$. Where such a manufacturing method is adopted, the impurity diffusion region 142 can be formed by only changing the mask for the gate electrode 122A and appropriately changing the impurity concentration and energy in ion implantation for providing the impurity diffusion region 142, as compared with the manufacturing method according to the related art. In other words, the process changes from the manufacturing method according to the related art can be small, and scattering of the potential barrier arising from scattering of the resist aperture size or from mask misalignment or the like can be suppressed.

[Method of Manufacturing Unit Pixel 120D]

Now, referring to FIGS. 25A to 26D, a method of manufacturing the unit pixel 120D will be described below. Incidentally, in FIGS. 26A to 26D, sectional views of the unit pixel 120D along line Y-Y' of the plan view in FIG. 23 are presented on the left side, while sectional views of the unit pixel 120D along line X-X' of the plan view in FIG. 23 are presented on the right side.

Figure 25A:
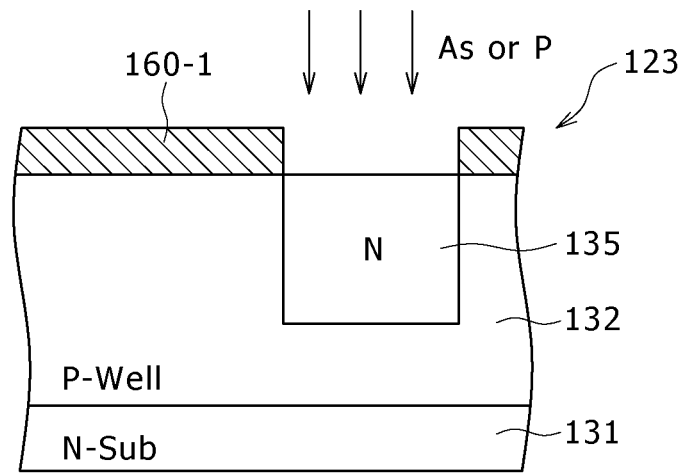
FIGS. 25A and 25B illustrate a method of manufacturing the unit pixel.

In a first step, as shown in FIG. 25A, a resist 160-1 having an opening in a region corresponding to a memory part 123 is formed on the surface of a P-type well layer 132, followed by As or P ion implantation, to form a buried channel 135.

Figure 25B:
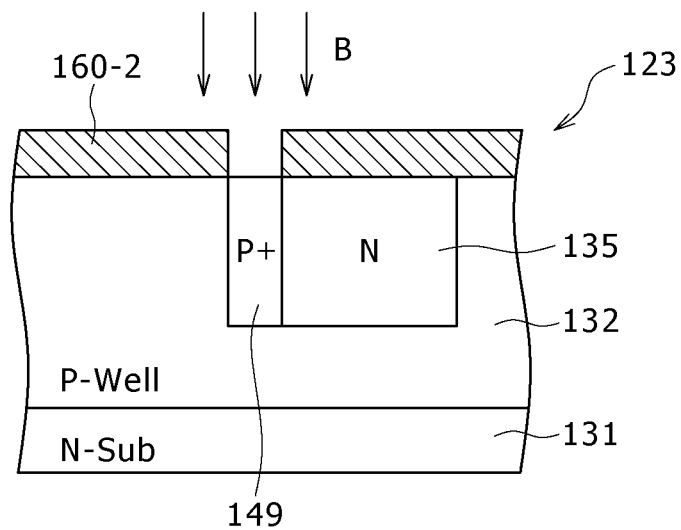

In a second step, as shown in FIG. 25B, a resist 160-2 having an opening in a region corresponding to a first transfer gate 122 is formed on the surface of the P-type well layer 132, followed by B ion implantation, to form a $P^+$ impurity diffusion region 149. Incidentally, a part in the center of the impurity diffusion region 149 formed in this step is a region to be turned into an impurity diffusion region 142 upon a later step. Besides, with the impurity diffusion region 149 made to be of the $P^+$ type, scattering of potential barrier due to scattering of resist aperture size can be reduced.

Figure 26A:
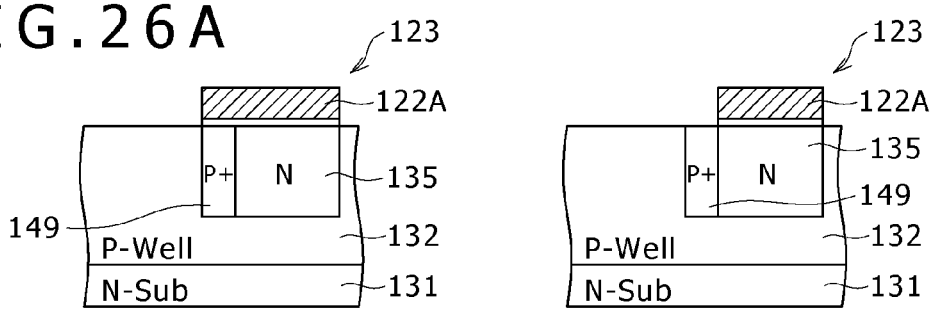
FIGS. 26A to 26D illustrate the method of manufacturing the unit pixel.
Figure 26B:
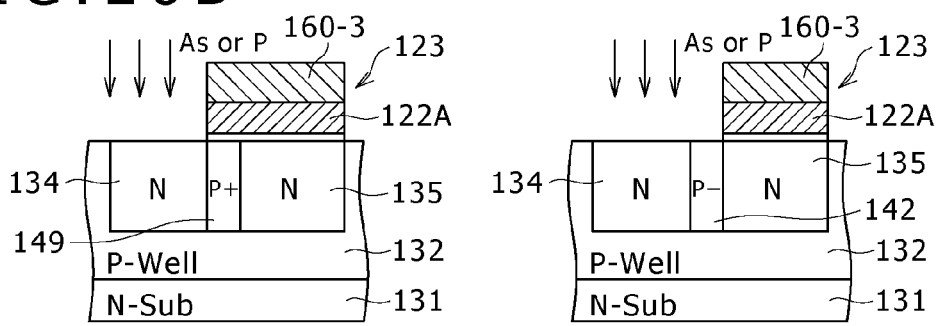

In a third step, as shown in FIG. 26A, polysilicon (Poly-Si) to be a gate electrode 122A is built up through an oxide film ($SiO_2$) deposited on the substrate surface at a memory part 123, followed by processing such as to form a recess as shown in the plan view of FIG. 23. As a result, a part of the impurity diffusion region 149 is exposed at the substrate surface correspondingly to the recess in the gate electrode 122A.

In a fourth step, a resist 163-3 is formed, and As or P ion implantation is conducted so as to form a photodiode 121. In this instance, the region where the photodiode 121 is to be formed is made to be N type; besides, in the region corresponding to the recess in the gate electrode 122A, the impurity in that part of the impurity diffusion region 149 which is exposed to the surface is struck back by As or P, whereby the part is made to be $P^-$ (or $N^-$) type, and an impurity diffusion region 142 is formed. The peak concentration in the ion implantation in this case can be controlled with an accuracy of several nanometers. Therefore, it is possible to form a potential barrier with less scattering, as compared with the case of control of mask misalignment.

Figure 26C:
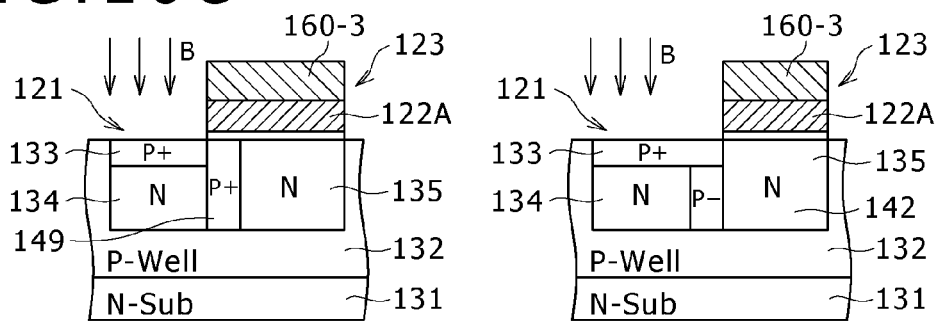
Figure 26D:
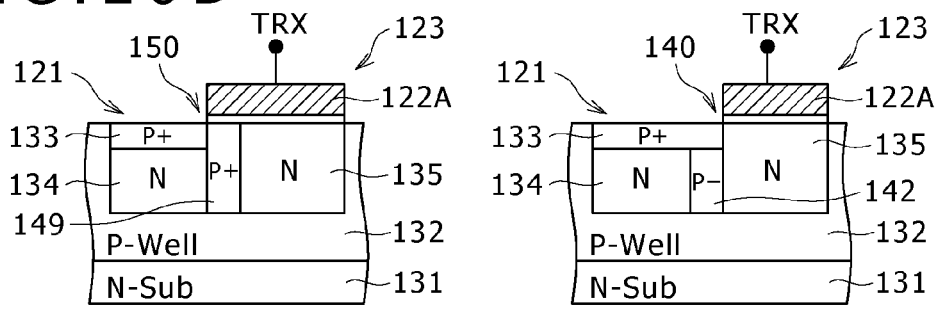

In a fifth step, as shown in FIG. 26C, B ion implantation into the vicinity of the substrate surface is conducted, to form a P-type layer 133 ($P^+$). Consequently, the photodiode 121 as a HAD (hole accumulation diode) sensor is fabricated.

In a sixth step, the resist 163-3 is peeled away, and a wiring is connected to the gate electrode 122A, to complete the structure of the unit pixel 120D.

Here, where the P-type impurity concentration in the P-type well layer 132 is $10^{16}$ $cm^{-3}$, for example, the photodiode 121 and the memory part 123 are formed to have such an N-type impurity concentration that a depletion state is obtained upon discharging of electric charge, for example, $10^{16}$ to $10^{17}$ $cm^{-3}$.

[First Modification of Fourth Embodiment]

Figure 27:
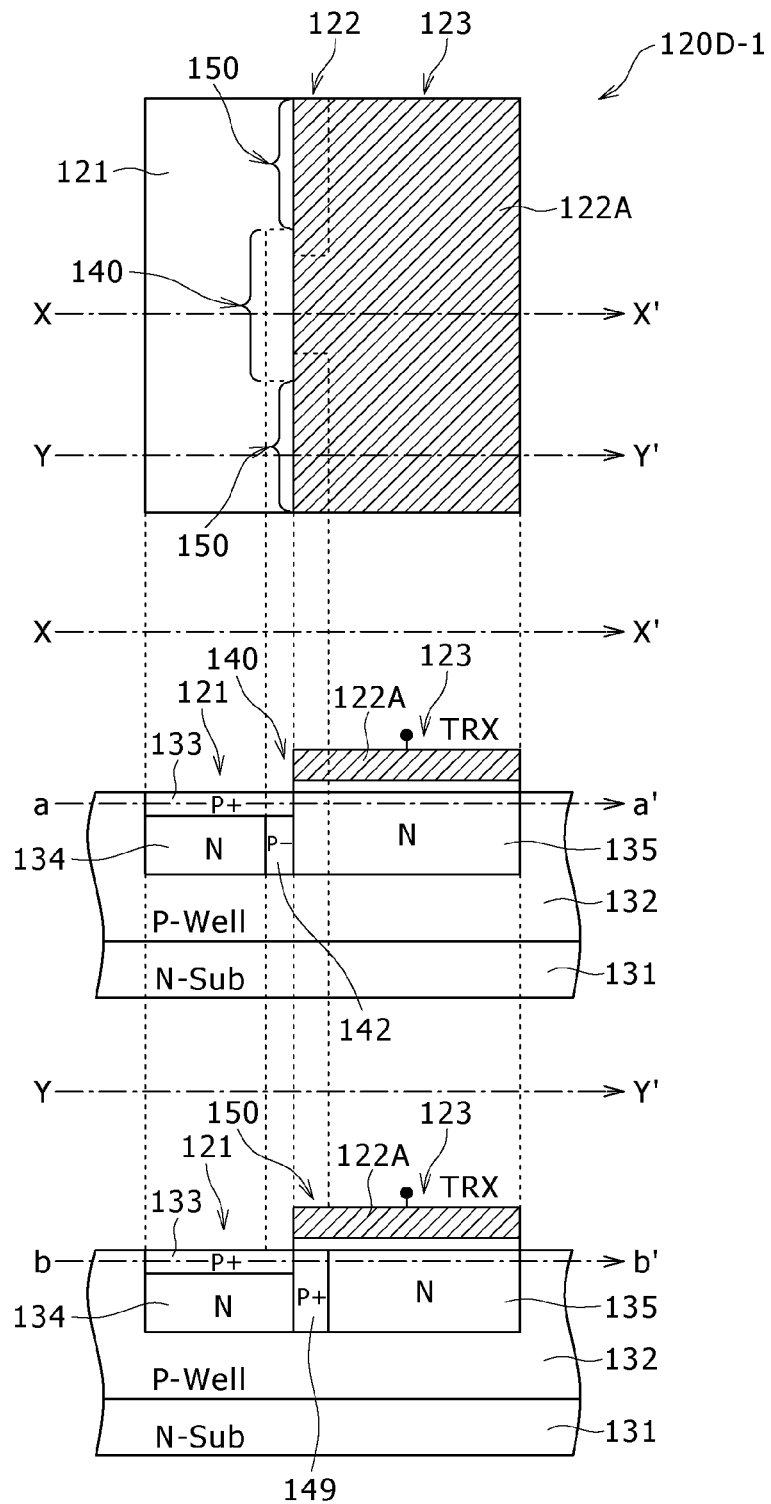
FIG. 27 illustrates the configuration of a first modification of the fourth embodiment.

Now, referring to FIG. 27, the configuration of a unit pixel 120D-1 which is a first modification of the unit pixel 120D according to the fourth embodiment will be described below. A plan view of the unit pixel 120D-1 is shown on the upper side in FIG. 27, a sectional view of the unit pixel 120D-1 along line X-X' shown in the plan view is shown on the lower side thereof, and a sectional view of the unit pixel 120D-1 along line Y-Y' shown in the plan view is shown on the lower side thereof.

In the unit pixel 120D-1, unlike in the unit pixel 120D of FIG. 23, a side surface on the photodiode 121 side of a gate electrode 122A of a first transfer gate 122 is formed to be straight. Besides, in the unit pixel 120D-1, a part in the center of the first transfer gate 122 is formed to project toward the photodiode 121 side, and that part which is projecting toward the photodiode 121 side and which is not covered with the gate electrode 122A functions as an intermediate transfer path 140.

Besides, in the unit pixel 120D-1, that part of the first transfer gate 122 which is other than the intermediate transfer path 140 (that part which is covered with the gate electrode 122A) functions as a complete transfer path 150. At the complete transfer path 150, a P⁺impurity diffusion region 149 is formed, like in the unit pixel 120D of FIG. 23. Incidentally, the potential states of the unit pixel 120D-1 along line a-a' and line b-b' of the sectional view in FIG. 27 are the same as the potential states of the unit pixel 120D shown in FIGS. 24A and 24B.

[Method of Manufacturing Unit Pixel 120D-1]

Now, referring to FIGS. 28A to 29C, a method of manufacturing the unit pixel 120D-1 will be described below. Incidentally, in FIGS. 28A to 29C, sectional views taken along line Y-Y' of the plan view in FIG. 27 are presented on the left side, while sectional views along line X-X' of the plan view in FIG. 27 are presented on the right side.

Figure 28A:
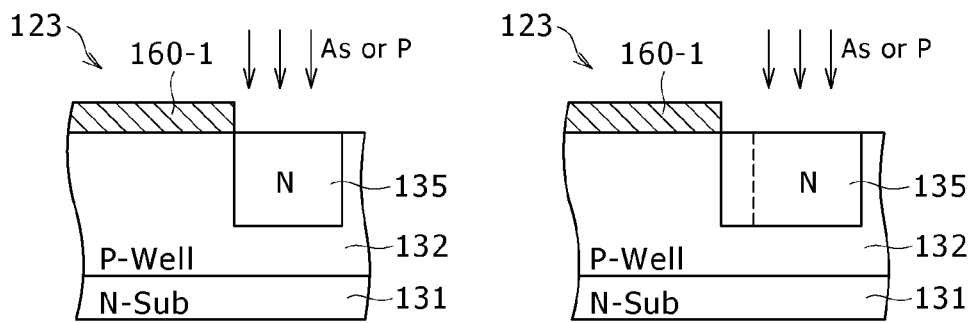
FIGS. 28A to 28C illustrate a method of manufacturing the unit pixel.

In a first step, as shown in FIG. 28A, a resist 160-1 with an opening in a region corresponding to a memory part 123 is formed on the surface of a P-type well layer 132, followed by As or P ion implantation, to form a buried channel 135. In this instance, the resist 160-1 is formed to have a recess at the region corresponding to an intermediate transfer path 140 as shown in the plan view of FIG. 27. In the first step, therefore, the buried channel 135 is formed to have a projected part (the region to be the intermediate transfer path 140 upon a later step) which is projected toward the side of formation of a photodiode 121.

Figure 28B:
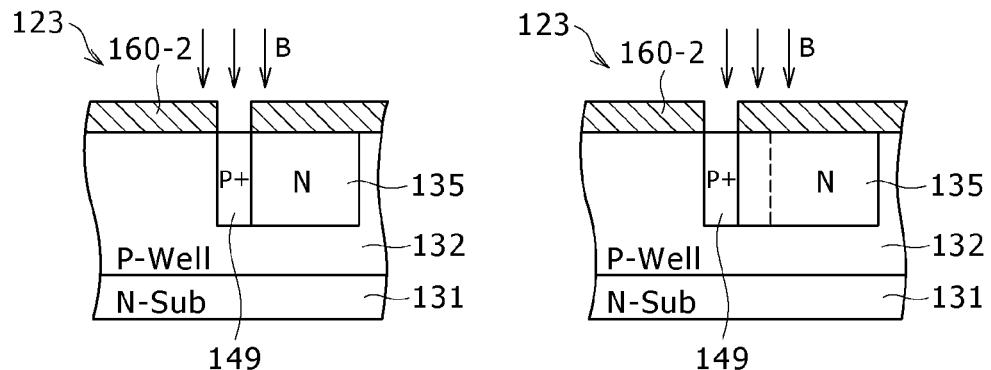

In a second step, as shown in FIG. 28B, a resist 160-2 with an opening in a region corresponding to a first transfer gate 122 is formed on the surface of the P-type well layer 132, followed by B ion implantation, to form a P⁺ impurity diffusion region 149. Incidentally, a part in the center of the impurity diffusion region 149 formed in this step is a region to be an impurity diffusion region 142 upon a later step, and the region is projected to the side of formation of the photodiode 121 and recessed to the side of the buried channel 135, as shown in the plan view of FIG. 27.

Figure 28C:
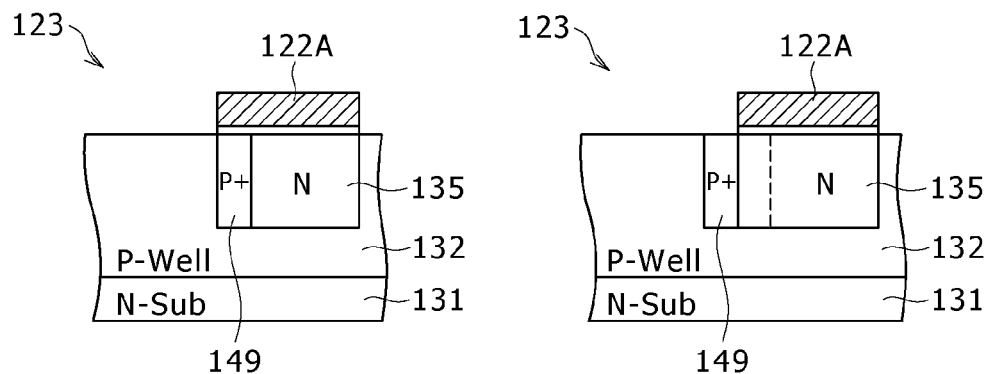

In a third step, as shown in FIG. 28C, polysilicon (Poly-Si) to be a gate electrode 122A is built up through an oxide film (SiO₂) deposited on the substrate surface at a memory part 123. In this instance, the gate electrode 122A is so formed as to cover the region to be a complete transfer path 150 and not to cover the region to be the intermediate transfer path 140.

Figure 29A:
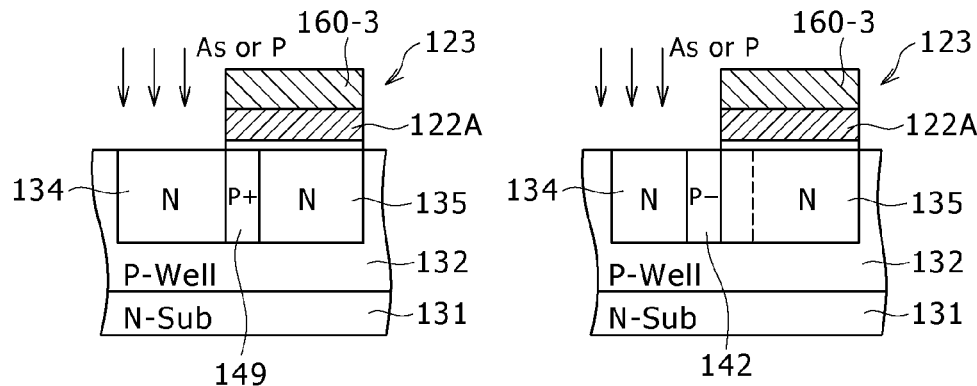
FIGS. 29A to 29C illustrate the method of manufacturing the unit pixel.

In a fourth step, as shown in FIG. 29A, a resist 160-3 is formed, and As or P ion implantation is conducted so as to produce the photodiode 121. In this instance, the region where the photodiode 121 is formed becomes N type; besides, in a part in the center of the impurity diffusion region 149 is formed to be projected to the photodiode 121 side, the impurity is struck back by As or P so as to be P⁻ (or N⁻) type, whereby the impurity diffusion region 142 is formed. Since the peak concentration in the ion implantation in this case can be controlled with several nanometers, it is possible to form a potential barrier with less scattering, as compared with the case of control of mask alignment.

Figure 29B:
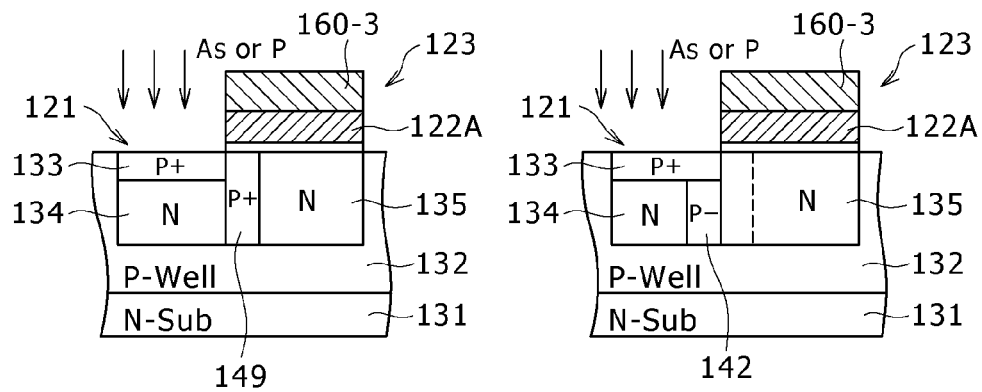
Figure 29C:
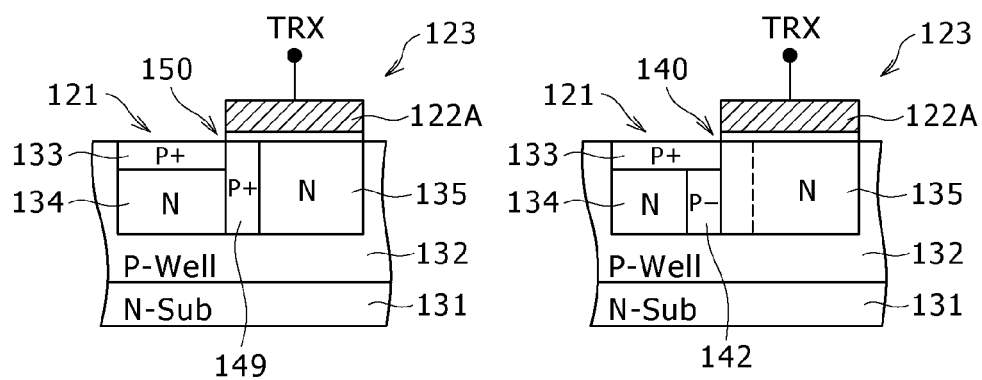

In a fifth step, as shown in FIG. 29B, B ion implantation into the vicinity of the substrate surface is conducted, to form a P-type layer 133 (P⁺). As a result, the photodiode 121 as a HAD sensor is fabricated.

In a sixth step, the resist 160-3 is peeled away, and a wiring is connected to the gate electrode 122A, to complete the structure of the unit pixel 120D-1.

Thus, the impurity in a part of the region having been subjected to ion implantation for the complete transfer path 150 is struck back to form the intermediate transfer path 140, whereby the potential barrier determining the predetermined charge amount relevant of outflow of accumulated charge in the photodiode 121 into the memory part 123 can be formed stably.

[Fifth Embodiment]

Figure 30A:
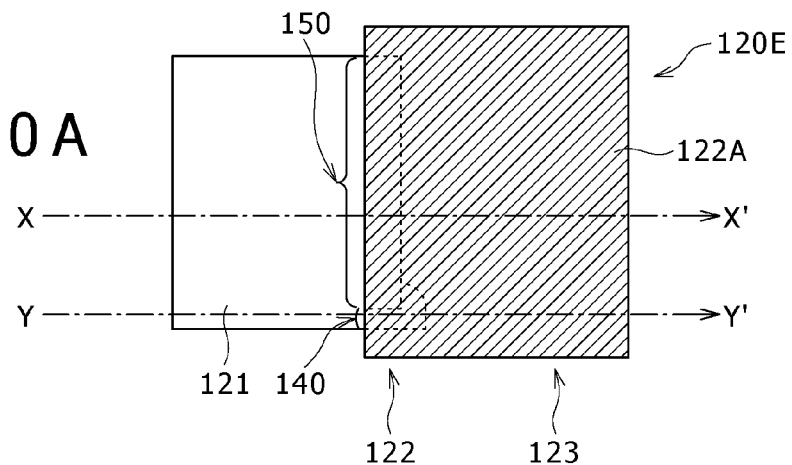
FIGS. 30A to 30C illustrate the configuration of a unit pixel which is a fifth embodiment.

Now, referring to FIGS. 30A to 30C, the configuration of a unit pixel 120E according to a fifth embodiment will be described below. FIG. 30A shows a plan view of the unit pixel 120E, FIG. 30B shows a sectional view of the unit pixel 120E along line X-X' in the plan view, and FIG. 30C shows a sectional view of the unit pixel 120E along line Y-Y' in the plan view.

Figure 30B:
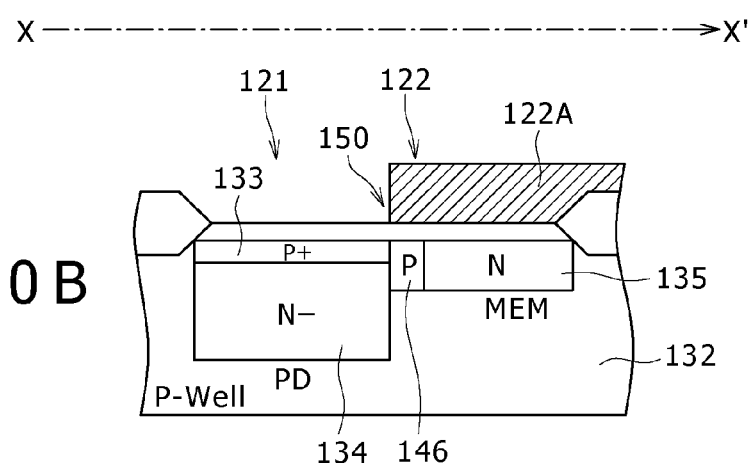
Figure 30C:
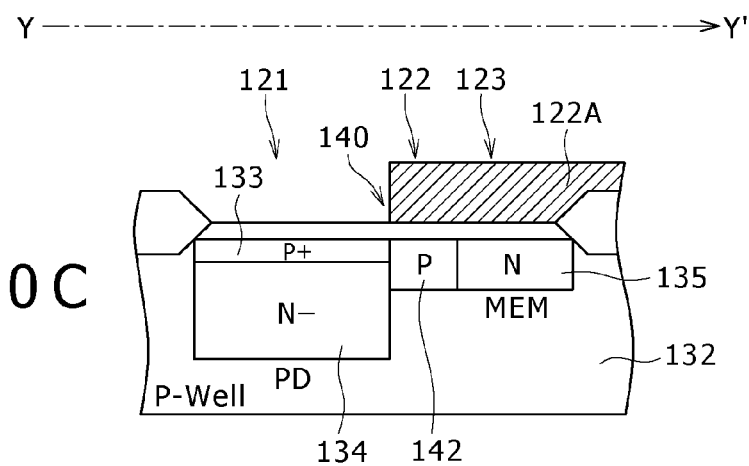

As shown in FIGS. 30A to 30C, in the unit pixel 120E, an intermediate transfer path 140 and a complete transfer path 150 are separated from each other in the channel width direction of a first transfer gate 122, and the intermediate transfer path 140 is formed at an end of the channel width.

Besides, in the unit pixel 120E, an impurity diffusion region 142 to be the intermediate transfer path 140 and an impurity diffusion region 146 to be the complete transfer path 150 are so formed that the effective channel length of the intermediate transfer path 140 is greater than the effective channel length of the complete transfer path 150 and that the effective channel width of the intermediate transfer path 140 is smaller than the effective channel width of the complete transfer path 150.

In the unit pixel 120E, the impurity concentration in the impurity diffusion region 146 is so controlled that the potential barrier of the complete transfer path 150 is high enough to ensure that, while overflow of electric charge accumulated in the photodiode 121 into the memory part 123 through the intermediate transfer path 140 occurs, such an overflow does not occur in the complete transfer path 150. For example, as for impurity concentrations in the unit pixel 120E, the following setting is adopted. A P-type well layer 132 has an acceptor concentration of $10^{15}$ cm⁻³. A photodiode 121 and a memory part 123 which have donor concentrations of $10^{16}$ to $10^{18}$ cm⁻³ and the intermediate transfer path 140 and the complete transfer path 150 which have acceptor concentrations of $10^{16}$ to $10^{18}$ cm⁻³ are formed in the P-type well layer 132, wherein the acceptor concentration of the complete transfer path 150 is higher than that of the intermediate transfer path 140.

[First Modification of Fifth Embodiment]

Figure 31A:
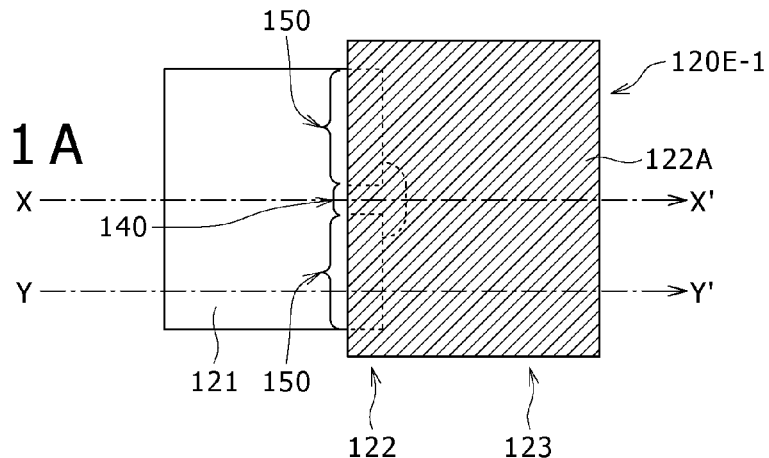
FIGS. 31A to 31C illustrate the configuration of a first modification of a fifth embodiment.

Now, referring to FIGS. 31A to 31C, the configuration of a unit pixel 120E-1 which is a first modification of the unit pixel 120E according to the fifth embodiment will be described below. FIG. 31A shows a plan view of the unit pixel 120E-1 and FIGS. 31B and 31C show sectional views of the unit pixel 120E-1, like FIGS. 30A to 30C.

Figure 31B:
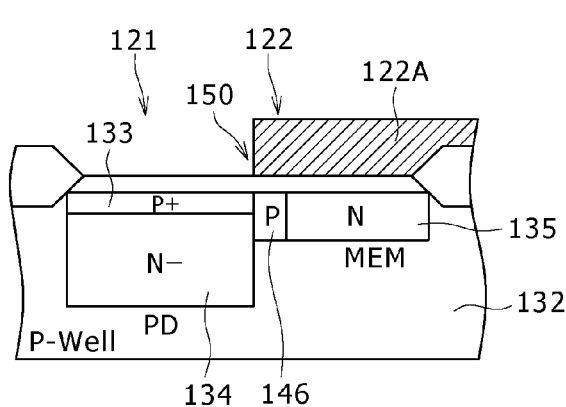
Figure 31C:
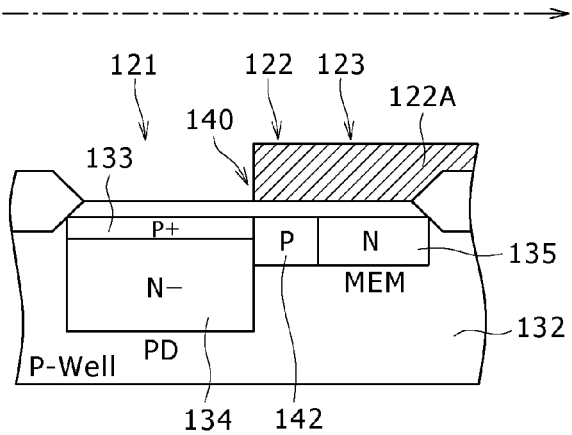

As shown in FIGS. 31A to 31C, in the unit pixel 120E-1, an intermediate transfer path 140 and a complete transfer path 150 are separated from each other in the channel width direction of a first transfer gate 122. Specifically, the intermediate transfer path 140 is formed in the center of the channel width, while the complete transfer path 150 is formed on both sides of the intermediate transfer path 140. The relations in effective channel length, effective channel width, and channel concentration between the intermediate transfer path 140 and the complete transfer path 150 in the unit pixel 120E-1 are the same as those in the unit pixel 120E shown in FIGS. 30A to 30C.

Thus, in the pixel unit 120E-1, the intermediate transfer path 140 is formed in the center of the channel width. This configuration results in that the areas of the photodiode 121 and the memory part 123 are smaller, as compared with those in the unit pixel 120E. However, this configuration makes it possible to reduce scattering of characteristics arising from scattering of alignment in lithography for forming the intermediate transfer path 140.

[Second and Third Modifications of Fifth Embodiment]

Figure 32A:
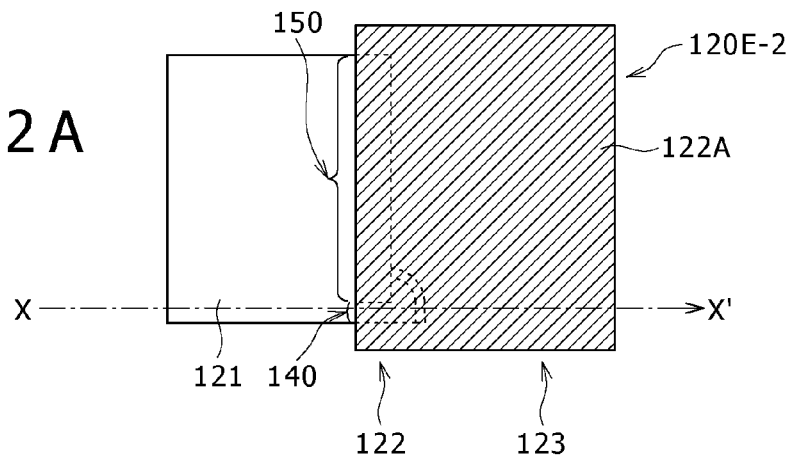
FIGS. 32A to 32C illustrate the configurations of a second modification and a third modification of the fifth embodiment.
Figure 32B:
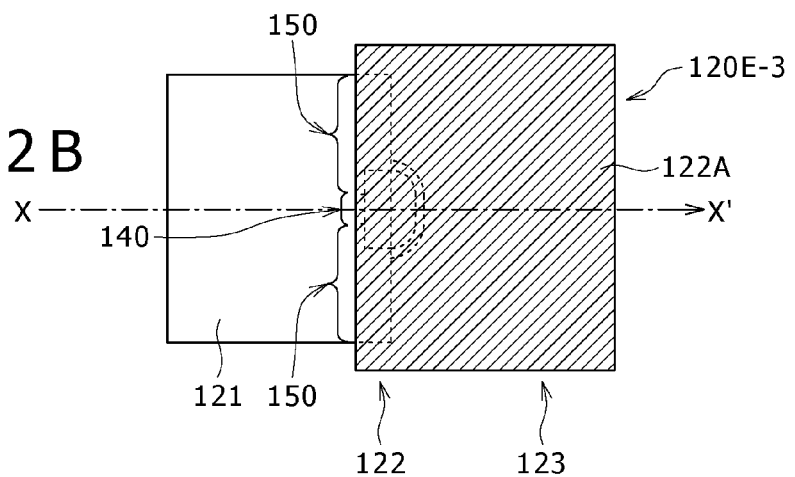
Figure 32C:
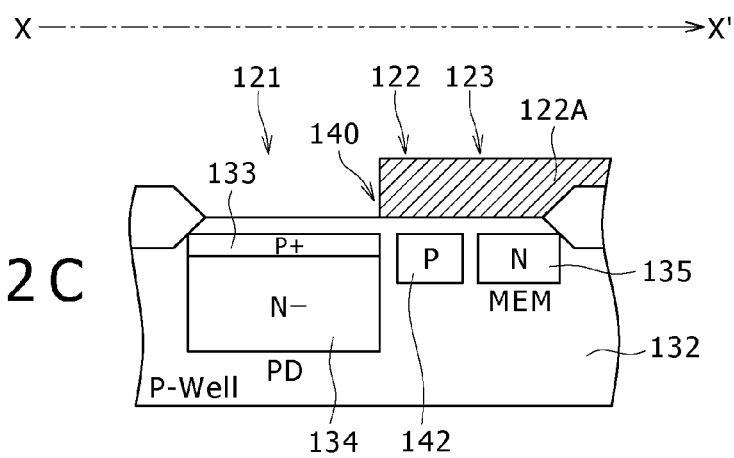

Now, referring to FIGS. 32A to 32C, the configuration of a unit pixel 120E-2 which is a second modification of the unit pixel 120E according to the fifth embodiment and the configuration of a unit pixel 120E-3 which is a third modification of the unit pixel 120E will be described below. FIG. 32A shows a plan view of the unit pixel 120E-2, and FIG. 32B shows a plan view of the unit pixel 120E-3. In addition, the unit pixel 120E-2 and the unit pixel 120E-3 are the same in sectional shape along line X-X' in the plan views thereof, and, in view of this, FIG. 32C shows a sectional view relevant to the same sectional shape.

As shown in FIGS. 32A and 32B, in the unit pixel 120E-2 and the unit pixel 120E-3, a complete transfer path 150 is in contact with a memory part 123 at the boundary therebetween and is in contact with a photodiode 121 at the boundary therebetween, like in the unit pixel 120E. On the other hand, in the unit pixel 120E-2 and the unit pixel 120E-3, a gap is provided at the boundary between an intermediate transfer path 140 and the memory part 123 and at the boundary between the intermediate transfer path 140 and the photodiode 121. The gap region is lower in acceptor concentration than an impurity diffusion region 142 adjacent thereto, and is lower in donor concentration than the photodiode 121 and the memory part 123. For example, the gap region is set to the same concentrations as a P-type well layer 132.

In addition, in regard of the intermediate transfer path 140 and the complete transfer path 150 in each of the unit pixel 120E-2 and the unit pixel 120E-3, the relations in effective channel length, effective channel width, and channel concentration are the same as in the unit pixel 120E of FIGS. 30A to 30C. In the unit pixel 120E-2 and the unit pixel 120E-3 thus configured, the areas of the photodiode 121 and the memory part 123 are reduced but the scattering of characteristics due to scattering of alignment in lithography for forming the intermediate transfer path 140 is further reduced, as compared with the unit pixel 120E and the unit pixel 120E-1 and the like.

[Fourth and Fifth Modifications of Fifth Embodiment]

Figure 33A:
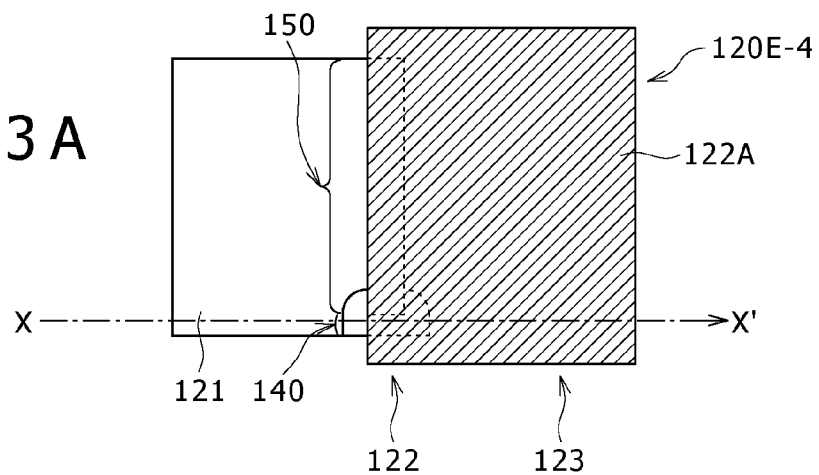
FIGS. 33A to 33C illustrate the configurations of a fourth modification and a fifth modification of the fifth embodiment.
Figure 33B:
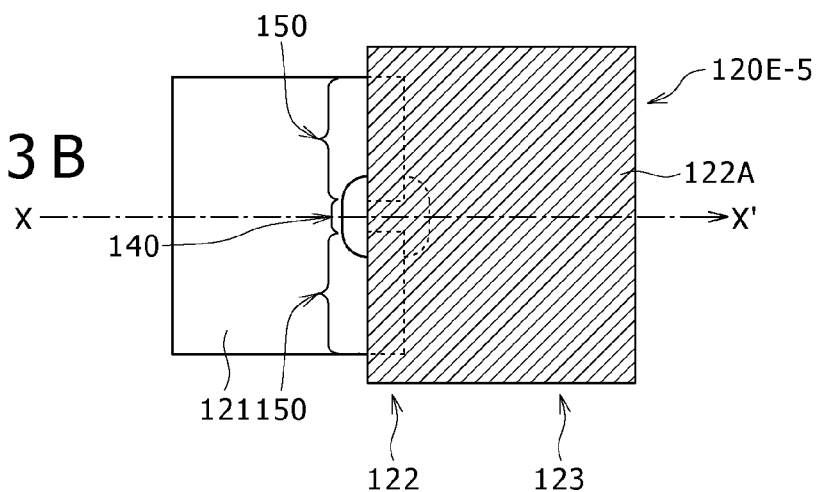
Figure 33C:
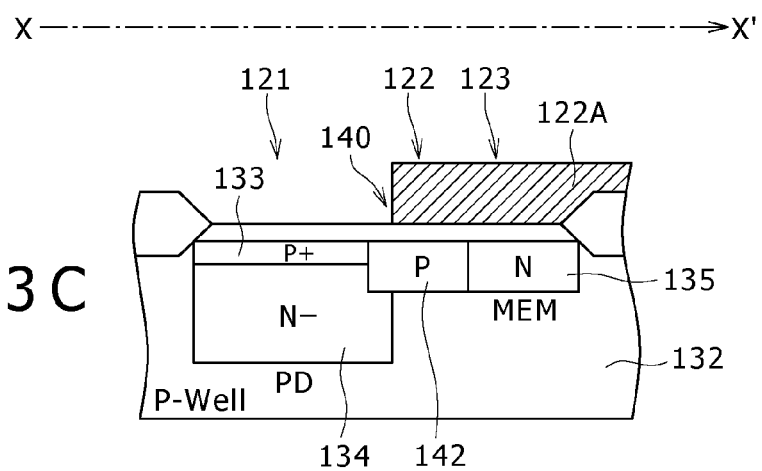

Now, referring to FIGS. 33A to 33C, a unit pixel 120E-4 which is a fourth modification of the unit pixel 120E according to the fifth embodiment and a unit pixel 120E-5 which is a fifth modification of the unit pixel 120E will be described below. FIGS. 33A to 33C show plan views and a sectional view of the unit pixels 120E-4 and 120E-5, like FIGS. 32A to 32C.

As shown in FIGS. 33A to 33C, in the unit pixel 120E-4 and the unit pixel 120E-5, an impurity diffusion region 142 constituting an intermediate transfer path 140 is broadened to the side of a photodiode 121 and is broadened also to the side of a memory part 123. Besides, in regard of the intermediate transfer path 140 and a complete transfer path 150 in each of the unit pixel 120E-4 and the unit pixel 120E-5, the relations in effective channel length, effective channel width, and channel concentration are the same as in the unit pixel 120E of FIGS. 30A to 30C.

In the unit pixel 120E-4 and the unit pixel 120E-5 thus configured, scattering of alignment (registration) in lithography for forming the impurity diffusion region 142 broadened (formed to be projected) to the photodiode 121 side and for forming the photodiode 121 is newly generated but the reduction in the areas of the photodiode 121 and the memory part 123 upon enlarging the effective channel length of the intermediate transfer path 140 can be further suppressed, as compared with the unit pixel 120E and the unit pixel 120E-2 and the like.

In the pixel unit 120E to the unit pixel 120E-5 thus configured, a stable intermediate transfer path 140 can be secured in relation to the maximization of areas and the scattering of production as to the photodiode 121 and the memory part 123. In addition, it is possible to contrive an increase in the number of pixels by reduction in the pixel size, or to contrive an increase in the amount of saturated signal at the same pixel size and enhancement of image quality through enhancement of sensitivity.

In addition, from the viewpoint of device operation, it is preferable in designing to narrow the effective channel width of the intermediate transfer path 140 not required to pass a large current therethrough, and to broaden as much as possible the effective channel width of the complete transfer path 150 through which a large current is desirably passed so as to transfer the signal charge in a short time.

The above-mentioned configuration in which the effective channel width of the intermediate transfer path 140 having a large effective channel length is narrowed whereas the effective channel width of the complete transfer path 150 having a small channel length is broadened is advantageous in maximizing the areas of the photodiode 121 and the memory part 123. Specifically, this configuration makes it possible to enlarge the areas of the photodiode 121 and the memory part 123 within the same pixel size, as compared with a device in which the effective channel length for the whole channel width is simply enlarged.

Thus, according to the present invention, it is possible to improve the trade-off between the instability of characteristics of the intermediate transfer path 140 due to reduction in pixel size and the degradation of pixel characteristics due to reduction in the areas of the photodiode 121 and the memory part 123.

Incidentally, while the above embodiments have been described by taking as an example an image sensor in which the signal charge is an electron, the present invention is applicable also to image sensors of the type in which the signal charge is a hole.

[Other First Configuration Example of Unit Pixel]

Figure 34:
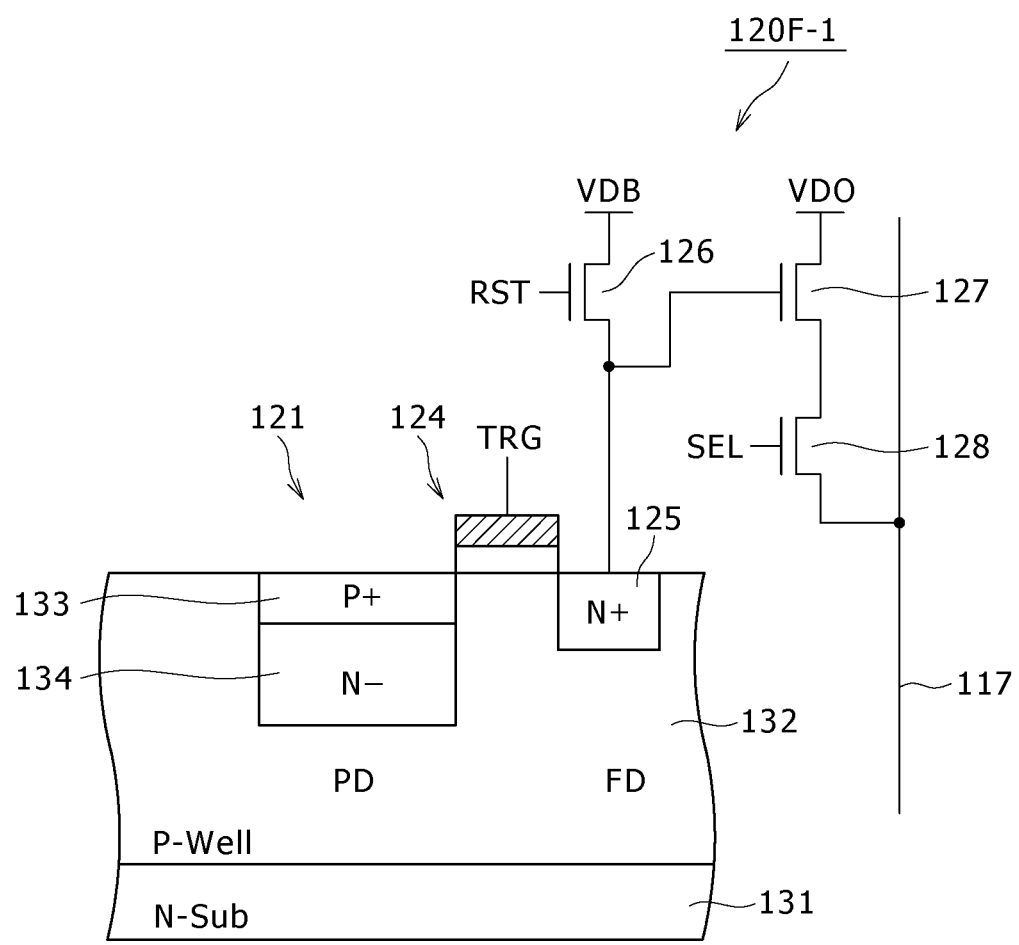
FIG. 34 illustrates the structure of other first configuration example of the unit pixel.

FIG. 34 illustrates the structure of a unit pixel 120F-1 which is other first configuration example of the unit pixel 120.

In the unit pixel 120F-1, the first transfer gate 122 and the memory part 123 in the unit pixel 120A of FIG. 2 are omitted, and a photodiode 121 and a floating diffusion region 125 are disposed to be adjacent to each other, with a P-type well layer 132 therebetween. On the upper side of the P-type well layer 132 between the photodiode 121 and the floating diffusion region 125, there is disposed a second transfer gate 124.

A global exposure operation in the unit pixel 120F-1 will now be described. First, an electric-charge discharging operation by which discharging of accumulated charge from the buried photodiode 121 is conducted simultaneously for all the pixels is carried out, and thereafter exposure to light is started. As a result, light electric charge is accumulated in a PN junction capacitance of the photodiode 121. At the end of the exposure period, turning ON of the second transfer gate 124 is conducted simultaneously for all the pixels, whereby the light electric charge accumulated is entirely transferred into the floating diffusion region 125. The second transfer gate 124 is closed, whereby the light electric charge having been accumulated during the exposure period which is the same for all the pixels is held in the floating diffusion region 125. Thereafter, the light electric charges held in the floating diffusion regions 125 are sequentially read out through vertical signal lines 117 as image signals. Finally, the floating diffusion region 125 is reset, and thereafter the reset level is read out.

Therefore, in the unit pixel 120F-1, the floating diffusion region 125 becomes an electric charge holding region in the case of performing the global exposure operation. In the unit pixel 120F-1, at the second transfer gate 124 in the boundary portion between the photodiode 121 and the floating diffusion region 125, the impurity diffusion region is formed so as to realize a configuration in which the intermediate transfer path and the complete transfer path are separate from each other.

[Other Second Configuration Example of Unit Pixel]

Figure 35:
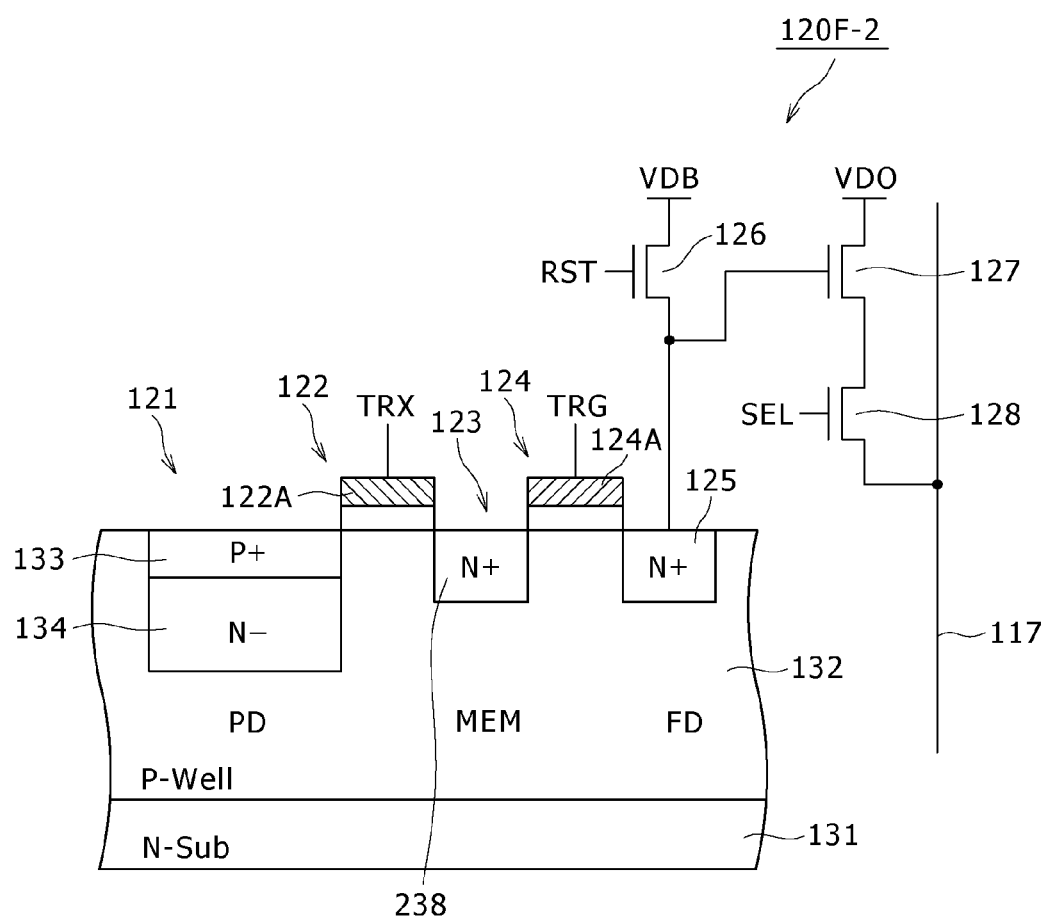
FIG. 35 illustrates the structure of other second configuration example of the unit pixel.

FIG. 35 illustrates the structure of a unit pixel 120F-2 which is other second configuration example of the unit pixel 120.

The unit pixel 120F-2 has a configuration in which a memory part 123 similar to the floating diffusion region 125 is added to the configuration of the unit pixel 120A of FIG. 2. Specifically, in the unit pixel 120F-2, a gate electrode 122A of a first transfer gate 122 is provided at an upper portion of a P-type well layer 132 at the boundary between a photodiode 121 and the memory part 123. Besides, in the unit pixel 120F-2, the memory part 123 has an N-type layer 238 similar to the floating diffusion region 125.

A global exposure operation in the unit pixel 120F-2 is conducted in the following procedure. First, an electric-charge discharging operation is carried out simultaneously for all the pixels, whereby simultaneous exposure to light is started. Light electric charge thus generated is accumulated in the photodiode 121. At the end of the exposure, turning ON of the first transfer gate 122 is performed simultaneously for all the pixels, and the light electric charge accumulated is transferred into the memory part 123, to be held there. After the exposure is finished, a reset level and a signal level are read out by a sequential operation. Specifically, the floating diffusion region 125 is reset, and then the reset level is read out. Subsequently, the electric charge held in the memory part 123 is transferred into the floating diffusion region 125, and the signal level is read out.

In the unit pixel 120F-2, the N-type region 238 of the memory part 123 becomes an electric-charge holding region in the case of performing the global exposure operation. In the unit pixel 120F-2, the impurity diffusion region is formed in the first transfer gate 122 so as to realize a configuration in which the intermediate transfer path and the complete transfer path are separate from each other, whereby the present invention can be applied.

[Other Third Configuration Example of Unit Pixel]

Figure 36:
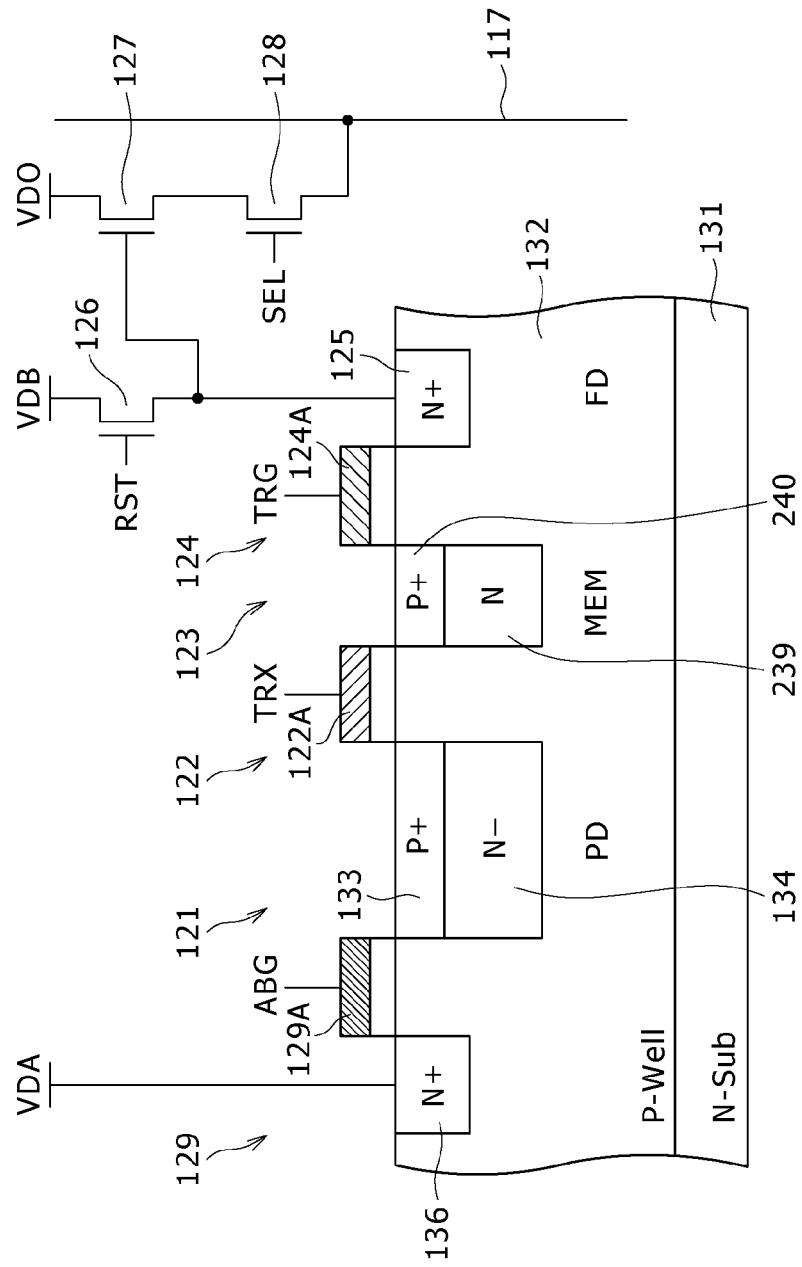
FIG. 36 illustrates the structure of other third configuration example of the unit pixel.

FIG. 36 shows the structure of a unit pixel 120F-3 which is other third configuration example of the unit pixel 120.

In the unit pixel 120F-3 shown in FIG. 36, a configuration is adopted in which a memory part 123 has a buried N-type diffusion region 239 substituting for the buried channel 135.

In the case where the memory part 123 thus has the N-type diffusion region 239, also, the same effect as that in the case where the memory part 123 has the buried channel 135 can be obtained. Specifically, the N-type diffusion region 239 is formed in the inside of a P-type well layer 132, and a P-type layer 240 is formed on the substrate surface side thereof. This configuration makes it possible to obviate the situation in which a dark current generated at the interface would be accumulated in the N-type diffusion region 239 of the memory part 123. This contributes to enhancement of image quality.

Here, the impurity concentration in the N-type diffusion region 239 of the memory part 123 is preferably set to be lower than the impurity concentration in the floating diffusion region 125. By such an impurity concentration setting, it is possible to enhance the transfer efficiency of electrons from the memory part 123 into the floating diffusion region 125 by a second transfer gate 124. A global exposure operation in the unit pixel 120F-3 is the same as that in the unit pixel 120A of FIG. 2.

Incidentally, while the memory part 123 has the buried N-type diffusion region 239 in the configuration of the unit pixel 120F-3 shown in FIG. 36, a structure in which the region is not of the buried type may also be adopted, though the dark current generated in the memory part 123 may be increased.

Besides, in the configuration of the unit pixel 120F-3, also, a configuration may be adopted in which the electric-charge discharging part 129 is omitted, like in the case of the unit pixel 120A of FIG. 2, and the transfer pulses TRX and TRG and the reset pulse RST are all put into an active state. With this configuration adopted, it is possible to obtain an effect equivalent to that of the electric-charge discharging part 129; in other words, the electric charge in the photodiode 121 can be discharged, and it is possible to permit escape, to the substrate side, of the electric charge in overflow at the photodiode 121 during the reading period.

In the unit pixel 120F-3, the N-type diffusion region 239 of the memory part 123 becomes the electric-charge holding region in the case of performing a global exposure operation. In the unit pixel 120F-3, the impurity diffusion region is so formed as to realize the configuration in which the intermediate transfer path and the complete transfer path are separate from each other, whereby the present invention can be applied.

[Other Fourth Configuration Example of Unit Pixel]

Figure 37:
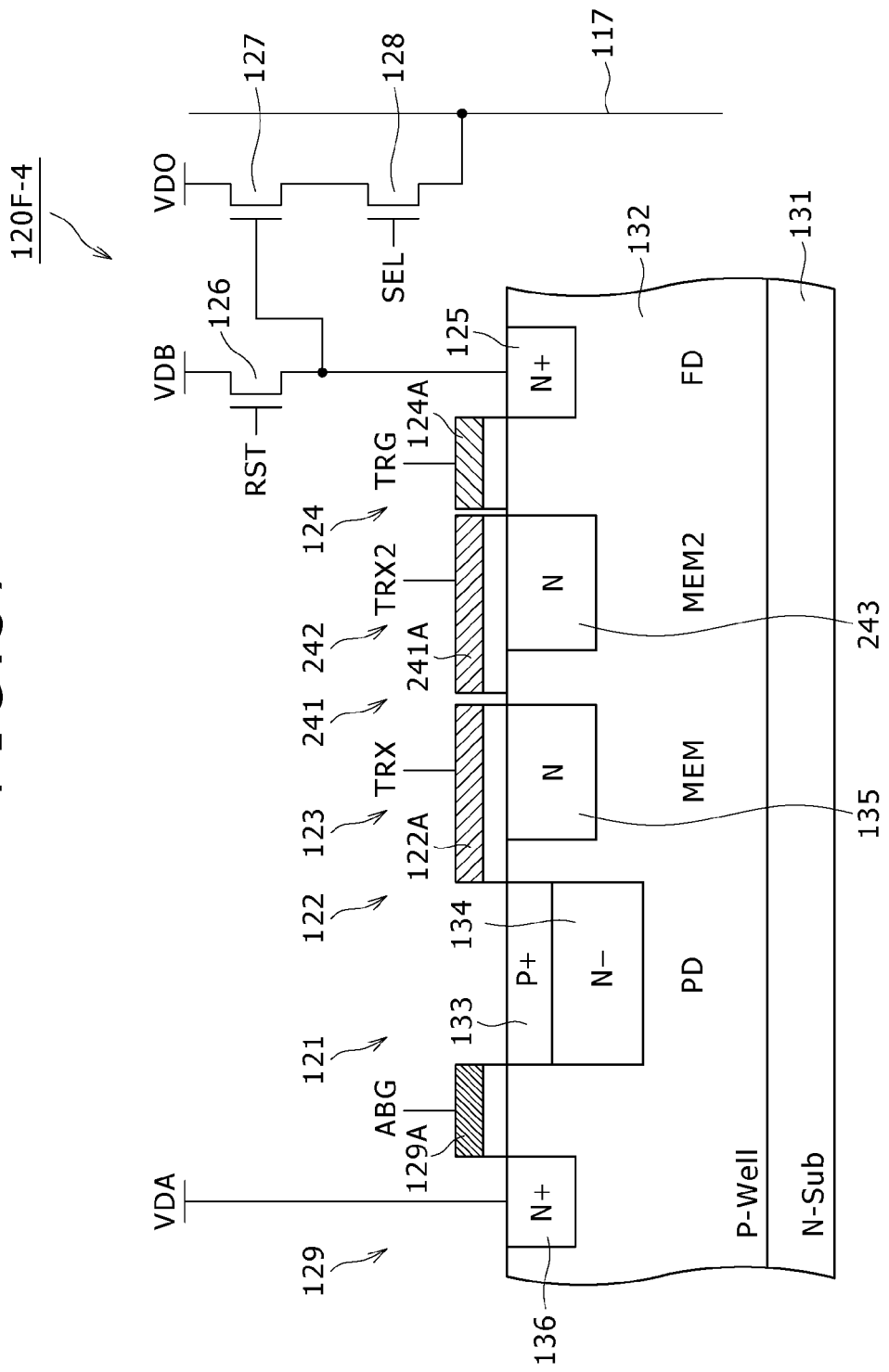
FIG. 37 illustrates the structure of other fourth configuration example of the unit pixel.

FIG. 37 illustrates the structure of a unit pixel 120F-4 which is other fourth configuration example of the unit pixel 120.

In the unit pixel 120A shown in FIG. 2, the single memory part (MEM) 123 has been disposed between the photodiode 121 and the floating diffusion region 125. In the unit pixel 120F-4 of FIG. 37, another memory part (MEM2) 242 is additionally disposed. Thus, the memory part has a two-stage configuration.

A third transfer gate 241 has a function by which the electric charge accumulated in the memory part 123 is transferred when a transfer pulse TRX2 is impressed on a gate electrode 241A. The memory part 242 has an N-type buried channel 243 formed beneath the gate electrode 241A, and accumulates the electric charge transferred from the memory part 123 by the third transfer gate 241. With the memory part 242 thus having the buried channel 243, generation of a dark current at the interface can be restrained, which contributes to enhancement of image quality.

The memory part 242 is the same in configuration with the memory part 123. Therefore, like the memory part 123, the memory part 242 is advantageous in that when modulation is applied, the amount of saturated charge in the memory part 242 can be increased, as compared with the case where modulation is not applied.

In a global exposure operation in the unit pixel 120F-4, light electric charge accumulated simultaneously for all the pixels is held in the photodiode 121 or the memory part 123. The memory part 242 is used for holding the light electric charge until the image signal is read out.

In the unit pixel 120F-4, a buried channel 135 of the memory part 123 and the buried channel 243 of the memory part 242 function as electric-charge holding regions in the case of performing the global exposure operation. In the unit pixel 120F-4, with impurity diffusion regions formed at a first transfer gate 122 so as to realized a configuration in which an intermediate transfer path and a complete transfer path are separate from each other, whereby the present invention can be applied. Further, a configuration may be adopted in which not only the intermediate transfer path and the complete transfer path are separate from each other in the photodiode 121 and the floating diffusion region 125, but also the transfer channels in the memory part 123 and the memory part 242 are similarly separate from each other. Specifically, as has been described above using FIG. 3 and FIGS. 30A to 30C, the intermediate transfer path 140 and the complete transfer path 150 may be separated from each other under the transfer gate 241. Furthermore, as has been described above using FIGS. 15A and 15B, the memory part 123 may be formed to extend to the lower side of the memory part 242, thereby forming an intermediate transfer path on the lower side of the memory part 242.

Thus, the present invention can be adopted also for other structure than the unit pixel 120A. Besides, the present invention can be similarly applied also to unit pixels modified from the unit pixels 120A to 120F-4 by reversing the polarity of conductivity type (N-type, P-type).

[Configuration Example of Electronic Apparatus to which the Present Invention is Applied]

Further, application of the present invention is not limited to application to a solid-state imaging device. The present invention is applicable to electronic apparatuses in general in which a solid-state imaging device is used for an image pickup section (photoelectric conversion section), for example, imaging apparatuses such as digital still cameras, video cameras, etc., personal digital assistants (PDA) having an imaging function, copying machines using a solid-state imaging device for an image readout section, etc. The solid-state imaging device may be formed in a one-chip form, or may be fabricated in a module form having an imaging function in which an imaging section and a signal processing section or an optical system are collectively packaged.

Figure 38:
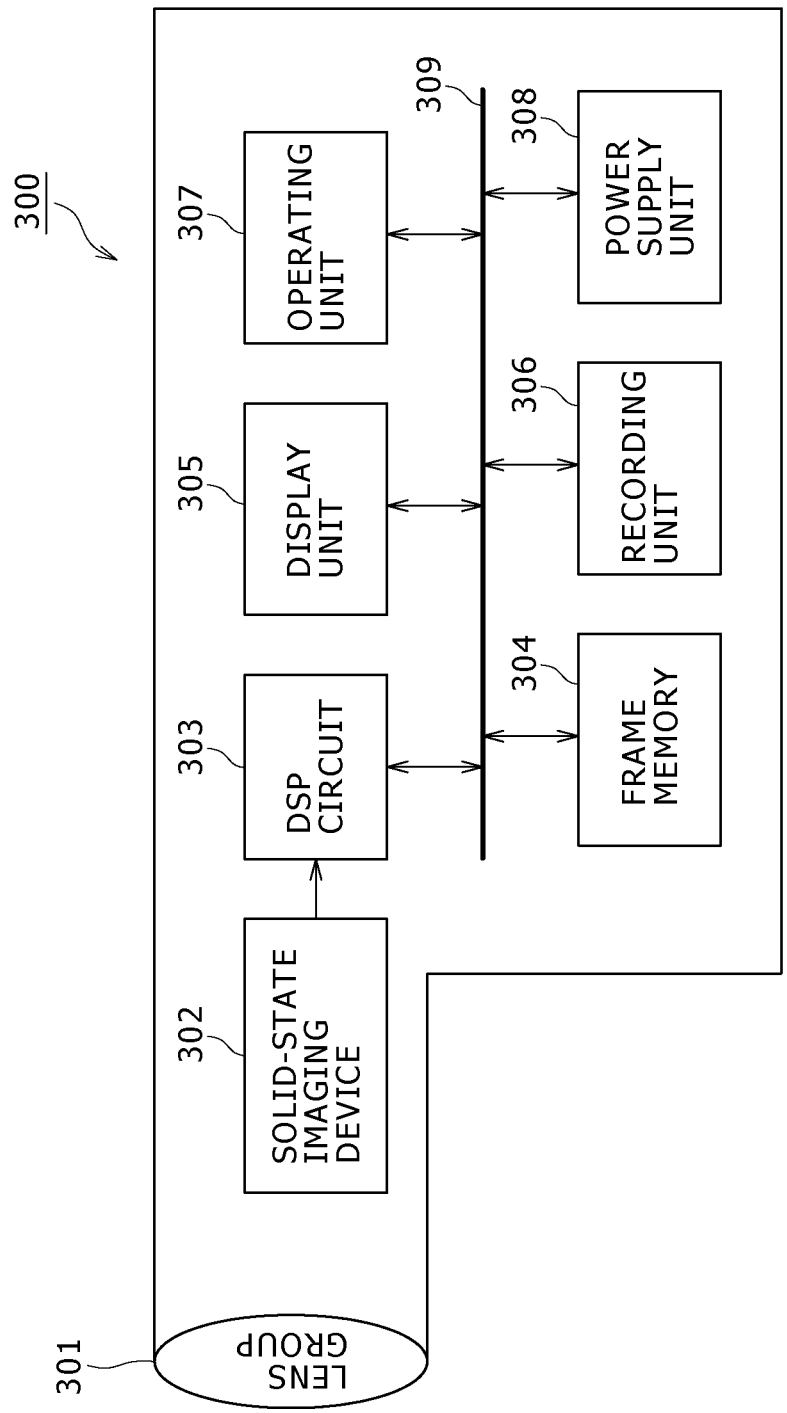
FIG. 38 is a block diagram showing a configuration example of an imaging apparatus as an electronic apparatus to which the present invention is applied.

FIG. 38 is a block diagram showing a configuration example of an imaging apparatus as an electronic apparatus to which the present invention is applied.

The imaging apparatus 300 shown in FIG. 38 includes an optical unit 301 having a lens group or the like, a solid-state imaging device 302 for which each of the configurations of the above-mentioned unit pixels 120 is adopted, and a digital signal processing (DSP) circuit 303 which is a camera signal processing circuit. In addition, the imaging apparatus 300 has a frame memory 304, a display unit 305, a recording unit 306, an operating unit 307, and a power supply unit 308. The DSP circuit 303, the frame memory 304, the display unit 305, the recording unit 306, the operating unit 307, and the power supply unit 308 are connected to one another through a bus line 309.

The optical unit 301 picks up incident light (image light) coming from a subject, and forms an image on an imaging plane of the solid-state imaging device 302. The solid-state imaging device 302 converts the amounts of incident light formed into the image on the imaging plane into an electrical signal on a pixel basis, and outputs the electrical signal as an image signal. As the solid-state imaging device 302, there can be used a solid-state imaging device such as a CMOS image sensor 100, specifically, a solid-state imaging device which can realize distortion-free imaging through global exposure and which can restrict the leak signal suppression ratio on the basis of each of RGB pixels.

The display unit 305 has a panel-type display such as, for example, a liquid crystal panel or an organic electroluminescence (EL) panel, and displays a motion picture or still image picked up by the solid-state imaging device 302. The recording unit 306 records the motion picture or still image, shot by the solid-state imaging device 302, on a recording medium such as a video tape, a digital versatile disk (DVD), etc.

The operating unit 307, under user's operations, issues operation commands relating to the various functions possessed by the imaging apparatus 300. The power supply unit 308 supplies, as required, a variety of electric power to the DSP circuit 303, the frame memory 304, the display unit 305, the recording unit 306, and the operating unit 307, as power for operations of these component units.

As above-mentioned, where a CMOS image sensor 100 according to any of the above-described embodiments is used as the solid-state imaging device 302, it is possible to realize distortion-free imaging through global exposure, and to restrict the leak signal suppression ratio on the basis of each of RGB pixels. Therefore, enhancement of image quality of picked-up images can be contrived, also in such imaging apparatuses 300 as video cameras, digital still cameras, and camera modules for use in mobile apparatuses such as cell phones.

The above embodiments have been described by taking as an example the case where the present invention is applied to a CMOS image sensor in which unit pixels for detecting signal charges according to the amounts of visible light as physical quantity are arranged in a matrix pattern. However, the application of the present invention is not limited to the application to the CMOS image sensor. The present invention is applicable to solid-state imaging devices in general of the column type in which column processing sections are arranged on the basis of each of pixel columns in a pixel array section.

In addition, the application of the present invention is not restricted to the application to a solid-state imaging device for imaging through detection of distribution of the amount of incident visible light. The invention is also applicable to solid-state imaging devices for imaging through detection of distribution of the incident amounts of infrared (IR) rays, X-rays, particles or the like. Further, the invention is applicable to solid-state imaging devices (physical quantity distribution detectors) in general or in wide meaning which perform imaging through detection of distribution of other physical quantity such as pressure, capacitance, etc., for example, fingerprint sensor.

Incidentally, the solid-state imaging device may be fabricated in a one-chip form, or may be fabricated in a module form having an imaging function in which an imaging section and a signal processing section or an optical system are collectively packaged.

The present application contains subject matter related to that disclosed in Japanese Priority Patent Application JP 2010-083597 filed in the Japan Patent Office on Mar. 26, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a photoelectric conversion element in a substrate and configured to generate electric charge according to an amount of incident light and to accumulate the electric charge in the inside thereof;
an electric-charge holding region in which the electric charge generated through photoelectric conversion by the photoelectric conversion element is held until read out therefrom; and
a transfer gate having a complete transfer path through which the electric charge accumulated in the photoelectric conversion element is completely transferred into the electric-charge holding region, and an intermediate transfer path through which the electric charge generated by the photoelectric conversion element during an exposure period and being in excess of a predetermined charge amount is transferred into the electric-charge holding region,
wherein,
the complete transfer path and the intermediate transfer path are in different regions,
the transfer gate has a transfer electrode over a surface of the substrate,
the electric-charge holding region is in the substrate under the transfer electrode, the surface of the substrate being between the transfer electrode and the electric-charge holding region,
the intermediate transfer path comprises a first impurity diffusion region of a first conductivity type in the substrate between the photoelectric conversion element and the electric-charge holding region, the first impurity diffusion region being configured such that a path is formed in the first impurity diffusion region for a transfer of the electric charge generated by the photoelectric conversion element during the exposure period and being in excess of the predetermined charge amount from the photoelectric conversion element and into the electric-charge holding region,
a second impurity diffusion region of a second conductivity type different from the first impurity type is provided between the first impurity diffusion region and the surface of the substrate, the second impurity diffusion region also being in the substrate and between the photoelectric conversion element and the electric-charge holding region that is in the substrate under the transfer electrode, and
the second impurity diffusion region is a region separate from the path formed in the first impurity diffusion region.

2. The solid-state imaging device according to claim 1, wherein the electric-charge holding region is formed to have such an impurity concentration that the electric-charge holding region is in a depletion state upon discharging of the electric charge held in the region.

3. An electronic apparatus comprising a solid-state imaging device having plural unit pixels arranged in a matrix pattern, each unit pixel including:
a photoelectric conversion element in a substrate and configured to generate electric charge according to an amount of incident light and to accumulate the electric charge in the inside thereof;
an electric-charge holding region in which the electric charge generated through photoelectric conversion by the photoelectric conversion element is held until read out therefrom; and
a transfer gate having a complete transfer path through which the electric charge accumulated in the photoelectric conversion element is completely transferred into the electric-charge holding region, and an intermediate transfer path through which the electric charge generated by the photoelectric conversion element during an exposure period and being in excess of a predetermined charge amount is transferred into the electric-charge holding region,
wherein,
the complete transfer path and the intermediate transfer path are in different regions,
the transfer gate has a transfer electrode over a surface of the substrate,
the electric-charge holding region is in the substrate under the transfer electrode, the surface of the substrate being between the transfer electrode and the electric-charge holding region,
the intermediate transfer path comprises a first impurity diffusion region of a first conductivity type in the substrate between the photoelectric conversion element and the electric-charge holding region, the first impurity diffusion region being configured such that a path is formed in the first impurity diffusion region for a transfer of the electric charge generated by the photoelectric conversion element during the exposure period and being in excess of the predetermined charge amount from the photoelectric conversion element and into the electric-charge holding region,
a second impurity diffusion region of a second conductivity type different from the first impurity type is provided between the first impurity diffusion region and the surface of the substrate, the second impurity diffusion region also being in the substrate and between the photoelectric conversion element and the electric-charge holding region that is in the substrate under the transfer electrode,
the second impurity diffusion region is a region separate from the path formed in the first impurity diffusion region,
the unit pixels in a plurality of rows perform electric-discharge accumulation simultaneously, and
the electric charges transferred by the transfer gate are read out sequentially.

* * * * *